United States Patent
Watanabe et al.

(10) Patent No.: US 10,922,054 B2
(45) Date of Patent: Feb. 16, 2021

(54) APPARATUS AND METHOD

(71) Applicant: TOSHIBA MEMORY CORPORATION, Minato-ku (JP)

(72) Inventors: Ryo Watanabe, Kawasaki (JP); Kazuhito Okita, Ota (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 212 days.

(21) Appl. No.: 16/281,260

(22) Filed: Feb. 21, 2019

(65) Prior Publication Data
US 2020/0019378 A1    Jan. 16, 2020

(30) Foreign Application Priority Data
Jul. 13, 2018   (JP) .................. 2018-133290

(51) Int. Cl.
*G06F 7/58*  (2006.01)
*H03K 19/21* (2006.01)

(52) U.S. Cl.
CPC ............. *G06F 7/584* (2013.01); *H03K 19/21* (2013.01); *G06F 2207/581* (2013.01); *G06F 2207/583* (2013.01)

(58) Field of Classification Search
CPC ............... G06F 7/584; G06F 2207/583; G06F 2207/581; H03K 19/21

USPC ........................................................ 708/252
See application file for complete search history.

(56) References Cited

U.S. PATENT DOCUMENTS

| 7,412,057 | B2 * | 8/2008 | Dagan ................... G06F 7/582 348/E7.056 |
| 8,499,205 | B2 | 7/2013 | Ikeda |
| 9,497,020 | B1 | 11/2016 | Ganfield |
| 2011/0142232 | A1 | 6/2011 | Jeong et al. |
| 2015/0106560 | A1 * | 4/2015 | Perego ................ G06F 12/0246 711/105 |
| 2019/0235951 | A1 * | 8/2019 | Utsumi ............... G06F 11/1048 |
| 2019/0373584 | A1 * | 12/2019 | Guzelgoz ............. H04L 1/0045 |

* cited by examiner

*Primary Examiner* — Tan V Mai
(74) *Attorney, Agent, or Firm* — Oblon, McClelland, Maier & Neustadt, L.L.P.

(57) ABSTRACT

According to one embodiment, an apparatus is capable of exchanging a frame with an external apparatus in a packet mode of a serial attached small computer system interface (SAS). The external apparatus includes a scrambler. The apparatus includes a descrambler and a controller. The descrambler is configured to descramble frame data scrambled by the scrambler. The controller is configured to, in a case where first frame data is received from the external apparatus, synchronize the descrambler with the scrambler using the first frame data and a first value that is to be scrambled by the scrambler to obtain the first frame data.

20 Claims, 30 Drawing Sheets

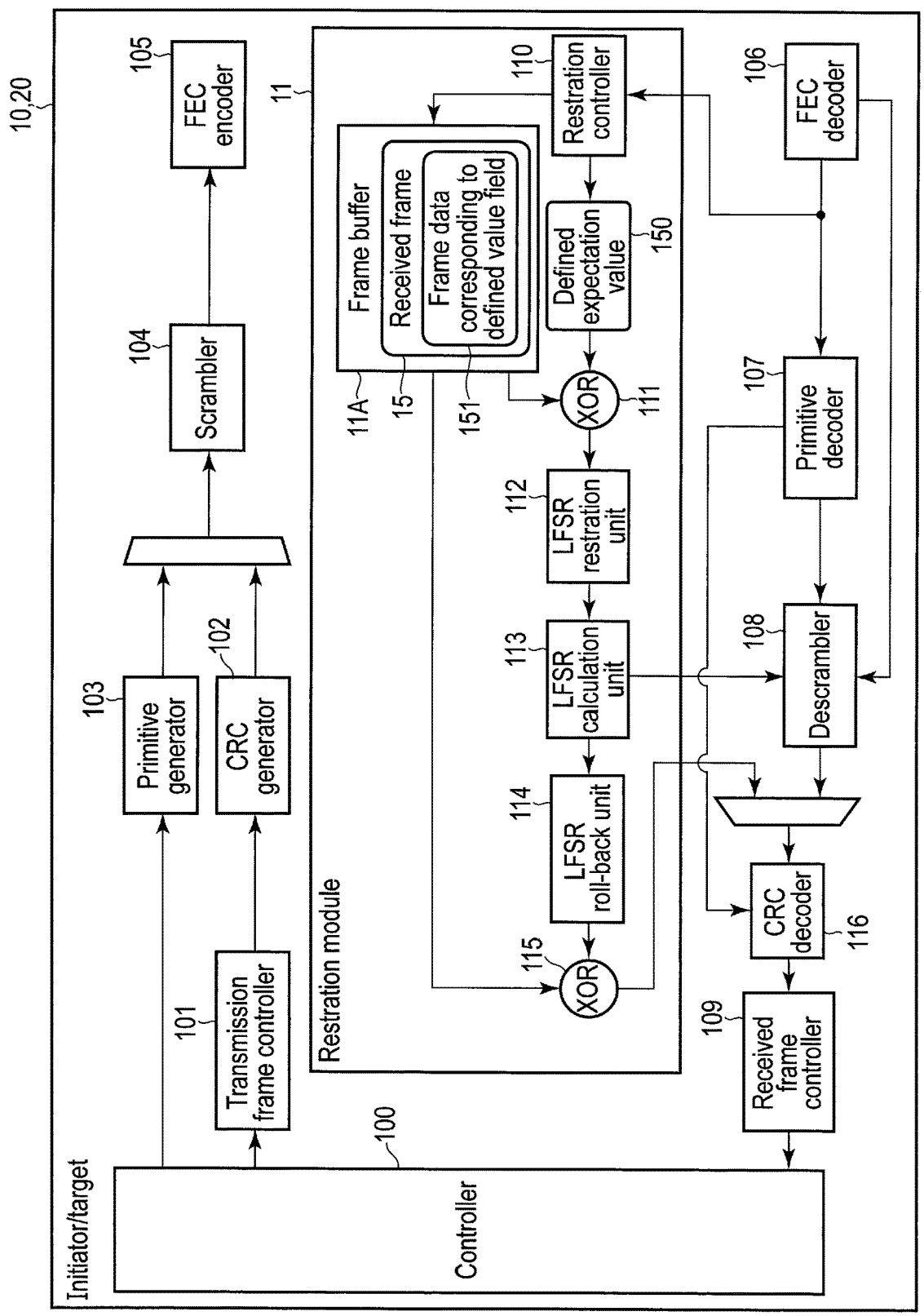
F I G. 6

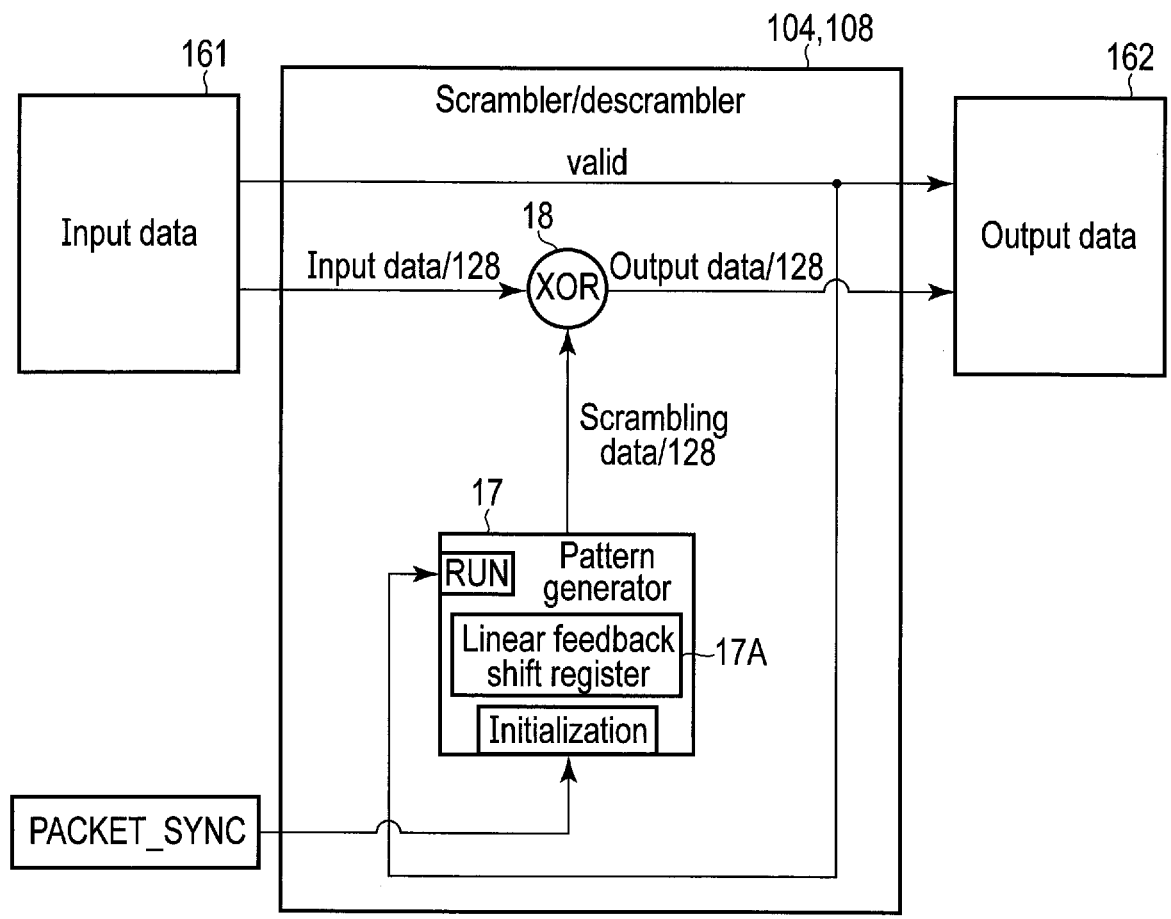
F I G. 7

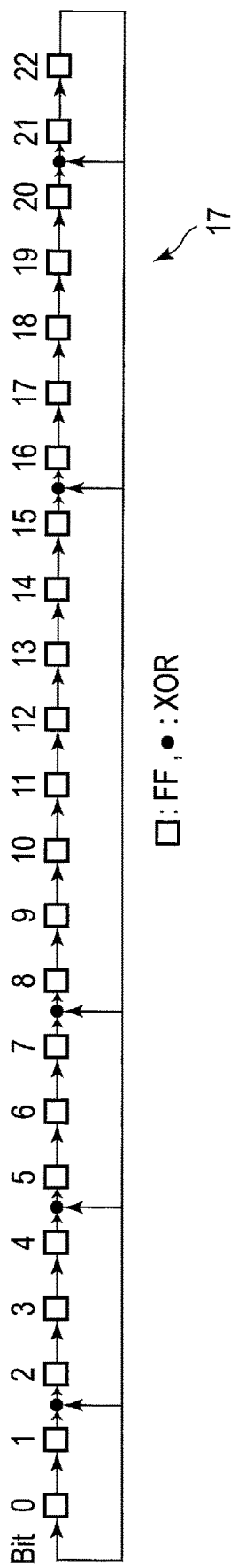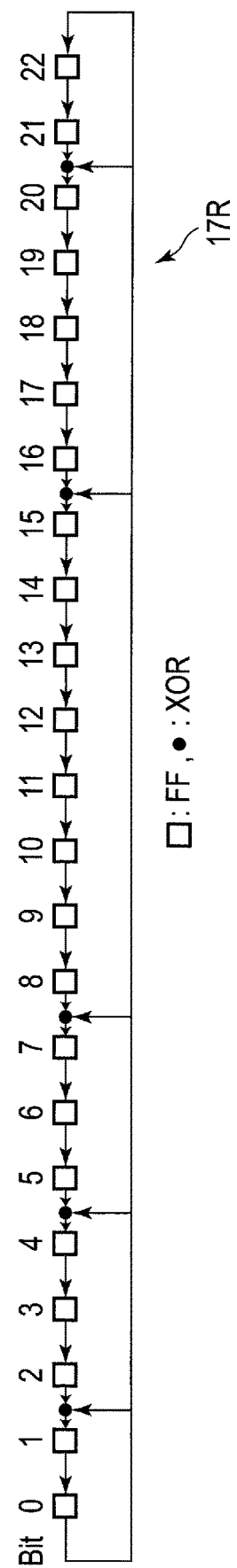
□:FF, ●:XOR
FIG. 8A
□:FF, ●:XOR
FIG. 8B

| Byte\Bit | 7 | 6 | 5 | 4 | 3 | 2 | 1 | 0 |
|---|---|---|---|---|---|---|---|---|
| 0 | Reserved | SAS DEVICE TYPE | | | ADDRESS FRAME TYPE (0h) | | | |
| 1 | Reserved | | | | REASON | | | |
| 2 | Reserved | | | | SSP INITIATOR PORT | STP INITIATOR PORT | SMP INITIATOR PORT | Restricted (for OPEN address frame) |
| 3 | Reserved | | | | SSP TARGET PORT | STP TARGET PORT | SMP TARGET PORT | Restricted (for OPEN address frame) |
| 4 ... 11 | DEVICE NAME | | | | | | | |
| 12 ... 19 | SAS ADDRESS | | | | | | | |
| 20 | PHY IDENTIFIER | | | | | | | |
| 21 | PERSISTENT CAPABLE | POWER CAPABLE | SLUMBER CAPABLE | PERTIAL CAPABLE | INSIDE ZPSDS PERSISTENT | REQUESTED INSIDE ZPSDS | BREAK_REPLY CAPABLE | |
| 22 | Reserved | | | | | APTA CAPABLE | SMP PRIORITY CAPABLE | PWR_DIS CAPABLE |
| 23 ... 27 | Reserved | | | | | | | |
| 28 ... 31 | CRC | | | | | | | |

FIG. 9

```
function [22:00] rstr_curr_lfsr ( input [22:00] in );
  rstr_curr_lfsr[22] = in[00];
  rstr_curr_lfsr[21] = in[01];
  rstr_curr_lfsr[20] = in[00]^ in[02];
  rstr_curr_lfsr[19] = in[01]^ in[03];
  rstr_curr_lfsr[18] = in[02]^ in[04];
  rstr_curr_lfsr[17] = in[03]^ in[05];
  rstr_curr_lfsr[16] = in[04]^ in[06];
  rstr_curr_lfsr[15] = in[00]^ in[05]^ in[07];
  rstr_curr_lfsr[14] = in[01]^ in[06]^ in[08];
  rstr_curr_lfsr[13] = in[02]^ in[07]^ in[09];
  rstr_curr_lfsr[12] = in[03]^ in[08]^ in[10];
  rstr_curr_lfsr[11] = in[04]^ in[09]^ in[11];
  rstr_curr_lfsr[10] = in[05]^ in[10]^ in[12];
  rstr_curr_lfsr[09] = in[06]^ in[11]^ in[13];
  rstr_curr_lfsr[08] = in[07]^ in[12]^ in[14];
  rstr_curr_lfsr[07] = in[00]^ in[08]^ in[13]^ in[15];
  rstr_curr_lfsr[06] = in[01]^ in[09]^ in[14]^ in[16];
  rstr_curr_lfsr[05] = in[02]^ in[10]^ in[15]^ in[17];
  rstr_curr_lfsr[04] = in[00]^ in[03]^ in[11]^ in[16]^ in[18];
  rstr_curr_lfsr[03] = in[01]^ in[04]^ in[12]^ in[17]^ in[19];
  rstr_curr_lfsr[02] = in[02]^ in[05]^ in[13]^ in[18]^ in[20];
  rstr_curr_lfsr[01] = in[03]^ in[06]^ in[14]^ in[19]^ in[21];
  rstr_curr_lfsr[00] = in[04]^ in[07]^ in[15]^ in[20]^ in[22];
endfunction
```

FIG. 11

```
function [22:00] calc_next_lfsr ( input [22:00] in );
  calc_next_lfsr[00] = in[00] ^ in[03] ^ in[07] ^ in[09] ^ in[10] ^ in[11] ^ in[12] ^ in[13] ^ in[14] ^ in[15] ^ in[16] ^ in[18] ^ in[20] ^ in[21];
  calc_next_lfsr[01] = in[01] ^ in[04] ^ in[08] ^ in[10] ^ in[11] ^ in[12] ^ in[13] ^ in[14] ^ in[15] ^ in[16] ^ in[17] ^ in[19] ^ in[21] ^ in[22];
  calc_next_lfsr[02] = in[00] ^ in[02] ^ in[03] ^ in[05] ^ in[07] ^ in[10] ^ in[17] ^ in[21];
  calc_next_lfsr[03] = in[00] ^ in[01] ^ in[04] ^ in[06] ^ in[08] ^ in[11] ^ in[18] ^ in[22];
  calc_next_lfsr[04] = in[00] ^ in[01] ^ in[02] ^ in[05] ^ in[07] ^ in[09] ^ in[12] ^ in[19];
  calc_next_lfsr[05] = in[01] ^ in[02] ^ in[03] ^ in[06] ^ in[08] ^ in[10] ^ in[13] ^ in[20];
  calc_next_lfsr[06] = in[02] ^ in[03] ^ in[04] ^ in[07] ^ in[09] ^ in[11] ^ in[14] ^ in[21];
  calc_next_lfsr[07] = in[00] ^ in[03] ^ in[04] ^ in[05] ^ in[08] ^ in[10] ^ in[12] ^ in[15] ^ in[22];
  calc_next_lfsr[08] = in[01] ^ in[04] ^ in[05] ^ in[06] ^ in[09] ^ in[11] ^ in[13] ^ in[16];
  calc_next_lfsr[09] = in[00] ^ in[02] ^ in[05] ^ in[06] ^ in[07] ^ in[10] ^ in[12] ^ in[14] ^ in[17];
  calc_next_lfsr[10] = in[01] ^ in[03] ^ in[06] ^ in[07] ^ in[08] ^ in[11] ^ in[13] ^ in[15] ^ in[18];
  calc_next_lfsr[11] = in[02] ^ in[04] ^ in[07] ^ in[08] ^ in[09] ^ in[12] ^ in[14] ^ in[16] ^ in[19];
  calc_next_lfsr[12] = in[03] ^ in[05] ^ in[08] ^ in[09] ^ in[10] ^ in[13] ^ in[15] ^ in[17] ^ in[20];
  calc_next_lfsr[13] = in[04] ^ in[06] ^ in[09] ^ in[10] ^ in[11] ^ in[14] ^ in[16] ^ in[18] ^ in[21];
  calc_next_lfsr[14] = in[05] ^ in[07] ^ in[10] ^ in[11] ^ in[12] ^ in[15] ^ in[17] ^ in[19] ^ in[22];
  calc_next_lfsr[15] = in[06] ^ in[08] ^ in[11] ^ in[12] ^ in[13] ^ in[16] ^ in[18] ^ in[20];
  calc_next_lfsr[16] = in[00] ^ in[07] ^ in[09] ^ in[12] ^ in[13] ^ in[14] ^ in[17] ^ in[19] ^ in[21];
  calc_next_lfsr[17] = in[01] ^ in[08] ^ in[10] ^ in[13] ^ in[14] ^ in[15] ^ in[18] ^ in[20] ^ in[22];
  calc_next_lfsr[18] = in[02] ^ in[09] ^ in[11] ^ in[14] ^ in[15] ^ in[16] ^ in[19] ^ in[21];
  calc_next_lfsr[19] = in[03] ^ in[10] ^ in[12] ^ in[15] ^ in[16] ^ in[17] ^ in[20] ^ in[22];
  calc_next_lfsr[20] = in[04] ^ in[11] ^ in[13] ^ in[16] ^ in[17] ^ in[18] ^ in[21];
  calc_next_lfsr[21] = in[05] ^ in[12] ^ in[14] ^ in[17] ^ in[18] ^ in[19] ^ in[20] ^ in[21] ^ in[22];
  calc_next_lfsr[22] = in[06] ^ in[09] ^ in[10] ^ in[11] ^ in[12] ^ in[13] ^ in[14] ^ in[15] ^ in[16] ^ in[18] ^ in[19] ^ in[20] ^ in[21] ^ in[22];
endfunction
```

FIG. 12

```
function [255:00] roll_back_lfsr ( input [22:00] in );
  roll_back_lfsr[000] = in[00];
  roll_back_lfsr[001] = in[01];
  roll_back_lfsr[002] = in[00]^in[02];
  roll_back_lfsr[003] = in[01]^in[03];
  roll_back_lfsr[004] = in[00]^in[02]^in[04];
  roll_back_lfsr[005] = in[00]^in[01]^in[03]^in[05];
  roll_back_lfsr[006] = in[00]^in[01]^in[02]^in[04]^in[06];
  roll_back_lfsr[007] = in[01]^in[02]^in[03]^in[05]^in[07];
  roll_back_lfsr[008] = in[02]^in[03]^in[04]^in[06]^in[08];
  roll_back_lfsr[009] = in[00]^in[03]^in[04]^in[05]^in[07]^in[09];
  roll_back_lfsr[010] = in[01]^in[04]^in[05]^in[06]^in[08]^in[10];
  roll_back_lfsr[011] = in[02]^in[05]^in[06]^in[07]^in[09]^in[11];
  roll_back_lfsr[012] = in[00]^in[03]^in[06]^in[07]^in[08]^in[10]^in[12];
  roll_back_lfsr[013] = in[00]^in[01]^in[04]^in[07]^in[08]^in[09]^in[11]^in[13];
  roll_back_lfsr[014] = in[00]^in[01]^in[02]^in[05]^in[08]^in[09]^in[10]^in[12]^in[14];
  roll_back_lfsr[015] = in[00]^in[01]^in[02]^in[03]^in[06]^in[09]^in[10]^in[11]^in[13]^in[15];
  roll_back_lfsr[016] = in[01]^in[02]^in[03]^in[04]^in[07]^in[10]^in[11]^in[12]^in[14]^in[16];
  roll_back_lfsr[017] = in[00]^in[02]^in[03]^in[04]^in[05]^in[08]^in[11]^in[12]^in[13]^in[15]^in[17];
  roll_back_lfsr[018] = in[01]^in[03]^in[04]^in[05]^in[06]^in[09]^in[12]^in[13]^in[14]^in[16]^in[18];
  roll_back_lfsr[019] = in[02]^in[04]^in[05]^in[06]^in[07]^in[10]^in[13]^in[14]^in[15]^in[17]^in[19];
  roll_back_lfsr[020] = in[00]^in[03]^in[05]^in[06]^in[07]^in[08]^in[11]^in[14]^in[15]^in[16]^in[18]^in[20];
  roll_back_lfsr[021] = in[00]^in[01]^in[04]^in[06]^in[07]^in[08]^in[09]^in[12]^in[15]^in[16]^in[17]^in[19]^in[21];
  roll_back_lfsr[022] = in[01]^in[02]^in[05]^in[07]^in[08]^in[09]^in[10]^in[13]^in[16]^in[17]^in[18]^in[20]^in[22];
  roll_back_lfsr[023] = in[02]^in[03]^in[06]^in[08]^in[09]^in[10]^in[11]^in[14]^in[17]^in[18]^in[19]^in[21];
  roll_back_lfsr[024] = in[03]^in[04]^in[07]^in[09]^in[10]^in[11]^in[12]^in[15]^in[18]^in[19]^in[20]^in[22];
  roll_back_lfsr[025] = in[00]^in[04]^in[05]^in[08]^in[10]^in[11]^in[12]^in[13]^in[16]^in[19]^in[20]^in[21];
  roll_back_lfsr[026] = in[01]^in[05]^in[06]^in[09]^in[11]^in[12]^in[13]^in[14]^in[17]^in[20]^in[21]^in[22];
  roll_back_lfsr[027] = in[00]^in[02]^in[06]^in[07]^in[10]^in[12]^in[13]^in[14]^in[15]^in[18]^in[21]^in[22];
  roll_back_lfsr[028] = in[00]^in[01]^in[03]^in[07]^in[08]^in[11]^in[13]^in[14]^in[15]^in[16]^in[19]^in[22];
  roll_back_lfsr[029] = in[01]^in[02]^in[04]^in[08]^in[09]^in[12]^in[14]^in[15]^in[16]^in[17]^in[20];
  roll_back_lfsr[030] = in[02]^in[03]^in[05]^in[09]^in[10]^in[13]^in[15]^in[16]^in[17]^in[18]^in[21];
  roll_back_lfsr[031] = in[00]^in[03]^in[04]^in[06]^in[10]^in[11]^in[14]^in[16]^in[17]^in[18]^in[19]^in[22];
  roll_back_lfsr[032] = in[01]^in[04]^in[05]^in[07]^in[11]^in[12]^in[15]^in[17]^in[18]^in[19]^in[20];
  roll_back_lfsr[033] = in[00]^in[02]^in[05]^in[06]^in[08]^in[12]^in[13]^in[16]^in[18]^in[19]^in[20]^in[21];
  roll_back_lfsr[034] = in[00]^in[01]^in[03]^in[06]^in[07]^in[09]^in[13]^in[14]^in[17]^in[19]^in[20]^in[21]^in[22];
  roll_back_lfsr[035] = in[01]^in[02]^in[04]^in[07]^in[08]^in[10]^in[14]^in[15]^in[18]^in[20]^in[21]^in[22];
  roll_back_lfsr[036] = in[02]^in[03]^in[05]^in[08]^in[09]^in[11]^in[15]^in[16]^in[19]^in[21]^in[22];
  roll_back_lfsr[037] = in[03]^in[04]^in[06]^in[09]^in[10]^in[12]^in[16]^in[17]^in[20]^in[22];
  roll_back_lfsr[038] = in[00]^in[04]^in[05]^in[07]^in[10]^in[11]^in[13]^in[17]^in[18]^in[21];
  roll_back_lfsr[039] = in[01]^in[05]^in[06]^in[08]^in[11]^in[12]^in[14]^in[18]^in[19]^in[22];
  roll_back_lfsr[040] = in[02]^in[06]^in[07]^in[09]^in[12]^in[13]^in[15]^in[19]^in[20];
  roll_back_lfsr[041] = in[00]^in[03]^in[07]^in[08]^in[10]^in[13]^in[14]^in[16]^in[20]^in[21];
  roll_back_lfsr[042] = in[01]^in[04]^in[08]^in[09]^in[11]^in[14]^in[15]^in[17]^in[21]^in[22];
  roll_back_lfsr[043] = in[02]^in[05]^in[09]^in[10]^in[12]^in[15]^in[16]^in[18]^in[22];
```

FIG. 13

```
roll_back_lfsr[044] = in[03]^in[06]^in[10]^in[11]^in[13]^in[16]^in[17]^in[19];
roll_back_lfsr[045] = in[04]^in[07]^in[11]^in[12]^in[14]^in[17]^in[18]^in[20];
roll_back_lfsr[046] = in[00]^in[05]^in[08]^in[12]^in[13]^in[15]^in[18]^in[19]^in[21];
roll_back_lfsr[047] = in[00]^in[01]^in[06]^in[09]^in[13]^in[14]^in[16]^in[19]^in[20]^in[22];
roll_back_lfsr[048] = in[00]^in[01]^in[02]^in[07]^in[10]^in[14]^in[15]^in[17]^in[20]^in[21];
roll_back_lfsr[049] = in[01]^in[02]^in[03]^in[08]^in[11]^in[15]^in[16]^in[18]^in[21]^in[22];
roll_back_lfsr[050] = in[00]^in[02]^in[03]^in[04]^in[09]^in[12]^in[16]^in[17]^in[19]^in[22];
roll_back_lfsr[051] = in[01]^in[03]^in[04]^in[05]^in[10]^in[13]^in[17]^in[18]^in[20];
roll_back_lfsr[052] = in[00]^in[02]^in[04]^in[05]^in[06]^in[11]^in[14]^in[18]^in[19]^in[21];
roll_back_lfsr[053] = in[00]^in[01]^in[03]^in[05]^in[06]^in[07]^in[12]^in[15]^in[19]^in[20]^in[22];
roll_back_lfsr[054] = in[00]^in[01]^in[02]^in[04]^in[06]^in[07]^in[08]^in[13]^in[16]^in[20]^in[21];
roll_back_lfsr[055] = in[01]^in[02]^in[03]^in[05]^in[07]^in[08]^in[09]^in[14]^in[17]^in[21]^in[22];
roll_back_lfsr[056] = in[00]^in[02]^in[03]^in[04]^in[06]^in[08]^in[09]^in[10]^in[15]^in[18]^in[22];
roll_back_lfsr[057] = in[00]^in[01]^in[03]^in[04]^in[05]^in[07]^in[09]^in[10]^in[11]^in[16]^in[19];
roll_back_lfsr[058] = in[00]^in[01]^in[02]^in[04]^in[05]^in[06]^in[08]^in[10]^in[11]^in[12]^in[17]^in[20];
roll_back_lfsr[059] = in[00]^in[01]^in[02]^in[03]^in[05]^in[06]^in[07]^in[09]^in[11]^in[12]^in[13]^in[18]^in[21];
roll_back_lfsr[060] = in[01]^in[02]^in[03]^in[04]^in[06]^in[07]^in[08]^in[10]^in[12]^in[13]^in[14]^in[19]^in[22];
roll_back_lfsr[061] = in[02]^in[03]^in[04]^in[05]^in[07]^in[08]^in[09]^in[11]^in[13]^in[14]^in[15]^in[20];
roll_back_lfsr[062] = in[03]^in[04]^in[05]^in[06]^in[08]^in[09]^in[10]^in[12]^in[14]^in[15]^in[16]^in[21];
roll_back_lfsr[063] = in[04]^in[05]^in[06]^in[07]^in[09]^in[10]^in[11]^in[13]^in[15]^in[16]^in[17]^in[22];
roll_back_lfsr[064] = in[05]^in[06]^in[07]^in[08]^in[10]^in[11]^in[12]^in[14]^in[16]^in[17]^in[18];
roll_back_lfsr[065] = in[00]^in[06]^in[07]^in[08]^in[09]^in[11]^in[12]^in[13]^in[15]^in[17]^in[18]^in[19];
roll_back_lfsr[066] = in[01]^in[07]^in[08]^in[09]^in[10]^in[12]^in[13]^in[14]^in[16]^in[18]^in[19]^in[20];
roll_back_lfsr[067] = in[00]^in[02]^in[08]^in[09]^in[10]^in[11]^in[13]^in[14]^in[15]^in[17]^in[19]^in[20]^in[21];
roll_back_lfsr[068] = in[01]^in[03]^in[09]^in[10]^in[11]^in[12]^in[14]^in[15]^in[16]^in[18]^in[20]^in[21]^in[22];
roll_back_lfsr[069] = in[02]^in[04]^in[10]^in[11]^in[12]^in[13]^in[15]^in[16]^in[17]^in[19]^in[21]^in[22];
roll_back_lfsr[070] = in[00]^in[03]^in[05]^in[11]^in[12]^in[13]^in[14]^in[16]^in[17]^in[18]^in[20]^in[22];
roll_back_lfsr[071] = in[01]^in[04]^in[06]^in[12]^in[13]^in[14]^in[15]^in[17]^in[18]^in[19]^in[21];
roll_back_lfsr[072] = in[00]^in[02]^in[05]^in[07]^in[13]^in[14]^in[15]^in[16]^in[18]^in[19]^in[20]^in[22];
roll_back_lfsr[073] = in[01]^in[03]^in[06]^in[08]^in[14]^in[15]^in[16]^in[17]^in[19]^in[20]^in[21];
roll_back_lfsr[074] = in[00]^in[02]^in[04]^in[07]^in[09]^in[15]^in[16]^in[17]^in[18]^in[20]^in[21]^in[22];
roll_back_lfsr[075] = in[00]^in[01]^in[03]^in[05]^in[08]^in[10]^in[16]^in[17]^in[18]^in[19]^in[21]^in[22];
roll_back_lfsr[076] = in[01]^in[02]^in[04]^in[06]^in[09]^in[11]^in[17]^in[18]^in[19]^in[20]^in[22];
roll_back_lfsr[077] = in[02]^in[03]^in[05]^in[07]^in[10]^in[12]^in[18]^in[19]^in[20]^in[21];
roll_back_lfsr[078] = in[03]^in[04]^in[06]^in[08]^in[11]^in[13]^in[19]^in[20]^in[21]^in[22];
roll_back_lfsr[079] = in[00]^in[04]^in[05]^in[07]^in[09]^in[12]^in[14]^in[20]^in[21]^in[22];
roll_back_lfsr[080] = in[01]^in[05]^in[06]^in[08]^in[10]^in[13]^in[15]^in[21]^in[22];
roll_back_lfsr[081] = in[00]^in[02]^in[06]^in[07]^in[09]^in[11]^in[14]^in[16]^in[22];
roll_back_lfsr[082] = in[01]^in[03]^in[07]^in[08]^in[10]^in[12]^in[15]^in[17];
roll_back_lfsr[083] = in[00]^in[02]^in[04]^in[08]^in[09]^in[11]^in[13]^in[16]^in[18];
roll_back_lfsr[084] = in[00]^in[01]^in[03]^in[05]^in[09]^in[10]^in[12]^in[14]^in[17]^in[19];
roll_back_lfsr[085] = in[00]^in[01]^in[02]^in[04]^in[06]^in[10]^in[11]^in[13]^in[15]^in[18]^in[20];
roll_back_lfsr[086] = in[01]^in[02]^in[03]^in[05]^in[07]^in[11]^in[12]^in[14]^in[16]^in[19]^in[21];
roll_back_lfsr[087] = in[02]^in[03]^in[04]^in[06]^in[08]^in[12]^in[13]^in[15]^in[17]^in[20]^in[22];
roll_back_lfsr[088] = in[03]^in[04]^in[05]^in[07]^in[09]^in[13]^in[14]^in[16]^in[18]^in[21];
```

FIG. 14

```
roll_back_lfsr[089] = in[04]^in[05]^in[06]^in[08]^in[10]^in[14]^in[15]^in[17]^in[19]^in[22];
roll_back_lfsr[090] = in[00]^in[05]^in[06]^in[07]^in[09]^in[11]^in[15]^in[16]^in[18]^in[20];
roll_back_lfsr[091] = in[00]^in[01]^in[06]^in[07]^in[08]^in[10]^in[12]^in[16]^in[17]^in[19]^in[21];
roll_back_lfsr[092] = in[01]^in[02]^in[07]^in[08]^in[09]^in[11]^in[13]^in[17]^in[18]^in[20]^in[22];
roll_back_lfsr[093] = in[02]^in[03]^in[08]^in[09]^in[10]^in[12]^in[14]^in[18]^in[19]^in[21];
roll_back_lfsr[094] = in[03]^in[04]^in[09]^in[10]^in[11]^in[13]^in[15]^in[19]^in[20]^in[22];
roll_back_lfsr[095] = in[04]^in[05]^in[10]^in[11]^in[12]^in[14]^in[16]^in[20]^in[21];
roll_back_lfsr[096] = in[05]^in[06]^in[11]^in[12]^in[13]^in[15]^in[17]^in[21]^in[22];
roll_back_lfsr[097] = in[06]^in[07]^in[12]^in[13]^in[14]^in[16]^in[18]^in[22];
roll_back_lfsr[098] = in[07]^in[08]^in[13]^in[14]^in[15]^in[17]^in[19];
roll_back_lfsr[099] = in[08]^in[09]^in[14]^in[15]^in[16]^in[18]^in[20];
roll_back_lfsr[100] = in[09]^in[10]^in[15]^in[16]^in[17]^in[19]^in[21];
roll_back_lfsr[101] = in[00]^in[10]^in[11]^in[16]^in[17]^in[18]^in[20]^in[22];
roll_back_lfsr[102] = in[01]^in[11]^in[12]^in[17]^in[18]^in[19]^in[21];
roll_back_lfsr[103] = in[00]^in[02]^in[12]^in[13]^in[18]^in[19]^in[20]^in[22];
roll_back_lfsr[104] = in[01]^in[03]^in[13]^in[14]^in[19]^in[20]^in[21];
roll_back_lfsr[105] = in[02]^in[04]^in[14]^in[15]^in[20]^in[21]^in[22];
roll_back_lfsr[106] = in[03]^in[05]^in[15]^in[16]^in[21]^in[22];
roll_back_lfsr[107] = in[04]^in[06]^in[16]^in[17]^in[22];
roll_back_lfsr[108] = in[05]^in[07]^in[17]^in[18];
roll_back_lfsr[109] = in[00]^in[06]^in[08]^in[18]^in[19];
roll_back_lfsr[110] = in[01]^in[07]^in[09]^in[19]^in[20];
roll_back_lfsr[111] = in[00]^in[02]^in[08]^in[10]^in[20]^in[21];
roll_back_lfsr[112] = in[00]^in[01]^in[03]^in[09]^in[11]^in[21]^in[22];
roll_back_lfsr[113] = in[01]^in[02]^in[04]^in[10]^in[12]^in[22];
roll_back_lfsr[114] = in[00]^in[02]^in[03]^in[05]^in[11]^in[13];
roll_back_lfsr[115] = in[01]^in[03]^in[04]^in[06]^in[12]^in[14];
roll_back_lfsr[116] = in[02]^in[04]^in[05]^in[07]^in[13]^in[15];
roll_back_lfsr[117] = in[00]^in[03]^in[05]^in[06]^in[08]^in[14]^in[16];
roll_back_lfsr[118] = in[01]^in[04]^in[06]^in[07]^in[09]^in[15]^in[17];
roll_back_lfsr[119] = in[02]^in[05]^in[07]^in[08]^in[10]^in[16]^in[18];
roll_back_lfsr[120] = in[00]^in[03]^in[06]^in[08]^in[09]^in[11]^in[17]^in[19];
roll_back_lfsr[121] = in[01]^in[04]^in[07]^in[09]^in[10]^in[12]^in[18]^in[20];
roll_back_lfsr[122] = in[02]^in[05]^in[08]^in[10]^in[11]^in[13]^in[19]^in[21];
roll_back_lfsr[123] = in[03]^in[06]^in[09]^in[11]^in[12]^in[14]^in[20]^in[22];
roll_back_lfsr[124] = in[04]^in[07]^in[10]^in[12]^in[13]^in[15]^in[21];
roll_back_lfsr[125] = in[00]^in[05]^in[08]^in[11]^in[13]^in[14]^in[16]^in[22];
roll_back_lfsr[126] = in[00]^in[01]^in[06]^in[09]^in[12]^in[14]^in[15]^in[17];
roll_back_lfsr[127] = in[01]^in[02]^in[07]^in[10]^in[13]^in[15]^in[16]^in[18];
roll_back_lfsr[128] = in[00]^in[02]^in[03]^in[08]^in[11]^in[14]^in[16]^in[17]^in[19];
roll_back_lfsr[129] = in[01]^in[03]^in[04]^in[09]^in[12]^in[15]^in[17]^in[18]^in[20];
roll_back_lfsr[130] = in[02]^in[04]^in[05]^in[10]^in[13]^in[16]^in[18]^in[19]^in[21];
roll_back_lfsr[131] = in[00]^in[03]^in[05]^in[06]^in[11]^in[14]^in[17]^in[19]^in[20]^in[22];
roll_back_lfsr[132] = in[01]^in[04]^in[06]^in[07]^in[12]^in[15]^in[18]^in[20]^in[21];
roll_back_lfsr[133] = in[00]^in[02]^in[05]^in[07]^in[08]^in[13]^in[16]^in[19]^in[21]^in[22];
```

FIG. 15

```
roll_back_lfsr[134] = in[01]^in[03]^in[06]^in[08]^in[09]^in[14]^in[17]^in[20]^in[22];
roll_back_lfsr[135] = in[00]^in[02]^in[04]^in[07]^in[09]^in[10]^in[15]^in[18]^in[21];
roll_back_lfsr[136] = in[00]^in[01]^in[03]^in[05]^in[08]^in[10]^in[11]^in[16]^in[19]^in[22];
roll_back_lfsr[137] = in[01]^in[02]^in[04]^in[06]^in[09]^in[11]^in[12]^in[17]^in[20];
roll_back_lfsr[138] = in[00]^in[02]^in[03]^in[05]^in[07]^in[10]^in[12]^in[13]^in[18]^in[21];
roll_back_lfsr[139] = in[00]^in[01]^in[03]^in[04]^in[06]^in[08]^in[11]^in[13]^in[14]^in[19]^in[22];
roll_back_lfsr[140] = in[00]^in[01]^in[02]^in[04]^in[05]^in[07]^in[09]^in[12]^in[14]^in[15]^in[20];
roll_back_lfsr[141] = in[00]^in[01]^in[02]^in[03]^in[05]^in[06]^in[08]^in[10]^in[13]^in[15]^in[16]^in[21];
roll_back_lfsr[142] = in[01]^in[02]^in[03]^in[04]^in[06]^in[07]^in[09]^in[11]^in[14]^in[16]^in[17]^in[22];
roll_back_lfsr[143] = in[02]^in[03]^in[04]^in[05]^in[07]^in[08]^in[10]^in[12]^in[15]^in[17]^in[18];
roll_back_lfsr[144] = in[00]^in[03]^in[04]^in[05]^in[06]^in[08]^in[09]^in[11]^in[13]^in[16]^in[18]^in[19];
roll_back_lfsr[145] = in[00]^in[01]^in[04]^in[05]^in[06]^in[07]^in[09]^in[10]^in[12]^in[14]^in[17]^in[19]^in[20];
roll_back_lfsr[146] = in[01]^in[02]^in[05]^in[06]^in[07]^in[08]^in[10]^in[11]^in[13]^in[15]^in[18]^in[20]^in[21];
roll_back_lfsr[147] = in[02]^in[03]^in[06]^in[07]^in[08]^in[09]^in[11]^in[12]^in[14]^in[16]^in[19]^in[21]^in[22];
roll_back_lfsr[148] = in[03]^in[04]^in[07]^in[08]^in[09]^in[10]^in[12]^in[13]^in[15]^in[17]^in[20]^in[22];
roll_back_lfsr[149] = in[00]^in[04]^in[05]^in[08]^in[09]^in[10]^in[11]^in[13]^in[14]^in[16]^in[18]^in[21];
roll_back_lfsr[150] = in[00]^in[01]^in[05]^in[06]^in[09]^in[10]^in[11]^in[12]^in[14]^in[15]^in[17]^in[19]^in[22];
roll_back_lfsr[151] = in[00]^in[01]^in[02]^in[06]^in[07]^in[10]^in[11]^in[12]^in[13]^in[15]^in[16]^in[18]^in[20];
roll_back_lfsr[152] = in[01]^in[02]^in[03]^in[07]^in[08]^in[11]^in[12]^in[13]^in[14]^in[16]^in[17]^in[19]^in[21];
roll_back_lfsr[153] = in[02]^in[03]^in[04]^in[08]^in[09]^in[12]^in[13]^in[14]^in[15]^in[17]^in[18]^in[20]^in[22];
roll_back_lfsr[154] = in[03]^in[04]^in[05]^in[09]^in[10]^in[13]^in[14]^in[15]^in[16]^in[18]^in[19]^in[21];
roll_back_lfsr[155] = in[04]^in[05]^in[06]^in[10]^in[11]^in[14]^in[15]^in[16]^in[17]^in[19]^in[20]^in[22];
roll_back_lfsr[156] = in[05]^in[06]^in[07]^in[11]^in[12]^in[15]^in[16]^in[17]^in[18]^in[20]^in[21];
roll_back_lfsr[157] = in[00]^in[06]^in[07]^in[08]^in[12]^in[13]^in[16]^in[17]^in[18]^in[19]^in[21]^in[22];
roll_back_lfsr[158] = in[01]^in[07]^in[08]^in[09]^in[13]^in[14]^in[17]^in[18]^in[19]^in[20]^in[22];
roll_back_lfsr[159] = in[02]^in[08]^in[09]^in[10]^in[14]^in[15]^in[18]^in[19]^in[20]^in[21];
roll_back_lfsr[160] = in[03]^in[09]^in[10]^in[11]^in[15]^in[16]^in[19]^in[20]^in[21]^in[22];
roll_back_lfsr[161] = in[00]^in[04]^in[10]^in[11]^in[12]^in[16]^in[17]^in[20]^in[21]^in[22];
roll_back_lfsr[162] = in[00]^in[01]^in[05]^in[11]^in[12]^in[13]^in[17]^in[18]^in[21]^in[22];
roll_back_lfsr[163] = in[01]^in[02]^in[06]^in[12]^in[13]^in[14]^in[18]^in[19]^in[22];
roll_back_lfsr[164] = in[02]^in[03]^in[07]^in[13]^in[14]^in[15]^in[19]^in[20];
roll_back_lfsr[165] = in[00]^in[03]^in[04]^in[08]^in[14]^in[15]^in[16]^in[20]^in[21];
roll_back_lfsr[166] = in[00]^in[01]^in[04]^in[05]^in[09]^in[15]^in[16]^in[17]^in[21]^in[22];
roll_back_lfsr[167] = in[01]^in[02]^in[05]^in[06]^in[10]^in[16]^in[17]^in[18]^in[22];
roll_back_lfsr[168] = in[02]^in[03]^in[06]^in[07]^in[11]^in[17]^in[18]^in[19];
roll_back_lfsr[169] = in[00]^in[03]^in[04]^in[07]^in[08]^in[12]^in[18]^in[19]^in[20];
roll_back_lfsr[170] = in[00]^in[01]^in[04]^in[05]^in[08]^in[09]^in[13]^in[19]^in[20]^in[21];
roll_back_lfsr[171] = in[00]^in[01]^in[02]^in[05]^in[06]^in[09]^in[10]^in[14]^in[20]^in[21]^in[22];
roll_back_lfsr[172] = in[00]^in[01]^in[02]^in[03]^in[06]^in[07]^in[10]^in[11]^in[15]^in[21]^in[22];
roll_back_lfsr[173] = in[01]^in[02]^in[03]^in[04]^in[07]^in[08]^in[11]^in[12]^in[16]^in[22];
roll_back_lfsr[174] = in[02]^in[03]^in[04]^in[05]^in[08]^in[09]^in[12]^in[13]^in[17];
roll_back_lfsr[175] = in[00]^in[03]^in[04]^in[05]^in[06]^in[09]^in[10]^in[13]^in[14]^in[18];
roll_back_lfsr[176] = in[00]^in[01]^in[04]^in[05]^in[06]^in[07]^in[10]^in[11]^in[14]^in[15]^in[19];
roll_back_lfsr[177] = in[01]^in[02]^in[05]^in[06]^in[07]^in[08]^in[11]^in[12]^in[15]^in[16]^in[20];
roll_back_lfsr[178] = in[02]^in[03]^in[06]^in[07]^in[08]^in[09]^in[12]^in[13]^in[16]^in[17]^in[21];
```

FIG. 16

```
roll_back_lfsr[179] = in[00]^in[03]^in[04]^in[07]^in[08]^in[09]^in[10]^in[13]^in[14]^in[17]^in[18]^in[22];
roll_back_lfsr[180] = in[00]^in[01]^in[04]^in[05]^in[08]^in[09]^in[10]^in[11]^in[14]^in[15]^in[18]^in[19];
roll_back_lfsr[181] = in[00]^in[01]^in[02]^in[05]^in[06]^in[09]^in[10]^in[11]^in[12]^in[15]^in[16]^in[19]^in[20];
roll_back_lfsr[182] = in[00]^in[01]^in[02]^in[03]^in[06]^in[07]^in[10]^in[11]^in[12]^in[13]^in[16]^in[17]^in[20]^in[21];
roll_back_lfsr[183] = in[00]^in[01]^in[02]^in[03]^in[04]^in[07]^in[08]^in[11]^in[12]^in[13]^in[14]^in[17]^in[18]^in[21]^in[22];
roll_back_lfsr[184] = in[01]^in[02]^in[03]^in[04]^in[05]^in[08]^in[09]^in[12]^in[13]^in[14]^in[15]^in[18]^in[19]^in[22];
roll_back_lfsr[185] = in[02]^in[03]^in[04]^in[05]^in[06]^in[09]^in[10]^in[13]^in[14]^in[15]^in[16]^in[19]^in[20];
roll_back_lfsr[186] = in[00]^in[03]^in[04]^in[05]^in[06]^in[07]^in[10]^in[11]^in[14]^in[15]^in[16]^in[17]^in[20]^in[21];
roll_back_lfsr[187] = in[01]^in[04]^in[05]^in[06]^in[07]^in[08]^in[11]^in[12]^in[15]^in[16]^in[17]^in[18]^in[21]^in[22];
roll_back_lfsr[188] = in[00]^in[02]^in[05]^in[06]^in[07]^in[08]^in[09]^in[12]^in[13]^in[16]^in[17]^in[18]^in[19]^in[22];
roll_back_lfsr[189] = in[01]^in[03]^in[06]^in[07]^in[08]^in[09]^in[10]^in[13]^in[14]^in[17]^in[18]^in[19]^in[20];
roll_back_lfsr[190] = in[00]^in[02]^in[04]^in[07]^in[08]^in[09]^in[10]^in[11]^in[14]^in[15]^in[18]^in[19]^in[20]^in[21];
roll_back_lfsr[191] = in[01]^in[03]^in[05]^in[08]^in[09]^in[10]^in[11]^in[12]^in[15]^in[16]^in[19]^in[20]^in[21]^in[22];
roll_back_lfsr[192] = in[02]^in[04]^in[06]^in[09]^in[10]^in[11]^in[12]^in[13]^in[16]^in[17]^in[20]^in[21]^in[22];
roll_back_lfsr[193] = in[00]^in[03]^in[05]^in[07]^in[10]^in[11]^in[12]^in[13]^in[14]^in[17]^in[18]^in[21]^in[22];
roll_back_lfsr[194] = in[01]^in[04]^in[06]^in[08]^in[11]^in[12]^in[13]^in[14]^in[15]^in[18]^in[19]^in[22];
roll_back_lfsr[195] = in[02]^in[05]^in[07]^in[09]^in[12]^in[13]^in[14]^in[15]^in[16]^in[19]^in[20];
roll_back_lfsr[196] = in[00]^in[03]^in[06]^in[08]^in[10]^in[13]^in[14]^in[15]^in[16]^in[17]^in[20]^in[21];
roll_back_lfsr[197] = in[01]^in[04]^in[07]^in[09]^in[11]^in[14]^in[15]^in[16]^in[17]^in[18]^in[21]^in[22];
roll_back_lfsr[198] = in[00]^in[02]^in[05]^in[08]^in[10]^in[12]^in[15]^in[16]^in[17]^in[18]^in[19]^in[22];
roll_back_lfsr[199] = in[01]^in[03]^in[06]^in[09]^in[11]^in[13]^in[16]^in[17]^in[18]^in[19]^in[20];
roll_back_lfsr[200] = in[02]^in[04]^in[07]^in[10]^in[12]^in[14]^in[17]^in[18]^in[19]^in[20]^in[21];
roll_back_lfsr[201] = in[00]^in[03]^in[05]^in[08]^in[11]^in[13]^in[15]^in[18]^in[19]^in[20]^in[21]^in[22];
roll_back_lfsr[202] = in[00]^in[01]^in[04]^in[06]^in[09]^in[12]^in[14]^in[16]^in[19]^in[20]^in[21]^in[22];
roll_back_lfsr[203] = in[01]^in[02]^in[05]^in[07]^in[10]^in[13]^in[15]^in[17]^in[20]^in[21]^in[22];
roll_back_lfsr[204] = in[00]^in[02]^in[03]^in[06]^in[08]^in[11]^in[14]^in[16]^in[18]^in[21]^in[22];
roll_back_lfsr[205] = in[00]^in[01]^in[03]^in[04]^in[07]^in[09]^in[12]^in[15]^in[17]^in[19]^in[22];
roll_back_lfsr[206] = in[00]^in[01]^in[02]^in[04]^in[05]^in[08]^in[10]^in[13]^in[16]^in[18]^in[20];
roll_back_lfsr[207] = in[00]^in[01]^in[02]^in[03]^in[05]^in[06]^in[09]^in[11]^in[14]^in[17]^in[19]^in[21];
roll_back_lfsr[208] = in[00]^in[01]^in[02]^in[03]^in[04]^in[06]^in[07]^in[10]^in[12]^in[15]^in[18]^in[20]^in[22];
roll_back_lfsr[209] = in[01]^in[02]^in[03]^in[04]^in[05]^in[07]^in[08]^in[11]^in[13]^in[16]^in[19]^in[21];
roll_back_lfsr[210] = in[00]^in[02]^in[03]^in[04]^in[05]^in[06]^in[08]^in[09]^in[12]^in[14]^in[17]^in[20]^in[22];
roll_back_lfsr[211] = in[00]^in[01]^in[03]^in[04]^in[05]^in[06]^in[07]^in[09]^in[10]^in[13]^in[15]^in[18]^in[21];
roll_back_lfsr[212] = in[01]^in[02]^in[04]^in[05]^in[06]^in[07]^in[08]^in[10]^in[11]^in[14]^in[16]^in[19]^in[22];
roll_back_lfsr[213] = in[02]^in[03]^in[05]^in[06]^in[07]^in[08]^in[09]^in[11]^in[12]^in[15]^in[17]^in[20];
roll_back_lfsr[214] = in[00]^in[03]^in[04]^in[06]^in[07]^in[08]^in[09]^in[10]^in[12]^in[13]^in[16]^in[18]^in[21];
roll_back_lfsr[215] = in[01]^in[04]^in[05]^in[07]^in[08]^in[09]^in[10]^in[11]^in[13]^in[14]^in[17]^in[19]^in[22];
roll_back_lfsr[216] = in[02]^in[05]^in[06]^in[08]^in[09]^in[10]^in[11]^in[12]^in[14]^in[15]^in[18]^in[20];
roll_back_lfsr[217] = in[03]^in[06]^in[07]^in[09]^in[10]^in[11]^in[12]^in[13]^in[15]^in[16]^in[19]^in[21];
roll_back_lfsr[218] = in[04]^in[07]^in[08]^in[10]^in[11]^in[12]^in[13]^in[14]^in[16]^in[17]^in[20]^in[22];
roll_back_lfsr[219] = in[05]^in[08]^in[09]^in[11]^in[12]^in[13]^in[14]^in[15]^in[17]^in[18]^in[21];
roll_back_lfsr[220] = in[00]^in[06]^in[09]^in[10]^in[12]^in[13]^in[14]^in[15]^in[16]^in[18]^in[19]^in[22];
roll_back_lfsr[221] = in[01]^in[07]^in[10]^in[11]^in[13]^in[14]^in[15]^in[16]^in[17]^in[19]^in[20];
roll_back_lfsr[222] = in[02]^in[08]^in[11]^in[12]^in[14]^in[15]^in[16]^in[17]^in[18]^in[20]^in[21];
roll_back_lfsr[223] = in[03]^in[09]^in[12]^in[13]^in[15]^in[16]^in[17]^in[18]^in[19]^in[21]^in[22];
```

FIG. 17

```
roll_back_lfsr[224] = in[04]^in[10]^in[13]^in[14]^in[16]^in[17]^in[18]^in[19]^in[20]^in[22];
roll_back_lfsr[225] = in[00]^in[05]^in[11]^in[14]^in[15]^in[17]^in[18]^in[19]^in[20]^in[21];
roll_back_lfsr[226] = in[01]^in[06]^in[12]^in[15]^in[16]^in[18]^in[19]^in[20]^in[21]^in[22];
roll_back_lfsr[227] = in[02]^in[07]^in[13]^in[16]^in[17]^in[19]^in[20]^in[21]^in[22];
roll_back_lfsr[228] = in[00]^in[03]^in[08]^in[14]^in[17]^in[18]^in[20]^in[21]^in[22];
roll_back_lfsr[229] = in[01]^in[04]^in[09]^in[15]^in[18]^in[19]^in[21]^in[22];
roll_back_lfsr[230] = in[02]^in[05]^in[10]^in[16]^in[19]^in[20]^in[22];
roll_back_lfsr[231] = in[03]^in[06]^in[11]^in[17]^in[20]^in[21];
roll_back_lfsr[232] = in[00]^in[04]^in[07]^in[12]^in[18]^in[21]^in[22];
roll_back_lfsr[233] = in[00]^in[01]^in[05]^in[08]^in[13]^in[19]^in[22];
roll_back_lfsr[234] = in[01]^in[02]^in[06]^in[09]^in[14]^in[20];
roll_back_lfsr[235] = in[02]^in[03]^in[07]^in[10]^in[15]^in[21];
roll_back_lfsr[236] = in[03]^in[04]^in[08]^in[11]^in[16]^in[22];
roll_back_lfsr[237] = in[04]^in[05]^in[09]^in[12]^in[17];
roll_back_lfsr[238] = in[00]^in[05]^in[06]^in[10]^in[13]^in[18];
roll_back_lfsr[239] = in[01]^in[06]^in[07]^in[11]^in[14]^in[19];
roll_back_lfsr[240] = in[02]^in[07]^in[08]^in[12]^in[15]^in[20];
roll_back_lfsr[241] = in[00]^in[03]^in[08]^in[09]^in[13]^in[16]^in[21];
roll_back_lfsr[242] = in[01]^in[04]^in[09]^in[10]^in[14]^in[17]^in[22];
roll_back_lfsr[243] = in[00]^in[02]^in[05]^in[10]^in[11]^in[15]^in[18];
roll_back_lfsr[244] = in[00]^in[01]^in[03]^in[06]^in[11]^in[12]^in[16]^in[19];
roll_back_lfsr[245] = in[00]^in[01]^in[02]^in[04]^in[07]^in[12]^in[13]^in[17]^in[20];
roll_back_lfsr[246] = in[01]^in[02]^in[03]^in[05]^in[08]^in[13]^in[14]^in[18]^in[21];
roll_back_lfsr[247] = in[00]^in[02]^in[03]^in[04]^in[06]^in[09]^in[14]^in[15]^in[19]^in[22];
roll_back_lfsr[248] = in[00]^in[01]^in[03]^in[04]^in[05]^in[07]^in[10]^in[15]^in[16]^in[20];
roll_back_lfsr[249] = in[00]^in[01]^in[02]^in[04]^in[05]^in[06]^in[08]^in[11]^in[16]^in[17]^in[21];
roll_back_lfsr[250] = in[01]^in[02]^in[03]^in[05]^in[06]^in[07]^in[09]^in[12]^in[17]^in[18]^in[22];
roll_back_lfsr[251] = in[00]^in[02]^in[03]^in[04]^in[06]^in[07]^in[08]^in[10]^in[13]^in[18]^in[19];
roll_back_lfsr[252] = in[01]^in[03]^in[04]^in[05]^in[07]^in[08]^in[09]^in[11]^in[14]^in[19]^in[20];
roll_back_lfsr[253] = in[02]^in[04]^in[05]^in[06]^in[08]^in[09]^in[10]^in[12]^in[15]^in[20]^in[21];
roll_back_lfsr[254] = in[00]^in[03]^in[05]^in[06]^in[07]^in[09]^in[10]^in[11]^in[13]^in[16]^in[21]^in[22];
roll_back_lfsr[255] = in[01]^in[04]^in[06]^in[07]^in[08]^in[10]^in[11]^in[12]^in[14]^in[17]^in[22];
endfunction
```

FIG. 18

| Bit / Byte | 7 | 6 | 5 | 4 | 3 | 2 | 1 | 0 |
|---|---|---|---|---|---|---|---|---|
| 0 | INITIATOR PORT | SAS PROTOCOL | | | ADDRESS FRAME TYPE (1h) | | | |
| 1 | FEATURES | | | | CONNECTION RATE | | | |
| 2 | INITIATOR CONNECTION TAG | | | | | | | |
| 3 | | | | | | | | |
| 4 | DESTINATION SAS ADDRESS | | | | | | | |
| ... | | | | | | | | |
| 11 | | | | | | | | |
| 12 | SOURCE SAS ADDRESS | | | | | | | |
| ... | | | | | | | | |
| 19 | | | | | | | | |
| 20 | SOURCE ZONE GROUP | | | | | | | |
| 21 | PATHWAY BLOCKED COUNT | | | | | | | |
| 22 | ARBITRATION WAIT TIME | | | | | | | |
| 23 | | | | | | | | |
| 24 | COMPATIBLE FEATURES (000000b) | | | | | | CREDIT ADVANCE | SEND EXTEND |
| 25 | MORE COMPATIBLE FEATURES (000000h) | | | | | | | |
| ... | | | | | | | | |
| 27 | | | | | | | | |
| 28 | CRC | | | | | | | |
| ... | | | | | | | | |
| 31 | | | | | | | | |

FIG. 19

| Byte \ Bit | 7 | 6 | 5 | 4 | 3 | 2 | 1 | 0 |
|---|---|---|---|---|---|---|---|---|
| 0 | FRAME TYPE ||||||||
| 1 ... 3 | HASHED DESTINATION SAS ADDRESS ||||||||
| 4 | Reserved ||||||||
| 5 ... 7 | HASHED SOURCE SAS ADDRESS ||||||||
| 8 | Reserved ||||||||
| 9 | Reserved ||||||||
| 10 | Reserved ||| TLR CONTROL || RETRY DATA FRAMES | RE-TRANSMIT | CHANGING DATA POINTER |
| 11 | Reserved |||||| NUMBER OF FILL BYTES ||
| 12 | Reserved ||||||||
| 13 ... 15 | Reserved ||||||||
| 16 17 | INITIATOR PORT TRANSFER TAG ||||||||
| 18 19 | TARGET PORT TRANSFER TAG ||||||||
| 20 ... 23 | DATA OFFSET ||||||||
| 24 ... m | INFORMATION UNIT ||||||||
|  | Fill bytes, if needed ||||||||
| n-3 ... n | CRC ||||||||

F I G. 28

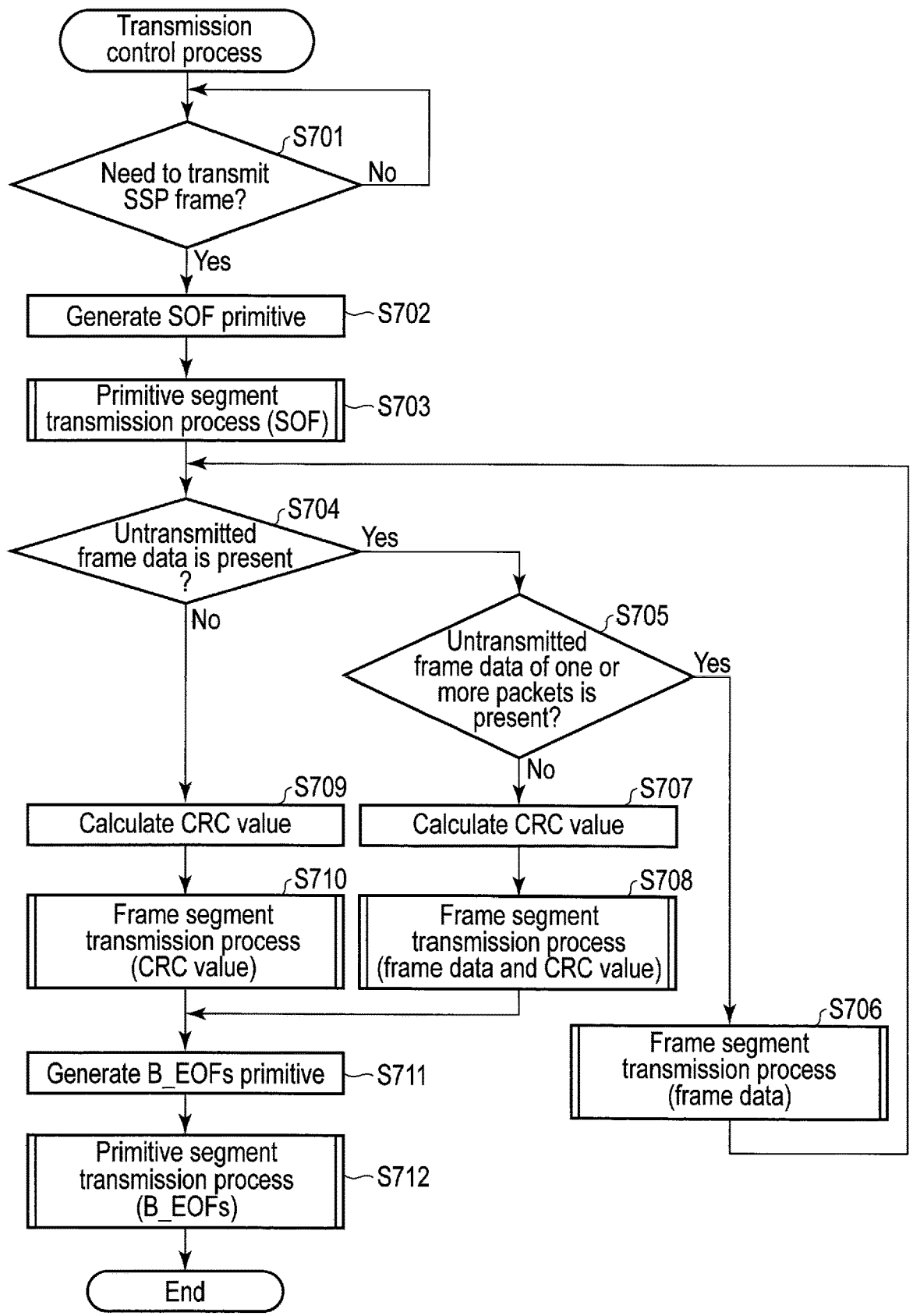
F I G. 30

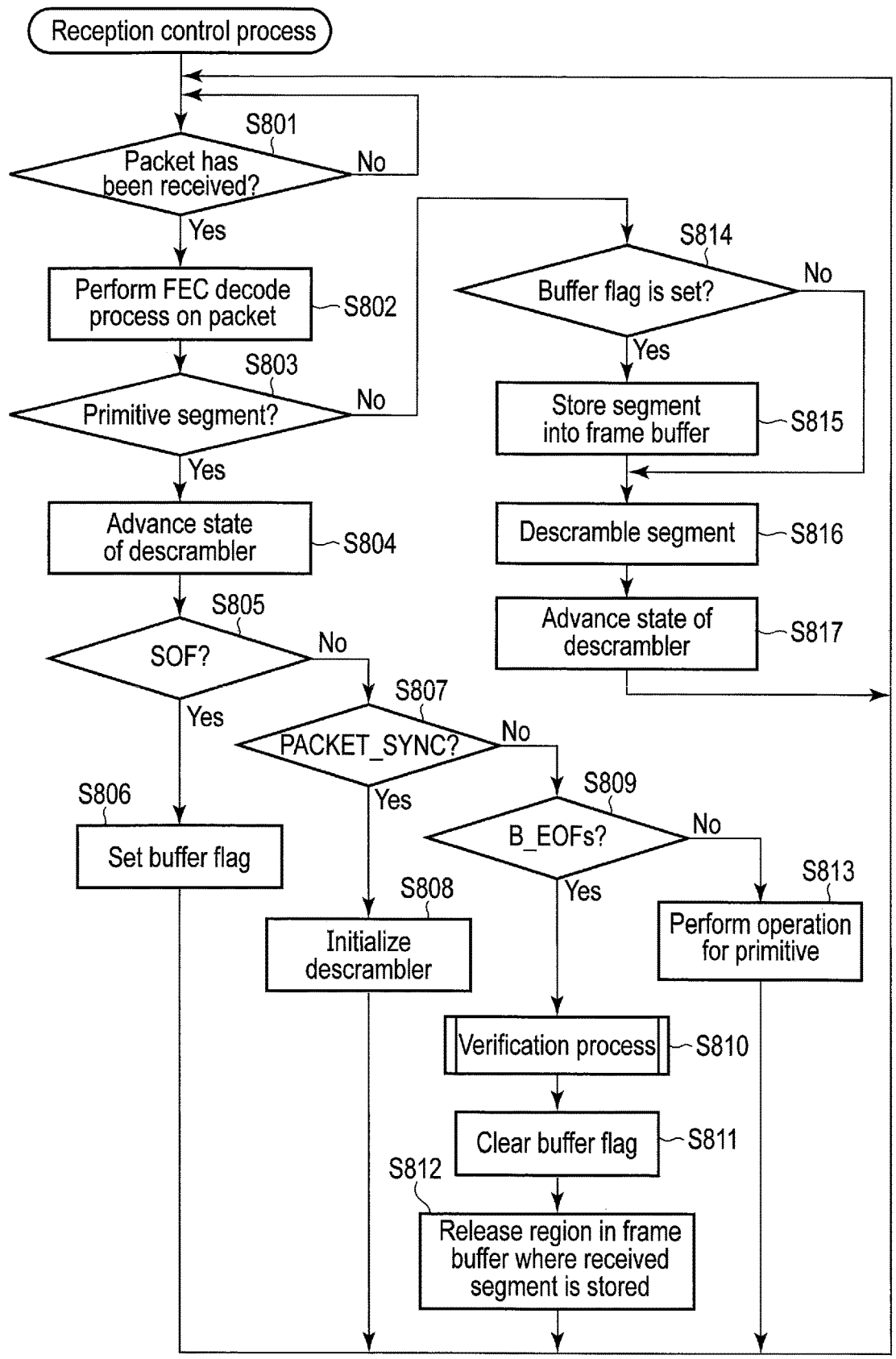
F I G. 31

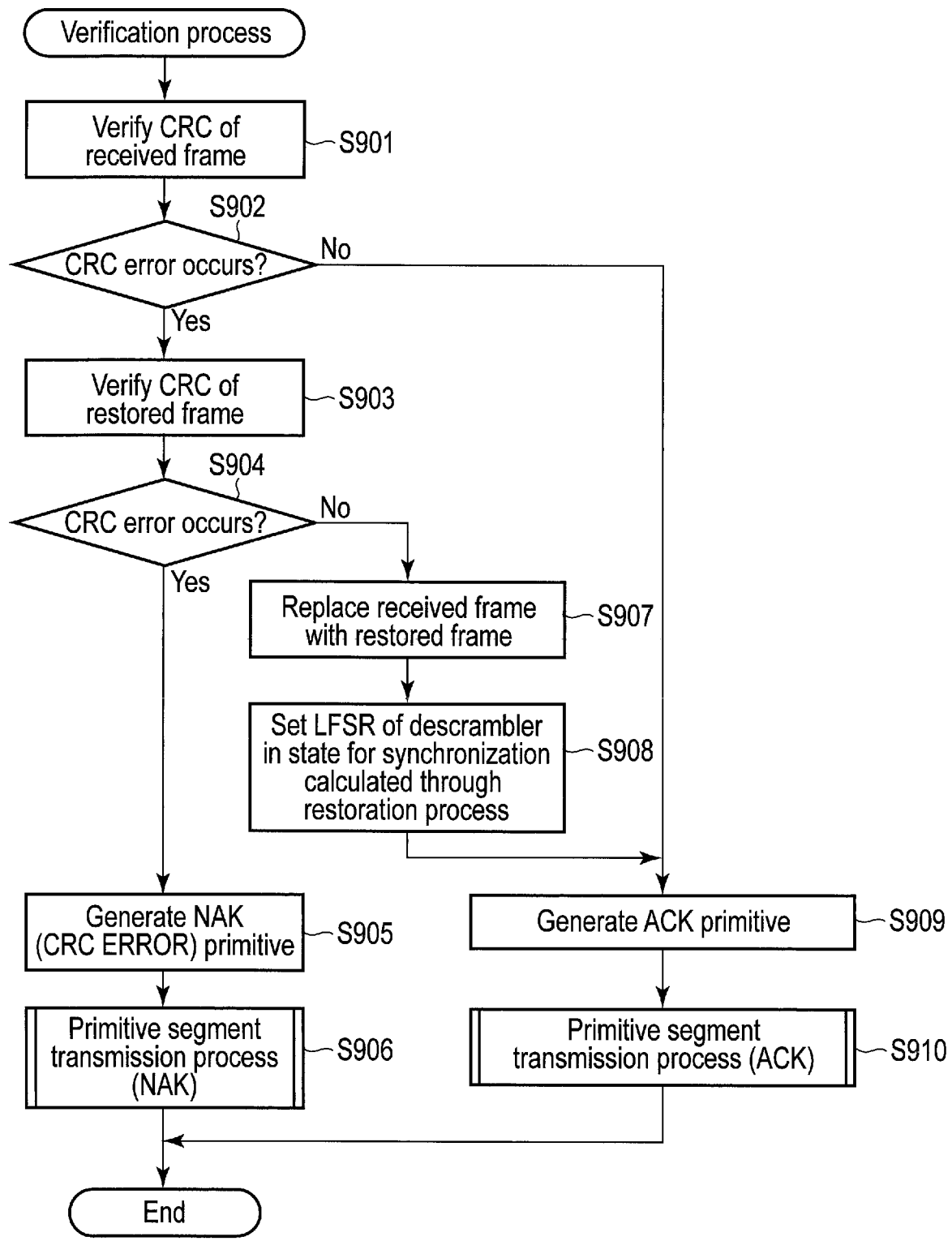
F I G. 32

APPARATUS AND METHOD

CROSS-REFERENCE TO RELATED APPLICATIONS

This application is based upon and claims the benefit of priority from Japanese Patent Application No. 2018-133290, filed Jul. 13, 2018, the entire contents of which are incorporated herein by reference.

FIELD

Embodiments described herein relate generally to an apparatus connected via a serial attached small computer system interface (serial attached SCSI: SAS).

BACKGROUND

SAS is an interface standard for connecting two or more apparatuses. SAS defines a specification for establishing connection between an initiator device (which will be denoted as initiator below) and a target device (which will be denoted as target below) and exchanging commands or user data therebetween.

Each of the initiator and the target includes a scrambler and a descrambler to reduce uniformity of bits in exchanged interface data. When the scrambler in the initiator is synchronized with the descrambler in the target, interface data transmitted by the initiator and received by the target is appropriately scrambled/descrambled. Similarly, when the scrambler in the target is synchronized with the descrambler in the initiator, interface data transmitted by the target and received by the initiator is appropriately scrambled/descrambled.

SAS4 standard newly defines SAS Gen5. A packet mode is supported in the SAS Gen5 instead of the dword mode supported in SAS Gen4. Interface data is handled in units of 40 bits in the dword mode while interface data is handled in units of 150 bits in the packet mode.

The packet mode is different from the dword mode in timing when the scrambler and the descrambler are synchronized. In the dword mode, the scrambler is initialized on transmission of a primitive indicating the start of a frame and the descrambler is initialized on reception of the primitive. To the contrary, in the packet mode, the scrambler is initialized on transmission of PACKET_SYNC extended binary primitive (which will be also denoted as PACKET_SYNC below) and the descrambler is initialized on reception of the PACKET_SYNC. Timing to exchange PACKET_SYNC is not related with exchanging a frame. Thus, when a loss of synchronization between the scrambler and the descrambler occurs due to an unexpected operation, the loss of synchronization might continue until PACKET_SYNC is exchanged again, and errors might be caused in a series in frames transmitted between the initiator and the target.

BRIEF DESCRIPTION OF THE DRAWINGS

FIG. 6 is a block diagram illustrating a configuration of the apparatus of the embodiment.

FIG. 7 is a block diagram illustrating a configuration of a scrambler and a descrambler in the apparatus of the embodiment.

FIG. 8A is a diagram illustrating a configuration of a linear feedback shift register (LFSR) that advances and is used in the apparatus of the embodiment.

FIG. 8B is a diagram illustrating a configuration of an LFSR that retreats and is used in the apparatus of the embodiment.

FIG. 9 illustrates an example of a format of an IDENTIFY address frame exchanged by the apparatuses of the embodiment.

FIG. 11 illustrates an example of a function to restore an LFSR state at a point in time when the scrambling data used for calculation of the value of the defined value field illustrated in FIG. 10 is generated.

FIG. 12 illustrates an example of a function to calculate an LFSR state at a point in time when an EOAF primitive subsequent to the IDENTIFY address frame illustrated in FIG. 10 is received.

FIG. 13 illustrates a first portion of an example of a function to calculate scrambling data to descramble the IDENTIFY address frame illustrated in FIG. 10.

FIG. 14 illustrates a second portion subsequent to the first portion illustrated in FIG. 13.

FIG. 15 illustrates a third portion subsequent to the second portion illustrated in FIG. 14.

FIG. 16 illustrates a fourth portion subsequent to the third portion illustrated in FIG. 15.

FIG. 17 illustrates a fifth portion subsequent to the fourth portion illustrated in FIG. 16.

FIG. 18 illustrates a sixth portion subsequent to the fifth portion illustrated in FIG. 17.

FIG. 19 illustrates an example of a format of an OPEN address frame exchanged by the apparatuses of the embodiment.

FIG. 28 illustrates an example of a format of a serial small computer system interface protocol (SSP) frame exchanged by the apparatuses of the embodiment.

FIG. 30 is a flowchart illustrating an example of the procedure of a transmission control process of an SSP frame executed by the apparatus of the embodiment.

FIG. 31 is a flowchart illustrating an example of the procedure of a reception control process of an SSP frame executed by the apparatus of the embodiment.

FIG. 32 is a flowchart illustrating an example of the procedure of a verification process of an SSP frame executed by the apparatus of the embodiment.

DETAILED DESCRIPTION

Various embodiments will be described hereinafter with reference to the accompanying drawings.

In general, according to one embodiment, an apparatus is capable of exchanging a frame with an external apparatus in a packet mode of a serial attached small computer system interface (SAS). The external apparatus includes a scrambler. The apparatus includes a descrambler and a controller. The descrambler is configured to descramble frame data scrambled by the scrambler. The controller is configured to, in a case where first frame data is received from the external apparatus, synchronize the descrambler with the scrambler using the first frame data and a first value that is to be scrambled by the scrambler to obtain the first frame data.

Figure 1:
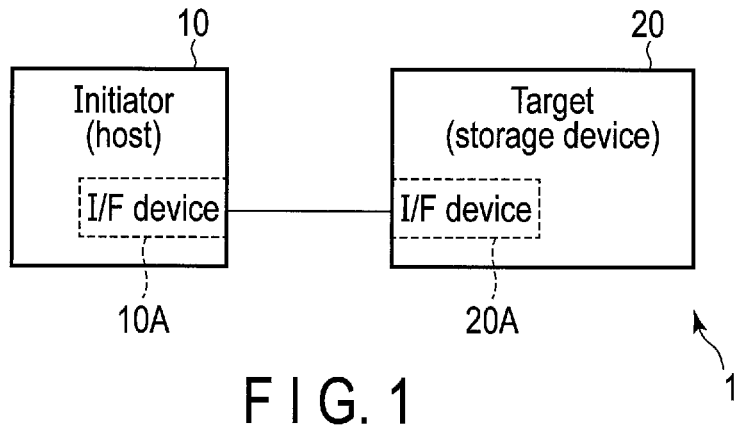
FIG. 1 is a block diagram illustrating a configuration of an information processing system including an apparatus according to an embodiment.

A configuration of an information processing system 1 including an apparatus according to an embodiment will be described with reference to FIG. 1.

The information processing system 1 includes two apparatuses connected via a SAS interface. One of the apparatuses is an initiator device (also referred to as an initiator) 10, and the other is a target device (also referred to as a target) 20.

The initiator 10 is a host such as a computer. The target 20 is a storage device such as a hard disk drive (HDD) or a solid-state drive (SSD). The initiator 10 and the target 20 include interface devices 10A and 20A operating in accordance with the SAS specification, respectively.

The initiator 10 and target 20 each may exchange commands, user data, etc., via the interface devices 10A and 20A. The initiator 10 and the target 20 may operate as both a transmitter device (Tx) to transmit a frame and a receiver device (Rx) to receive a frame. A term "frame" refers to one of an IDENTIFY address frame, an OPEN address frame, a serial small computer system interface protocol (SSP) frame, a serial management protocol (SMP) frame, and a serial advanced technology attachment tunneled protocol (STP) frame. Since each frame includes a cyclic redundancy check (CRC), reliability of frame data is obtained.

Each of the interface device 10A in the initiator 10 and the interface device 20A in the target 20 includes a scrambler and a descrambler to reduce uniformity of bits in exchanged interface data. In the following, it is assumed that each of the interface devices 10A and 20A includes a SAS Gen5 scrambler and a SAS Gen5 descrambler.

In the initiator 10 and target 20 of SAS Gen5 apparatuses, the scramblers and descramblers are configured as described below in a packet mode.

(1) The scrambler is initialized when PACKET_SYNC is transmitted.

(2) The scrambler runs when a primitive is transmitted.

(3) The descrambler is initialized when PACKET_SYNC is received.

(4) The descrambler operates when a primitive is received.

(5) When a dword within a frame or a dword outside a frame is transmitted, the scrambler scrambles the dword and runs.

(6) When a dword within a frame or a dword outside a frame is received, the descrambler descrambles the dword and runs.

Note that the term "run" or "RUN" refers to advancing a state of a scrambler or a descrambler. As described above, the scrambler runs but does not scramble a primitive when the primitive is transmitted. The descrambler runs but does not descramble a primitive when the primitive is received.

As state, what the scrambler runs means that the number of times of operations of the scrambler increments and the scrambler advances to a subsequent state. The scrambler generates a different pattern for scrambling whenever the state advances. Also, what the descrambler runs means that the number of times of operation of the descrambler increments and the descrambler advances to a subsequent state. The descrambler generates a different pattern for descrambling whenever the state advances. The term "scrambler (or descrambler) runs" will be also referred to "scrambler (or descrambler) operates".

When the initiator 10 transmits frame data in a frame to the target 20, the scrambler of the initiator 10 scrambles the frame data, and the descrambler of the target 20 descrambles the scrambled frame data received from the initiator 10. Similarly, when the target 20 transmits frame data to the initiator 10, the scrambler of the target 20 scrambles the frame data, and the descrambler of the initiator 10 descrambles the scrambled frame data received from the target 20.

As described above, the state of each of the scrambler and descrambler is advanced per run, and a pattern used for scrambling/descrambling is accordingly changed. When the number of times of runs from the initial state is the same between the scrambler and the descrambler, in other words, when the scrambler is synchronized with the descrambler, the scrambler and the descrambler can generate the same pattern. That is, the fact that the number of times of runs from the initial state is the same between the scrambler and descrambler means that the scrambler is synchronized with the descrambler. Note that whether the scrambler is synchronized with the descrambler has no relation with time when the state of each of the scrambler and the descrambler advances or time when each of them generates a pattern, but depends upon only whether the number of times of runs from the initial state is the same.

Figure 2:
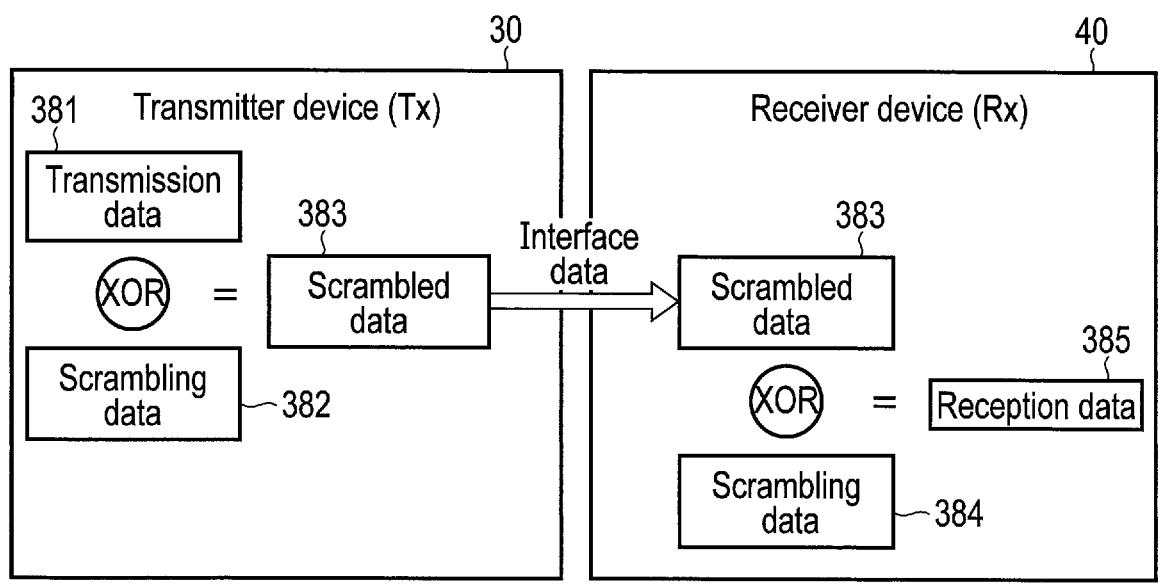
FIG. 2 is a diagram illustrating interface data transferred in the information processing system illustrated in FIG. 1.

An example in which a scrambled data is exchanged between a transmitter device 30 and a receiver device 40 will be described with reference to FIG. 2. When one of the initiator 10 and the target 20 operates as the transmitter device 30, the other operates as the receiver device 40. In each of the initiator 10 and the target 20, the operations of the transmitter device 30 and receiver device 40 may be performed in parallel.

The transmitter device 30 performs an exclusive logical OR (XOR) operation on frame data 381 to be transmitted (also referred to as transmission data) with scrambling data 382 that is a pattern generated by the scrambler to generate scrambled data 383. The scrambled data 383 is interface data transmitted from the transmitter device 30 to the receiver device 40.

The receiver device 40 performs an XOR operation on the scrambled data 383 with scrambling data 384 generated by the descrambler to generate reception data 385. When the scrambler of the transmitter device 30 is synchronized with the descrambler of the receiver device 40 and the values of the scrambling data 382 and 384 are the same, the receiver device 40 generates reception data 385 in which no reception error due to a loss of synchronization occurs. The reception data corresponds to data generated by restoring the transmission data 381 without error and is therefore identical to the transmission data 381. Note that the reception error is, for example, a CRC error.

If, however, a loss of synchronization occurs between the scrambler of the transmitter device 30 and the descrambler of the receiver device 40, there is no method for detecting the loss of synchronization during idle time, but it will be detected as a reception error when a frame is received.

In SAS Gen4 devices, in a dword mode, the scrambler is initialized when a primitive (e.g., SOAF or SOF) indicating the start of a frame is transmitted, and the descrambler is initialized when the primitive is received. Therefore, whether the scrambler was synchronized with the descrambler during idle time prior to the transmission of a frame does not affect the transmission of the frame.

In contrast, in SAS Gen5 apparatuses, in a packet mode, the scrambler is initialized when PACKET_SYNC is transmitted and the descrambler is initialized when PACKET_SYNC is received. For example, the PACKET_SYNC is transmitted from the transmitter device 30 to the receiver device 40 immediately before link-up and periodically transmitted after the link-up.

The transmitter device 30 and the receiver device 40 connected via a SAS Gen5 interface may exchange a frame that includes a primitive such as PACKET_SYNC or frame data, in units of a packet in the packet mode. An IDENTIFY address frame, an OPEN address frame, an SSP frame, an SMP frame, and an STP frame are composed of one or more packets, respectively.

Figure 3:
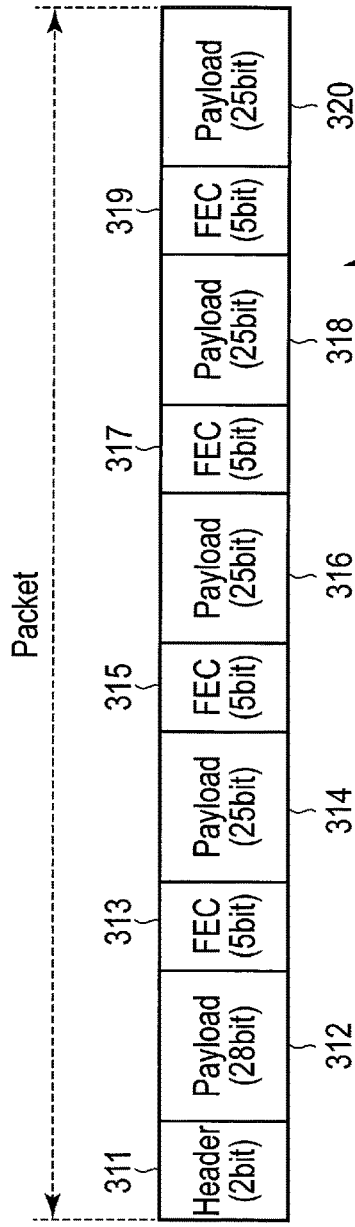
FIG. 3 is a diagram illustrating a configuration of a packet exchanged by the apparatuses of the embodiment.

FIG. 3 illustrates a configuration of a packet (i.e., SAS protocol layer (SPL) packet) 31 exchanged between the initiator 10 and the target 20, As illustrated in FIG. 3, the packet 31 has a size of 150 bits, and includes a 2-bit header 311 located at the head thereof, a 128-bit payload, and a 20-bit forward error collection (FEC) code. The 128-bit payload is divided into one 28-bit payload portion 312 and four 25-bit payload portions 314, 316, 318 and 320. The 20-bit FEC code is divided into four 5-bit code portions 313, 315, 317 and 319. The five payload portions 312, 314, 316, 318 and 320 and the four code portions 313, 315, 317 and 319 are alternately arranged in the packet 31.

The header 311 specifies the type of the payload that is composed of the payload portions 312, 314, 316, 318 and 320. The payload includes any one segment among an idle dword segment, a primitive segment, a scrambled idle segment, and an SPL frame segment.

An idle dword segment contains four idle dwords and is transmitted outside a frame. A primitive segment contains a primitive, a binary primitive, a primitive parameter, or an extended binary primitive. A scrambled idle segment contains any four data dwords. An SPL frame segment contains, for example, one of an address frame segment that includes four data dwords of an address frame and an SSP frame segment that includes four data dwords of the SSP frame.

The FEC code composed of the code portions 313, 315, 317 and 319 includes codes for error detection and error correction, and employs, for example, a Reed-Solomon code.

The receiver device 40 performs an FEC decode process on the received packet. This FEC decode process includes a process for error detection and error correction using the FEC code. The receiver device 40 detects an error using the FEC code. When the receiver device 40 cannot correct the error, it determines that an FEC error occurs in the packet and discards the packet.

In the SAS (specifically, SAS Protocol Layer-4 (SPL-4)), a state machine SP_PS in the receiver device 40 monitors a state of reception. Upon receiving a packet with an FEC error continuously a specified number of times (e.g., four times), the state machine SP_PS determines that detecting the boundary of the received packets has been failing and starts to search for the boundary again, resulting in a state where a frame is unreceivable. If, however, the state machine SP_PS receives a packet with an FEC error continuously the number of times (e.g., three times) that is smaller than the specified number of times and no FEC error occurs in a packet received immediately after the packet with an FEC error, Phy Layer Ready, which is a frame exchangeable state, may be continued. The Phy Layer Ready may be continued even though the communication state is relatively poor and FEC errors occur intermittently in packets. In this case, an FEC error might occur in a packet containing PACKET_SYNC.

Even though the state of reception is good, an FEC error might also occur in a packet containing PACKET_SYNC when a communication error is momentarily caused under the influence of an electrical error such as electrostatic discharge (ESD) or voltage drop.

When an FEC error occurs in a packet containing PACKET_SYNC, the descrambler of the receiver device 40 is not initialized. Thus, a loss of synchronization occurs between the descrambler of the receiver device 40 and the scrambler of the transmitter device 30. The loss of synchronization continues until PACKET_SYNC is exchanged again, and a reception error (e.g., CRC error) will continue to occur in a frame transferred from the transmitter device 30 to the receiver device 40.

Accordingly, when a transferred frame is an OPEN address frame, a timeout occurs due to an open timeout timer of the transmitter device 30. When the frame is an IDENTIFY address frame, a timeout occurs due to an identify timeout timer of the transmitter device 30, and a link reset sequence is performed again. When the frame is an SSP frame, a process of transmitting a NAK primitive indicating that a reception error has occurred to the transmitter device 30 is performed.

Furthermore, when the receiver device 40 cannot respond to a TASK frame from the transmitter device 30 while the descrambler of the receiver device 40 is not synchronized with the scrambler of the transmitter device 30, the target 20 might be isolated from the information processing system 1. The TASK frame is, for example, a frame to request an abort of read or write when the target 20 may be in an abnormal state.

Figure 4:
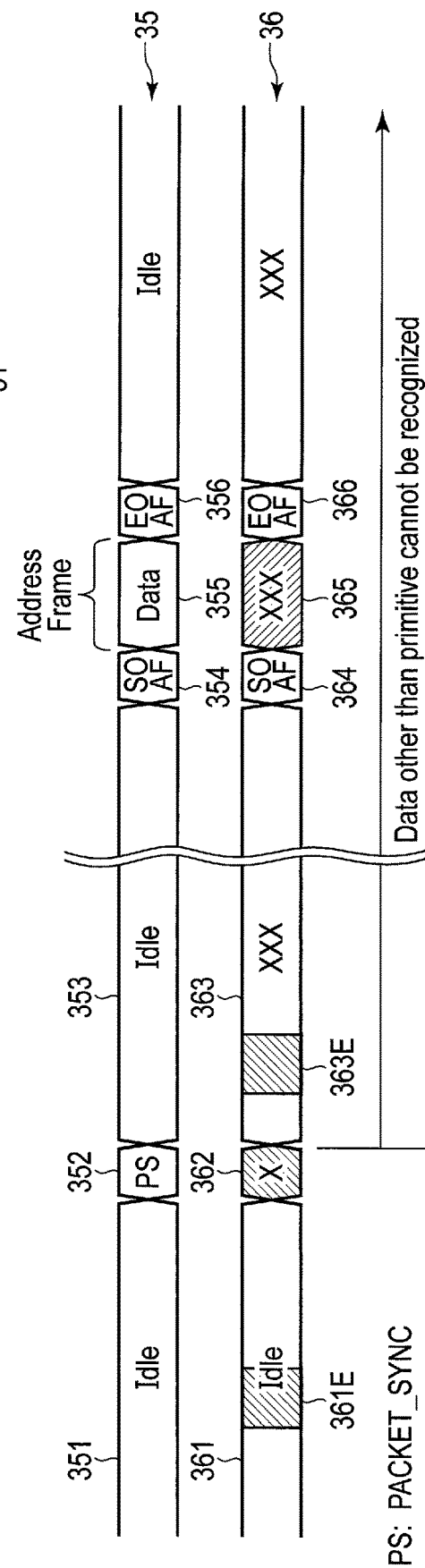
FIG. 4 is a timing chart of packet reception in both cases where PACKET_SYNC is correctly received and it is incorrectly received in the apparatus of the embodiment.

FIG. 4 exemplifies a first timing chart 35 in which the receiver device 40 correctly receives PACKET_SYNC and a second timing chart 36 in which the receiver device 40 fails to correctly receive PACKET_SYNC.

In the first timing chart 35, the receiver device 40 correctly receives a packet 352 containing PACKET_SYNC between packets 351 and 353 that are received during idle time. Accordingly, the descrambler of the receiver device 40 is initialized and synchronized with the scrambler of the transmitter device 30 that is initialized when the packet 352 is transmitted.

Then, the receiver device 40 correctly recognizes frame data (here, frame data of an address frame) as well as primitives (here, SOAF and EOAF) from packets 354, 355 and 356 received after the packet 353. In other words, the receiver device 40 can acquire frame data with no reception error due to a loss of synchronization from the packet 355, using scrambling data generated by the descrambler that is synchronized with the scrambler of the transmitter device 30.

In contrast, in the second timing chart 36, an FEC error occurs in a packet 361E of packets 361 received during idle time. Since, however, the receiver device 40 receives the packet 361E with an FEC error continuously less than a specified number of times, the frame exchangeable state between the transmitter device 30 and the receiver device 40 is continued.

After that, in the receiver device 40, an FEC error also occurs in a packet 362 containing PACKET_SYNC. Accordingly, the scrambler of the transmitter device 30 is initialized upon transmission of this packet 362, whereas the descrambler of the receiver device 40 is not initialized, with the result that a loss of synchronization occurs between the descrambler of the receiver device 40 and the scrambler of the transmitter device 30.

Then, an FEC error occurs in a packet 363E of packets 363 received during idle time. Since, however, the receiver device 40 receives the packet 363E with an FEC error continuously less than the specified number of times, the frame exchangeable state between the receiver device 40 and the transmitter device 30 is continued.

The receiver device 40, which has incorrectly received the packet 362 containing PACKET_SYNC, can recognize primitives correctly but cannot recognize frame data, which is not a primitive, from the packets 363, 364, 365 and 366 transmitted by the transmitter device 30 after the loss of synchronization has occurred between the descrambler of the receiver device 40 and the scrambler of the transmitter device 30. Since the primitives are not scrambled and descrambled, the receiver device 40 can recognize SOAF from the packet 364 and recognize EOAF from the packet 366. Since, however, frame data composed of dwords is scrambled and descrambled, the receiver device 40 cannot recognize the frame data from the packet 365.

When the receiver device 40 has received PACKET_SYNC incorrectly by a factor such as a broken packet, it cannot recognize frames received until it receives next PACKET_SYNC correctly. In the receiver device 40, therefore, a reception error due to a loss of synchronization between the scrambler of the transmitter device 30 and the descrambler of the receiver device 40 might occur repeatedly.

SAS (SPL-4) standard defines that a scrambler initialization timer is used to transmit PACKET_SYNC each time the timer expires after the devices 30 and 40 are brought into a Phy Layer Ready that is a frame exchangeable state. Thus, the scrambler and descrambler are regularly synchronized with each other.

A vendor-specific value is set to the scrambler initialization timer to allow PACKET_SYNC to be transmitted at any transmission intervals. However, even though PACKET_SYNC is regularly transmitted, the synchronization between the scrambler and descrambler is not assured at all. Since a loss of synchronization between a scrambler 104 and a descrambler 108 is caused by missing PACKET_SYNC due to an FEC error occurring in a packet containing the PACKET_SYNC, it is not always better to transmit PACKET_SYNC more frequently.

In the present embodiment, when a frame reception error occurs due to a loss of synchronization between the scrambler and the descrambler, the descrambler of the receiver device 40 can be synchronized with the scrambler of the transmitter device 30 and the frame can be descrambled correctly. The receiver device 40 uses a value of a specific field in the received frame, namely, frame data corresponding to the specific field to synchronize the descrambler with the scrambler and descramble the received frame. This improves fault tolerance to the reception error at a link level of the receiver device 40.

The specific field in the received frame contains a value (that is, a scrambled value) obtained by scrambling a value that is to be scrambled and is held in advance in the receiver device 40. In other words, the specific field is a field that may contain a defined (also may be expressed as "pre-determined" or "fixed") value that is cognizable by the receiver device 40. Hereinafter, the specific field in the received frame will also be referred to as a defined value field.

Figure 5:
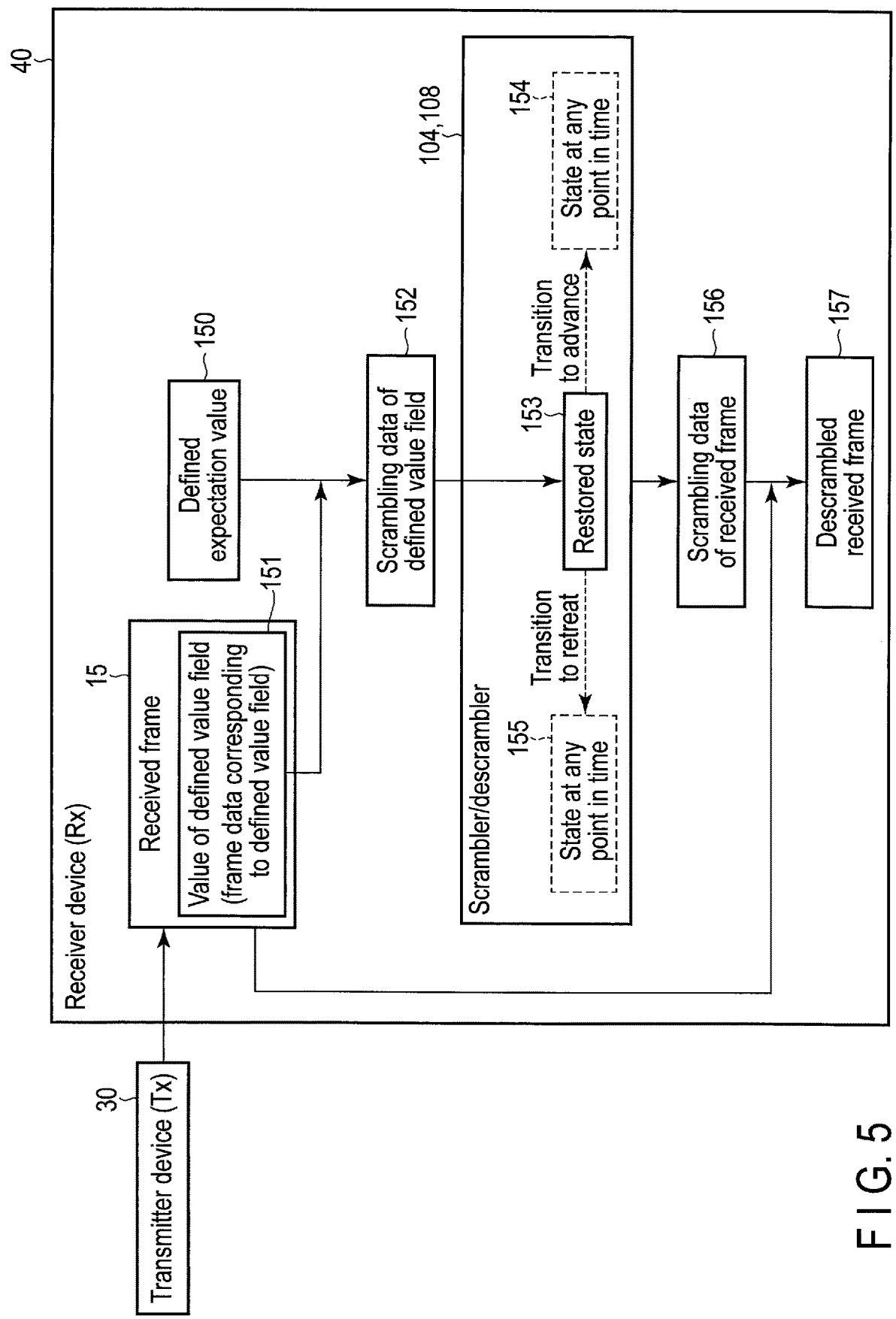
FIG. 5 is a block diagram illustrating an example in which a received frame is descrambled by the apparatus of the embodiment, using a value of a defined value field and a defined expectation value.

A method for synchronizing the descrambler of the receiver device 40 with the scrambler of the transmitter device 30 and descrambling a frame correctly even when a reception error of the frame occurs due to a loss of synchronization between the scrambler and the descrambler will be described with reference to FIG. 5.

As described above, the defined value field in a received frame 15 contains a value 151 obtained by scrambling a value that is to be scrambled and is held in advance in the receiver device 40. In other words, the receiver device 40 knows a descrambled value of the value 151 before receiver device 40 descrambles the value 151. The defined value field is, for example, a field in which it is previously defined that a specific value (e.g., zero) is set, or a field in which a value known by the receiver device 40 such a SAS address of the receiver device 40 is set. Hereinafter, a value that is to be scrambled to obtain the value 151 and is held in advance in the receiver device 40 will be also referred to as a defined expectation value 150.

For a specified number or more of contiguous bits contained in the received frame 15, if the receiver device 40 holds in advance the defined expectation value 150 corresponding to an un-scrambled value of the contiguous bits, the un-scrambled values of the contiguous bits may be used as the value 151 of the defined value field. This specified number is determined according to pattern generators provided in the scrambler 104 and the descrambler 108.

For example, when each pattern generator includes a 23-bit linear feedback shift register (LFSR), the specified number is 23. In this case, when the received frame 15 contains at least 23 contiguous bits and the receiver device 40 has the defined expectation value 150 that corresponds to an un-scrambled value of the at least 23 contiguous bits, the 23-bit value may be used as the value 151 of the defined value field. In the following, a case where each pattern generator includes a 23-bit LFSR (namely, a case where each pattern generator is implemented with a generator polynomial of $2^{23}-1$) will be mainly exemplified.

The receiver device 40 is able to synchronize the descrambler 108 of the receiver device 40 with the scrambler 104 of the transmitter device 30 using the value 151 of the defined value field in the received frame 15 and the defined expectation value 150 corresponding to the value 151. When the receiver device 40 employs the 23-bit LFSR and has the defined expectation value 150 for the value of at least 23 contiguous bits of the received frame 15, it can definitely calculate an LFSR state at any point in time by only performing XOR operations on the value 151 of the defined value field, which has at least 23 bits, and the defined expectation value 150.

More specifically, the receiver device 40 calculates scrambling data 152, which is used to generate the value 151 of the defined value field in the received frame 15, using the value 151 and the defined expectation value 150 in the receiver device 40. A method for calculating the scrambling data 152 will be specifically described later.

Then, the receiver device 40 restores a state 153 of the scrambler 104/descrambler 108 at the point in time when the scrambling data 152 is generated. This state 153 is also referred to as a restored state.

The receiver device 40 may set the scrambler 104/descrambler 108 in states 154 and 155 at some point in time by changing the state of the scrambler 104/descrambler 108 to advance a certain number of times from the restored state 153 or to retreat a certain number of times therefrom. Thus, the descrambler 108 of the receiver device 40 is synchronized with the scrambler 104 of the transmitter device 30 to allow a frame to be transferred correctly between the devices.

More specifically, the receiver device 40 sets values corresponding to the state 154 or 155 at any point in time to, for example, the LFSR in the descrambler 108. The LFSR state (i.e., the value of each bit of the LFSR), which corresponds to the state of the descrambler 108 (i.e., the number of runs), is uniquely determined. The configuration of the LFSR will be specifically described later with reference to FIGS. 8A and 8B.

The transition to advance the state of the scrambler 104/descrambler 108 means advancing the state of the scrambler 104/descrambler 108 to the subsequent state. Advancing the state of the scrambler 104/descrambler 108 to the subsequent state is equivalent to the operation (run) of the scrambler 104/descrambler 108. When the state of the scrambler 104/descrambler 108 is caused to advance, for example, from the restored state 153 to a state 155 at any point in time after the restored state 153, the restored state 153 is first caused to transition to a subsequent state A, and the state A is further caused to transition to another subsequent state B. This transition is repeated to allow the state of the scrambler 104/descrambler 108 to transition to advance from the restored state 153 to the state 155 at any point in time. The transition of the scrambler 104/descrambler 108 to the subsequent state corresponds to the fact that the number of runs is incremented by one. Therefore, for example, the number of runs of the scrambler 104/descrambler 108 in the subsequent state A is one larger than the number of runs of the scrambler 104/descrambler 108 in the restored state 153.

The transition to retreat the state of the scrambler 104/descrambler 108 means retreating the state of the scrambler 104/descrambler 108 to a previous state. When the state of the scrambler 104/descrambler 108 is caused to transition to retreat, for example, from the restored state 153 to a state 154 at any point in time before the restored state 153, the restored state 153 is first caused to transition to a previous state C, and the state C is further caused to transition to another previous state D. This transition is repeated to allow the state of the scrambler 104/descrambler 108 to transition to retreat from the restored state 153 to the state 154 at any point in time. The transition of the scrambler 104/descrambler 108 to the previous state corresponds to the fact that the number of runs is decremented by one. Therefore, for example, the number of runs of the scrambler 104/descrambler 108 in the previous state C is one smaller than the number of runs of the scrambler 104/descrambler 108 in the restored state 153.

The receiver device 40 may also determine the scrambling data 156 to descramble the whole of the received frame 15, using at least one of the calculation to cause the scrambler 104/descrambler 108 to advance from the restored state 153 and the calculation to cause the scrambler 104/descrambler 108 to retreat therefrom. This determination means determining the scrambling data 156 by numerical calculation corresponding to at least one transition of the advance and retreat, not generating the scrambling data 156 by actually causing the scrambler 104/descrambler 108 to transition.

The receiver device 40 descrambler the received frame 15 using the determined scrambling data 156. Thus, the receiver device 40 may determine a frame 157 correctly descrambled (referred to as a restored frame hereinafter), using the value 151 of the defined value field and the defined expectation value 150 even when a reception error occurs in the received frame 15 descrambled by the descrambler 108, due to a loss of synchronization between the scrambler 104 and the descrambler 108.

A configuration to achieve the foregoing operations will be exemplified below.

FIG. 6 illustrates a configuration of a SAS Gen5 apparatus. The apparatus may operate as at least one of the initiator 10 and the target 20. As described above, when one of the initiator 10 and the target 20 operates as the transmitter device 30, the other operates as the receiver device 40. In the following, the SAS Gen5 apparatus will also be referred to as an initiator 10/target 20.

The initiator 10/target 20 includes a controller 100, a transmission frame controller 101, a CRC generator 102, a primitive generator 103, a scrambler 104, an FEC encoder 105, an FEC decoder 106, a primitive decoder 107, a descrambler 108, a CRC decoder 116, a received frame controller 109, and a restoration module 11.

The controller 100 controls the operations of various components in the initiator 10/target 20. The controller 100 controls each component in the initiator 10/target 20 to transmit a frame to another initiator 10/target 20 and controls each component in the initiator 10/target 20 to receive a frame from another initiator 10/target 20.

An operation of each component in the initiator 10/target 20 will be described below with respect to both cases where a frame is transmitted and a frame is received.

First, a case where the initiator 10/target 20 (i.e., as a transmitter device 30) transmits a frame to another initiator 10/target 20 (i.e., as a receiver device 40) will be described. In this case, the controller 100, the transmission frame controller 101, the CRC generator 102, the primitive generator 103, the scrambler 104, and the FEC encoder 105 operate.

The primitive generator 103 generates a primitive, a binary primitive or an extended binary primitive in response to a request (or a notification) from the controller 100 or the CRC generator 102. When the primitive generator 103 generates a primitive, it supplies the scrambler 104 with 130-bit information generated by adding a 2-bit header to the primitive. When the primitive generator 103 generates a binary primitive or an extended binary primitive, it supplies the scrambler 104 with the binary primitive or the extended binary primitive.

The transmission frame controller 101 controls a transmission of frame data included in a frame in response to a request from the controller 100. For example, the transmission frame controller 101 supplies the CRC generator 102 with frame data in units of 128 bits (i.e., 16 data bytes) that is a packet payload, and a 2-bit header.

The CRC generator 102 calculates a CRC value of the frame data included in the frame. The CRC generator 102 supplies the scrambler 104 with the frame data and/or the CRC value and the header in units of a packet. The CRC generator 102 calculates the CRC value using all items of frame data included in the frame, and then requests the primitive generator 103 to generate a B_EOFs (more specifically, B_EOF (0), B_EOF (1), B_EOF (2), or B_EOF (3)) primitive (which will be also referred to as B_EOFs below) or an EOAF primitive, and notifies the primitive generator 103 that the CRC value has been calculated. In response to the request or notification, the primitive generator 103 generates B_EOFs or EOAF.

More specifically, when the primitive generator 103 is requested to generate B_EOFs, it generates a B_EOF ($PAD) depending on the number of data dwords (which will be also referred to as the number of transmission data items) contained in the frame data in the frame to be transmitted. $PAD is a variable and is determined by the following equation (1).

$$\text{\$PAD}=4-(\text{the number of transmission data items mod 4}) \quad \text{Equation (1)}$$

The variable $PAD represents the number of pad dwords added to frame data in the frame to be transmitted such that the size of the frame data becomes a multiple of four dwords when the size of the frame data is not a multiple of four dwords. The added pad dwords are not used for the calculation of the CRC value. The primitive generator 103 thus generates B_EOF ($PAD) corresponding to the number of pad dwords added to the frame data such that the receiver device 40 can know the number.

When the scrambler 104 is supplied with a primitive, a binary primitive or an extended binary primitive, it advances to the subsequent state, that is, the number of operations (the number of runs) of the scrambler 104 is incremented by one. Note that the scrambler 104 does not scramble the primitive, the binary primitive, or the extended binary primitive. The scrambler 104 supplies the FEC encoder 105 with a primitive segment that includes the primitive, the binary primitive, or the extended binary primitive, which is a payload of the packet to be transmitted.

When the scrambler 104 receives the frame data and/or the CRC value, it scrambles the frame data and/or the CRC value to reduce uniformity of bits. The frame segment containing the scrambled frame data and/or CRC value is a payload of the packet to be transmitted. The payload is added with the 2-bit header. The scrambler 104 outputs the header and the payload to the FEC encoder 105. The scrambler 104 scrambles the frame data, and then advances to the subsequent state, in other words, the number of operations (the number of runs) of the scrambler 104 is incremented by one.

FIG. 7 illustrates a configuration of the scrambler 104. In order to minimize repeated patterns, the scrambler 104 performs an exclusive logical OR (XOR) operation 18 on the scrambling data generated by a pattern generator 17 with each bit of input data 161, thereby acquiring scrambled input data as output data 162. For example, each of the input data 161 and the output data 162 is 128-bit data, and the pattern generator 17 generates scrambling data that is a 128-bit pattern. The pattern generator 17 includes, for example, a linear feedback shift register (LFSR) 17A, and advances to the subsequent state (namely, the number of operations (the number of runs) increments by one) in response to a valid signal indicating that the operation (run) of the pattern generator 17 is validated. Note that the scrambler 104 scrambles the frame segment and does not scramble the primitive segment.

When PACKET_SYNC is transmitted, the scrambler 104 is initialized. That is, the pattern generator 17 is set to its initial state.

The LFSR 17A in the pattern generator 17 outputs a 1-bit value each time the LFSR 17A advances. The pattern generator 17 generates scrambling data using values of 128 bits that are continuously output from the LFSR 17A.

As illustrated in FIG. 8A, the LFSR 17A includes, for example, 23 flip-flop circuits (FFs) of bits 0 to 22 and five XOR operators.

The LFSR 17A performs the following operation in parallel each time the LFSR 17A advances.

(1) The value of each of bits 0, 2, 3, 5, 6, 8, 9, 10, 11, 12, 13, 14, 16, 17, 18, 19 and 21 is output to its one upper bit.
(2) The result of XOR operation on the value of bit 1 with the value of bit 22 is output to bit 2.
(3) The result of XOR operation on the value of bit 4 with the value of bit 22 is output to bit 5.
(4) The result of XOR operation on the value of bit 7 with the value of bit 22 is output to bit 8.
(5) The result of XOR operation on the value of bit 15 with the value of bit 22 is output to bit 16.
(6) The result of XOR operation of the value of bit 20 with the value of bit 22 is output to bit 21.
(7) The value of bit 22 is output to bit 0 and the outside.

The above operations are performed as a result of advancing the LFSR 17A to the subsequent state.

The values of 128 bits continuously output from the LFSR 17A to an outside are used as scrambling data to scramble the input frame data 161 of 128 bits. In other words, the XOR operation 18 is performed on the 128-bit values continuously output from the LFSR 17A with the 128-bit input frame data 161, thereby obtaining the 128-bit (i.e., four dwords) output frame data 162.

The LFSR 17A returns to the initial state when the values of $2^{23}-1$ bits have been output or PACKET_SYNC is transmitted.

The initialization of the scrambler 104 in accordance with the transmission of PACKET_SYNC means the initialization of the LFSR 17A. When the 128-bit input data 161 is scrambled with 128-bit scrambling data in a single scrambling operation of the scrambler 104, one state advance of the scrambler 104 (more specifically, pattern generator 17) corresponds to 128 times of state advance of the LFSR 17A. According to this relationship, on the basis of the state of the scrambler 104 (i.e., the number of runs), the corresponding state of the LFSR 17A (i.e., the value of each bit of the LFSR 17A) can be identified. Similarly, on the basis of the state of the LFSR 17A, the corresponding state of the scrambler 104 can be identified.

In the scrambler 104, the LFSR 17A may be implemented as a processor that performs numerical calculation using a generator polynomial. The output of the LFSR 17A may be calculated using, e.g., the following generator polynomial.

$$G(x)=x^{23}+x^{21}+x^{16}+x^8+x^5+x^2+1$$

Using this generator polynomial, the values of $2^{23}-1$ bits output from the LFSR 17A may be calculated.

In other words, the scrambler 104 can obtain the scrambling data calculated using the LFSR 17A and a state of the LFSR 17A, not only with the foregoing circuit configuration, but also as results of numerical calculation using the generator polynomial.

Return to FIG. 6. The FEC encoder 105 performs an FEC encoding process on the input information (here, the header and the payload) to add a 20-bit FEC code and thus generate 150-bit information. As described above, the FEC code includes codes for error detection and error correction. The FEC encoder 105 transmits a packet composed of the generated 150-bit information to another initiator 10/target 20 (i.e., receiver device 40).

The foregoing operation makes it possible to transmit a packet including a primitive or frame data to another initiator 10/target 20.

When the initiator 10/target 20 as a receiver device 40 receives a frame from another initiator 10/target 20 as a transmitter device 30, the controller 100, the FEC decoder 106, the primitive decoder 107, the descrambler 108, the CRC decoder 116, the received frame controller 109, and the restoration module 11 operate.

The FEC decoder 106 performs an FEC decode process on information in units of 150 bits (i.e., a packet) received from another initiator 10/target 20 thereby to generate 130-bit information. The 130-bit information includes a 2-bit header and a 128-bit payload. The FEC decode process includes processes for error detection and error correction using an FEC code. The FEC decoder 106 may notify the controller, etc., of success or failure of the decoding. When the FEC decoder 106 succeeds in the decoding, it outputs the 130-bit information to the primitive decoder 107, the descrambler 108, and the restoration module 11.

When the input information includes a primitive segment (a primitive, a binary primitive or an extended binary primitive) as a payload thereof, the primitive decoder 107 acquires 128-bit information (primitive) for which a 2-bit header is removed from the input information.

The primitive decoder 107 identifies the primitive, the binary primitive or the extended binary primitive included in the input information, and performs an operation corresponding to the primitive, the binary primitive or the extended binary primitive in association with the controller 100 and the like.

When the input information contains PACKET_SYNC, the primitive decoder 107 notifies the descrambler 108 that the PACKET_SYNC has been received.

When the input information contains B_EOFs or EOAF, the primitive decoder 107 requests the CRC decoder 116 to verify CRC.

When the input information contains a primitive segment (specifically, a primitive, a binary primitive or an extended binary primitive) as a payload thereof, the descrambler 108 advances to the subsequent state. Note that the descrambler 108 does not descramble the primitive segment.

When the input information includes a frame segment (specifically, frame data and/or CRC value) as a payload thereof, the descrambler 108 descrambles the payload. The descrambler 108 outputs the descrambled frame segment to the CRC decoder 116. After descrambling the frame segment, the descrambler 108 advances to the subsequent state.

The descrambler 108 has a configuration similar to that of the scrambler 104 described above with reference to FIGS. 7, 8A and 8B. In other words, the descrambler 108 performs an exclusive logical OR (XOR) operation 18 on the scrambling data generated by the pattern generator 17 with bits of the input data 161 thereby acquiring the scrambled input data 161 as output data 162. In contrast, when an XOR operation is performed on the scrambling data with the bits of the output data 162, the input data 161 can be acquired. In other words, when the input data 161 scrambled with the scrambling data is further scrambled (namely, descrambled) with the same scrambling data, it returns to the input data 161 which has not been scrambled.

When the primitive decoder 107 notifies the descrambler 108 that PACKET_SYNC has been received, the descrambler 108 (more specifically the pattern generator 17) is initialized. In other words, the LFSR 17A in the descrambler 108 returns to the initial state. The initialization of the descrambler 108 specifically means the initialization of the LFSR 17A in the descrambler 108.

The CRC decoder 116 determines whether a CRC error occurs in the received frame, using the CRC value and the frame data in the received frame that are descrambled. When the primitive decoder 107 notifies the CRC decoder 116 that B_EOFs or EOAF has been received, for example, the CRC decoder 116 determines whether a CRC error occurs in the frame.

When the state of the scrambler 104 that is scrambling frame data coincides with the state of the descrambler 108 that is descrambling the frame data, that is, when the scrambler 104 is synchronized with the descrambler 108, the descrambler 108 correctly descrambles the frame data and the CRC value. When the frame data and the CRC value are correctly descrambled, no CRC error due to a loss of synchronization between the scrambler 104 and the descrambler 108 is detected from the received frame.

On the other hand, when the state of the scrambler 104 that is scrambling frame data does not coincide with the state of the descrambler 108 that is descrambling the frame data, that is, when the scrambler 104 is not synchronized with the descrambler 108, the descrambler 108 incorrectly descrambles the frame data and the CRC value. When the frame data and the CRC value are incorrectly descrambled, the CRC decoder 116 detects that a CRC error occurs in the received frame.

When no CRC error occurs, the CRC decoder 116 outputs the descrambled frame data to the received frame controller 109. In this case, the received frame controller 109 processes the input frame data (i.e., descrambled frame data) in association with the controller 100, for example. When the initiator 10/target 20, which is, for example, a storage device, receives a frame including user data, a process for storing the user data in the storage device may be performed.

When the frame is, for example, an IDENTIFY address frame, the controller 100 may control each part of the initiator 10/target 20 to transmit packets that include frame data to form its own IDENTIFY address frame by using the above-described operation to transmit a packet. When the frame is an OPEN address frame for a connection request, the controller 100 may control each part of the initiator 10/target 20 to transmit a packet that includes an OPEN_ACCEPT primitive indicating acceptance of the connection request or that includes an OPEN_REJECT primitive indicating rejection of the connection request. When the frame is an SSP frame, the controller 100 may control each part of the initiator 10/target 20 to transmit a packet that includes an ACK primitive indicating acknowledgement by using the above-described operation to transmit a packet.

On the other hand, when a CRC error occurs in the received frame 15 descrambled by the descrambler 108, that is, when a CRC error occurs in the descrambled received frame 15 due to a loss of synchronization between the descrambler 108 in the receiver device 40 and the scrambler 104 in the transmitter device 30, the CRC decoder 116 determines whether a CRC error occurs in the frame 157 restored from the received frame 15 by the restoration module 11. The restoration module 11 acquires the restored frame 157 by descrambling the received frame 15 with, not the scrambling data generated by the descrambler 108 but the scrambling data 156 calculated using the value 151 of the defined value field in the received frame 15 and the defined expectation value 150. The CRC decoder 116 determines whether a CRC error occurs in the restored frame 157, using the CRC value and the frame data in the restored frame 157. The configuration of the restoration module 11 to generate the restored frame 157 will specifically be described below.

The restoration module 11 has the function for synchronizing the descrambler 108 of the initiator 10/target 20 with the scrambler 104 of another initiator 10/target 20 that has transmitted the received frame 15 and the function for correctly descrambling the received frame 15, using the frame data 151 corresponding to the defined value field in the received frame 15 and the defined expectation value 150. The restoration module 11 includes a restoration controller 110, a frame buffer 11A, XOR operators 111 and 115, an LFSR restoration unit 112, an LFSR calculation unit 113, and an LFSR roll-back unit 114.

The restoration controller 110 stores information received from the FEC decoder 106 from the instant when it has received information including SOF or SOAF to the instant when it receives information including B_EOFs or EOAF. The restoration controller 110 controls storing information in the frame buffer 11A using, for example, a buffer flag. The restoration controller 110 sets a buffer flag in response to the reception of information including SOF or SOAF and clears the buffer flag in response to the reception of information including B_EOFs or EOAF. Then, while the buffer flag is set, the received frame 15 input from the FEC decoder 106 is stored in the frame buffer 11A.

Therefore, for example, the received frame 15 received between SOF and B_EOFs (e.g., SSP frame) is stored in the frame buffer 11A. Alternatively, for example, the received frame 15 received between SOAF and EOAF (e.g., IDENTIFY address frame or OPEN address frame) is stored in the frame buffer 11A.

The restoration controller 110 identifies which of an IDENTIFY address frame, an OPEN address frame and an SSP frame is the information stored in the frame buffer 11A. More specifically, the restoration controller 110 determines that the information stored in the frame buffer 11A after receiving SOF is an SSP frame. The restoration controller 110 determines that the information stored in the frame buffer 11A after receiving SOAF is an OPEN address frame when an IDENTIFY address frame has been exchanged, and determines that the information is an IDENTIFY address frame when an IDENTIFY address frame has not been exchanged.

In accordance with the identified received frame 15, the restoration controller 110 recognizes the defined value field in the frame 15 and acquires the defined expectation value 150 corresponding to the defined value field. As described above, the defined value field is, for example, a field in which it is defined in advance that a specific value is set, or a field in which a value known by the receiver device 40, such as a SAS address of the receiver device 40, is set. The restoration module 11 may have, for example, information indicating a defined value field and a defined expectation value 150 for each type of frame.

When the frame data 151 corresponding to the defined value field is stored in the frame buffer 11A, the XOR operator 111 performs an XOR operation on the frame data 151 with the defined expectation value 150 thereby calculating the scrambling data 152 used in the generation of the frame data 151.

At a point in time when the XOR operator 111 performs the XOR operation, at least the frame data corresponding to the defined value field in the received frame 15 has only to be stored in the frame buffer 11A.

The LFSR restoration unit 112 calculates a state (namely, the restored state) 153 of the LFSR at a point in time when the scrambling data 152 is generated, using the scrambling data 152. The LFSR restoration unit 112 calculates a value of each bit of LFSR at a point in time when the LFSR operates to generate values forming the scrambling data 152. As described above with reference to FIG. 8A, the value of bit 22 of the LFSR is output to the outside and is used to form the scrambling data 152. Therefore, each of the values that form the scrambling data 152 is a value set for bit 22 at a certain point in time. Furthermore, the value set for bit 22 is a value set for bit 21 in the preceding LFSR state. It is thus possible to calculate a value set for each bit of the LFSR at a point in time when values forming the scrambling data 152 starts to be generated, on the basis of the operations (1) to (7) of the LFSR 17A described above with reference to FIG. 8A. A more specific calculation method will be described later with reference to FIG. 11.

The LFSR calculation unit 113 may calculate a state 154 or 155 of the LFSR at any point in time by causing the LFSR state to advance from the restored state 153 or to retreat therefrom. The LFSR calculation unit 113 calculates, for example, the LFSR state at a point in time when a primitive or frame data is received after the frame data 151 corresponding to the defined value field.

More specifically, the LFSR calculation unit 113 determines the number of times the LFSR should be advanced or retreated in order to cause the restored state 153 to transition to the state 154 or 155 at any point in time, on the basis of the size of the received frame 15 and the location of the defined value field in the received frame 15. In other words, the LFSR calculation unit 113 determines the number of bits needed to advance or retreat the LFSR in order to cause the restored state 153 to transition to the state 154 or 153 at any point in time. On the basis of the determined number of times (or the number of bits), the LFSR calculation unit 113 calculates the state 154 or 155 of the LFSR at any point in time by calculation to advance from the restored state 153 or by calculation to retreat therefrom. In the following, it is assumed that the LFSR calculation unit 113 calculates an LFSR state at a point in time when a packet including B_EOFs or EOAF immediately after the received frame 15 is received, or at a point in time when a packet immediately after the packet including B_EOFs or EOAF is received.

The LFSR 17A described above with reference to FIG. 8A is an LFSR the state of which advances. One operation of the LFSR 17A allows its state to advance, that is, to transition to the subsequent state. The LFSR calculation unit 113 calculates the state 154 at any point in time, to which the state advances from the restored state 153, using a numerical calculation to cause the state of the LFSR 17A to advance any number of times.

In contrast, FIG. 8B illustrates an LFSR 17B the state of which transitions to retreat in the direction opposite to the foregoing state transition of the LFSR 17A. In the LFSR 17B, the following operations are performed in parallel for each state transition.

(1) Each value of bits 22, 20, 19, 18, 17, 15, 14, 13, 12, 11, 10, 9, 7, 6, 4, 3 and 1 is output to its one lower bit.

(2) The result of XOR operation on the value of bit 21 with the value of bit 0 is output to bit 20.

(3) The result of XOR operation on the value of bit 16 with the value of bit 0 is output to bit 15.

(4) The result of XOR operation on the value of bit 8 with the value of bit 0 is output to bit 7.

(5) The result of XOR operation on the value of bit 5 with the value of bit 0 is output to bit 4.

(6) The result of XOR operation on the value of bit 2 with the value of bit 0 is output to bit 1.

(7) The value of bit 0 is output to bit 22.

(8) The value of bit 22 is output to the outside.

One operation of the LFSR 17B allows its state to retreat, that is, to transition to the previous state. The LFSR calculation unit 113 calculates the state 155 at any point in time, to which the state retreats from the restored state 153, using a numerical calculation to cause the state of the LFSR 17B to retreat any number of times.

The above LFSR 17B may be implemented as a processor that makes a numerical calculation using a generator polynomial. In other words, the scrambling data calculated using the LFSR 17B and the state of the LFSR 17B may be not only calculated in the configuration such as the foregoing circuit, but also obtained as a result of the numerical calculation using a generator polynomial.

Return to FIG. 6. The LFSR roll-back unit 114 calculates the scrambling data 156 to descramble the received frame 15. The LFSR roll-back unit 114 may calculate the scrambling data 156 to descramble the whole of the received frame 15, using at least one of the calculation to cause the state to advance from the restored state 153 and the calculation to cause the state to retreat therefrom.

Assume the case where the LFSR calculation unit 113 calculates the state 154 of the LFSR at the time of reception of B_EOFs/EOAF immediately after the received frame 15. In that case, the LFSR roll-back unit 114 calculates the scrambling data 156 to descramble the whole of the received frame 15, using the calculation to cause the state to retreat from the calculated state 154 of the LFSR.

The XOR operator 115 descrambles the received frame 15 stored in the frame buffer 11A, using the calculated scrambling data 156. Thus, the restored frame 157, which is the descrambled received frame, is generated.

With the above configuration, the restoration module 11 can acquire the restored frame 157 and the state of the LFSR at a point in time when the receiver device 40 receives a packet including B_EOFs or EOAF immediately after the received frame 15 or a packet immediately after the packet including B_EOFs or EOAF, using the value 151 of the defined value field in the received frame 15 and the defined expectation value 150.

When a CRC error occurs in the received frame 15 descrambled by the descrambler 108, that is, when a CRC error occurs in the descrambled received frame 15 due to a loss of synchronization between the descrambler 108 and the scrambler 104 in the transmitter device 30, the CRC decoder 116 determines whether a CRC error occurs in the restored frame 157 obtained by the descramble in the restoration module 11. As described above, the restored frame 157 is a frame obtained by descrambling the received frame 15 with, not the scrambling data generated in the descrambler 108, but the scrambling data 156 calculated using the value 151 of the defined value field in the received frame 15 and the defined expectation value 150. The CRC decoder 116 determines whether a CRC error occurs in the restored frame 157 using a CRC value and frame data in the restored frame 157.

The CRC decoder 116 outputs frame data included in the restored frame 157 to the received frame controller 109 when no CRC error occurs in the restored frame 157. The received frame controller 109 processes the input frame data (i.e., descrambled frame data) in association with the controller 100 and the like, as in the case where the frame data descrambled by the descrambler 108 is output to the received frame controller 109.

In addition, the controller 100 synchronizes the descrambler 108 with the scrambler 104 of another initiator 10/target 20 that has transmitted the received frame 15. More specifically, the controller 100 sets the state of the LFSR 17A in the descrambler 108 to the state at a point in time when a packet including B_EOFs or EOAF immediately after the received frame 15 is received, or at a time when a packet immediately after the packet including B_EOFs or EOAF is received. The state is calculated by the LFSR calculation unit 113.

Thus, the correctly descrambled restored frame 157 can be calculated even when a reception error (e.g., CRC error) due to a loss of synchronization between the scrambler 104 and the descrambler 108 occurs in the received frame 15 descrambled by the descrambler 108. Since, furthermore, the descrambler 108 of the initiator 10/target 20 on the reception side can be synchronized with the scrambler 104 of the initiator 10/target 20 on the transmission side, frames received thereafter can be descrambled correctly.

When a CRC error occurs in the restored frame 157, the CRC decoder 116 may discard the frame and notify the received frame controller 109 that the CRC error occurs. When the frame is, for example, an SSP frame, the received frame controller 109 controls each part of the initiator 10/target 20 in association with the controller 100 and the like to transmit an SPL packet including a NAK (CRC ERROR) primitive indicating that a CRC error has occurred, using the above-described operation to transmit an SPL packet. When the frame is, for example, an IDENTIFY address frame or an OPEN address frame, the received frame controller 109 does not respond at all.

In the initiator 10/target 20 according to the present embodiment, when a CRC error occurs in the received frame 15 descrambled by the descrambler 108 and when no CRC error occurs in the restored frame 157 obtained by descrambling the received frame 15 by the restoration module 11, the descrambled received frame 15 is replaced with the restored frame 157. Also, the descrambler 108 of the initiator 10/target 20 on the reception side can be synchronized with the scrambler 104 of the initiator 10/target 20 on the transmission side.

Below is a specific description of each of the cases where the receiver device 40 that is one of the initiator 10/target 20 receives an IDENTIFY address frame, an OPEN address frame and an SSP frame, respectively, from the transmitter device 30 that is another one of initiator 10/target 20.

FIG. 9 illustrates an example of a format of an IDENTIFY address frame. The IDENTIFY address frame has a size of 32 bytes.

As illustrated in FIG. 9, bytes 23 to 27 of the IDENTIFY address frame correspond to a Reserved field with a size of 5 bytes (=40 bits). The Reserved field consists of bits 0 to 39.

The SAS Gen 5 standard defines that each of the bits in the Reserved field should be set to zero. In other words, a defined expectation value is in the Reserved field. Thus, at least contiguous N bits of bits 0 to 39 in the Reserved field may be used as a defined value field. When a 23-bit LFSR 17A is used, N is equal to 23.

Figure 10:
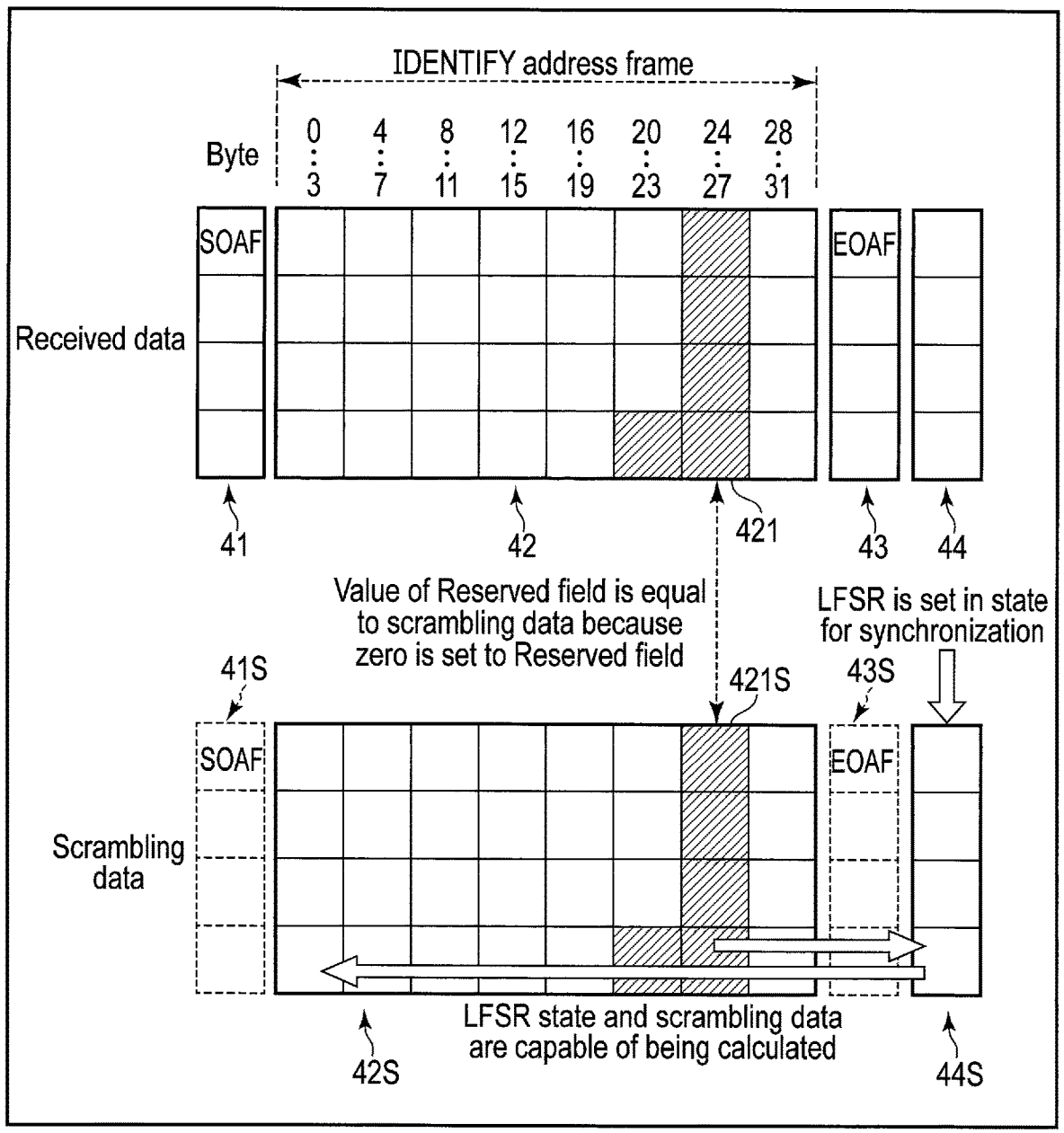
FIG. 10 illustrates an example where an LFSR state and scrambling data are calculated using a defined value field in the IDENTIFY address frame by the apparatus of the embodiment.

An example of calculating the LFSR state and the scrambling data using a defined value field in the IDENTIFY address frame will be described with reference to FIG. 10.

After receiving a primitive segment 41 that includes SOAF indicating the start of a frame from the transmitter device 30, the receiver device 40 receives frame segments 42 that form the IDENTIFY address frame. The frame buffer 11A stores frame data at least from the beginning of the IDENTIFY address frame to the Reserved field that is a defined value field, namely, stores frame data from bytes 0 to 27 of the IDENTIFY address frame.

As described above, the SAS Gen 5 standard defines that the bits in the Reserved field, which are to be scrambled, should be set to zero. Thus, the scrambled value of the Reserved field obtained by performing an XOR operation on a value of the Reserved field is equal to the scrambling data.

The receiver device 40 thus calculates the stored value 421 of the Reserved field in the IDENTIFY address frame (i.e., the values from bytes 23 to 27) as scrambling data 421S used for the generation of the value 421. The Reserved field has a size of 40 bits (=5 bytes). Thus, when the LFSR 17A is composed of 23 bits, contiguous 23 bits of the 40 bits may be calculated as the scrambling data 421S.

On the basis of the scrambling data 421S corresponding to the Reserved field (i.e., defined value field), the receiver device 40 can calculate (restore) an LFSR state at a point in time when the scrambling data 421S is generated. The LFSR state is, for example, represented by the value of each of the bits forming the LFSR. Hereinafter, the LFSR state at a point in time when the scrambling data 421S corresponding to the defined value field is calculated will also be referred to as the restored LFSR state. FIG. 11 illustrates an example of a function rstr_curr_lfsr (input [22:00] in) for numerical calculation to restore the corresponding state of the LFSR, using the 23-bit scrambling data 421S. As an argument of this function, the 23-bit scrambling data 421S is used. Thus, arguments in[00] to in[22] represent the values of bits 0 to 22 of the scrambling data 421S, respectively. The symbol "^" in FIG. 11 represents an XOR operation.

In FIG. 11, rstr_curr_lfsr[00] to rstr_curr_lfsr[22] respectively represent the values of bits 0 to 22 of the LFSR to be restored. As illustrated in FIG. 11, rstr_curr_lfsr[00] to rstr_curr_lfsr[22] are calculated using arguments in[00] to in[22].

For example, the value of rstr_curr_lfsr[22] is equal to the value of in[00]. The value of rstr_curr_lfsr[21] is equal to the value of in[01]. The value of rstr_curr_lfsr[20] is a result of an XOR operation on the value of in[00] with the value of in[02].

Similarly, as illustrated in FIG. 11, rstr_curr_lfsr[00] to rstr_curr_lfsr[22] are calculated using the values of arguments in[00] to in[22] or the XOR operation using the values of arguments in[00] to in[22].

Return to FIG. 10. The receiver device 40 may calculate an LFSR state at any point in time, using calculation to cause the restored LFSR state (e.g., rstr_curr_lfsr[00] to rstr_curr_lfsr[22] in FIG. 11) to advance or calculation to cause the restored LFSR state to retreat. For example, the receiver device 40 may calculate an LFSR state at a point in time when a frame segment of the frame segments 42 that form the IDENTIFY address frame is received, an LFSR state at a point in time when the primitive segment 43 that includes EOAF indicating the completion of transmission of the IDENTIFY address frame is received, an LFSR state at a point in time when the segment 44 subsequent to the primitive segment 43 including the EOAF is received, and the like.

The receiver device 40 may also calculate a state to synchronize the LFSR in the descrambler 108 of the receiver device 40 with the LFSR in the scrambler 104 of the transmitter device 30 as an LFSR state at any point in time (hereinafter also referred to as a state for synchronization). For example, an LFSR state at a point in time when the primitive segment 43, which includes EOAF indicating the completion of transmission of the IDENTIFY address frame, is received or an LFSR state at a point in time when the segment 44 subsequent to the primitive segment 43 including the EOAF is received, is used as the state for synchronization.

FIG. 12 illustrates an example of a function calc_next_lfsr (input [22:00] in) for numerical calculation to calculate a state for synchronization indicating an LFSR state at a point in time when the primitive segment 43 including EOAF is received, in a case where 23 bits of bits 9 to 31 in the Reserved field that corresponds to bytes 24 to 26 of the IDENTIFY address frame, are used as a defined value field.

As arguments "in" of the function, the values of 23 bits that indicate the restored LFSR state are used. Thus, arguments in[00] to in[22] respectively represent the values of bits 0 to 22 indicating the restored LFSR state. The symbol "^" in the FIG. 12 represents an XOR operation.

In FIG. 12, calc_next_lfsr[00] to calc_next_lfsr[22] respectively represent the values of bits 0 to 22 of the LFSR to be restored. As illustrated in FIG. 12, calc_next_lfsr[00] to calc_next_lfsr[22] are calculated using arguments in[00] to in[22].

For example, the value of calc_next_lfsr[00] is a result of XOR operations on in[00], in[03], in[07], in[09], in[10], in[11], in[12], in[13], in[14], in[15], in[16], in[18], in[20], in[21] and in[22].

Similarly, as illustrated in FIG. 12, calc_next_lfsr[00] to calc_next_lfsr[22] may be calculated by XOR operations using the values of arguments in[00] to in[22].

Return to FIG. 10. The receiver device 40 may also calculate scrambling data 42S to descramble all the frame segments 42 that form the IDENTIFY address frame. To descramble 32-byte IDENTIFY address frame (frame segments 42), 256-bit (=32-byte) scrambling data 42S is to be calculated.

The receiver device 40 calculates the scrambling data 42S using calculation to cause an LFSR state at a point in time when the segment 44, which is subsequent to the primitive segment 43 including, for example, EOAF is received, to retreat to a state at a point in time when a segment at the beginning of the IDENTIFY address frame is received.

Alternatively, the receiver device 40 may calculate the scrambling data 42S using, for example, calculation to cause an LFSR state at a point in time when the primitive segment 43 including EOAF (e.g., calc_next_lfsr[00] to calc_next_lfsr[22] in FIG. 12) is received to retreat to a state at a point in time when a segment at the beginning of the IDENTIFY address frame is received.

FIGS. 13 to 18 illustrate an example of a function roll_back_lfsr (input [22:00] in) to calculate 256-bit scrambling data 42S by numerical calculation in a process of causing an LFSR state at a point in time when the primitive segment 43 including EOAF is received to retreat to a state at a point in time when a segment at the beginning of the IDENTIFY address frame is received.

As arguments "in" of the function, the values of 23 bits that indicate the LFSR state for synchronization (here, the LFSR state at a point in time when the primitive segment 43 including EOAF is received) is used. Thus, arguments in[00] to in[22] respectively represent the values of bits 0 to 22 indicating the LFSR state for synchronization. The symbol "^" in FIGS. 13 to 18 represents an XOR operation.

In FIGS. 13 to 18, roll_back_lfsr[000] to roll_back_lfsr[255] respectively represent the values of bits 0 to 255 of the scrambling data 42S to be calculated. As illustrated in FIGS. 13 to 18, roll_back_lfsr[000] to roll_back_lfsr[255] are calculated using arguments in[00] to in[22].

For example, the value of roll_back_lfsr[000] is equal to the value of in[00]. The value of roll_back_lfsr[001] is equal to the value of in[01]. The value of roll_back_lfsr[002] is a result of an XOR operation on the value of in[00] with the value of in[02].

Similarly, as illustrated in FIGS. 13 to 18, roll_back_lfsr[000] to roll_back_lfsr[255] are calculated using the values of arguments in[00] to in[22] or one or more XOR operations using the values of arguments in[00] to in[22].

The receiver device 40 performs an XOR operation on frame segments 42, which are received from the transmitter device 30 and are stored in the frame buffer 11A, with the calculated scrambling data 42S (e.g., roll_back_lfsr[000] to roll_back_lfsr[255] in FIGS. 13 to 18) thereby descrambling the frame segments 42.

Then, the receiver device 40 verifies CRC of the descrambled frame segments 42. When no CRC error occurs, the receiver device 40 can use the descrambled frame segments 42 as the IDENTIFY address frame that is received from the transmitter device 30 and then descrambled. In contrast, when a CRC error occurs in the frame segments descrambled by the descrambler 108, the frame segments with the CRC error can be replaced with the frame segments 42 descrambled using the scrambling data 42S.

When no CRC error occurs in the replaced descrambled frame segments 42, the descrambler 108 of the receiver device 40 can be synchronized with the scrambler 104 of the transmitter device 30 by setting the LFSR 17A in the descrambler 108 in, for example, a state for synchronization indicating a state at a point in time when the subsequent segment 44 is received.

As is seen from the above, even though a CRC error occurs when the received IDENTIFY address frame is descrambled by the descrambler 108, the received frame can correctly be descrambled and the descrambler 108 of the receiver device 40 can be synchronized with the scrambler 104 of the transmitter device 30, using the value of the defined value field in the frame and the corresponding defined expectation value.

FIG. 19 illustrates an example of a format of an OPEN address frame. The OPEN address frame has a size of 32 bytes.

As illustrated in FIG. 19, bytes 4 to 11 of the OPEN address frame correspond to a DESTINATION SAS ADDRESS field with a size of 8 bytes (=64 bits). The DESTINATION SAS ADDRESS field includes values of bits 0 to 63.

In the DESTINATION SAS ADDRESS field, a SAS address of the receiver device 40 that receives the frame is set. In the receiver device 40, its own SAS address is known and thus a defined value for the receiver device 40 is set in the DESTINATION SAS ADDRESS field. Accordingly, at least contiguous N bits in the DESTINATION SAS ADDRESS field may be used as a defined value field. When the 23-bit LFSR 17A is used, N is equal to 23.

Bytes 25 to 27 of the OPEN address frame correspond to a MORE COMPATIBLE FEATURES field with a size of 3 bytes (=24 bits). The MORE COMPATIBLE FEATURES field includes values of bits 0 to 24.

The SAS Gen 5 standard defines that each of the bits in the MORE COMPATIBLE FEATURES field should be set to zero. In other words, a defined value is set in the MORE COMPATIBLE FEATURES field. Thus, at least contiguous 23 bits in the MORE COMPATIBLE FEATURES field may be used as a defined value field.

Figure 20:
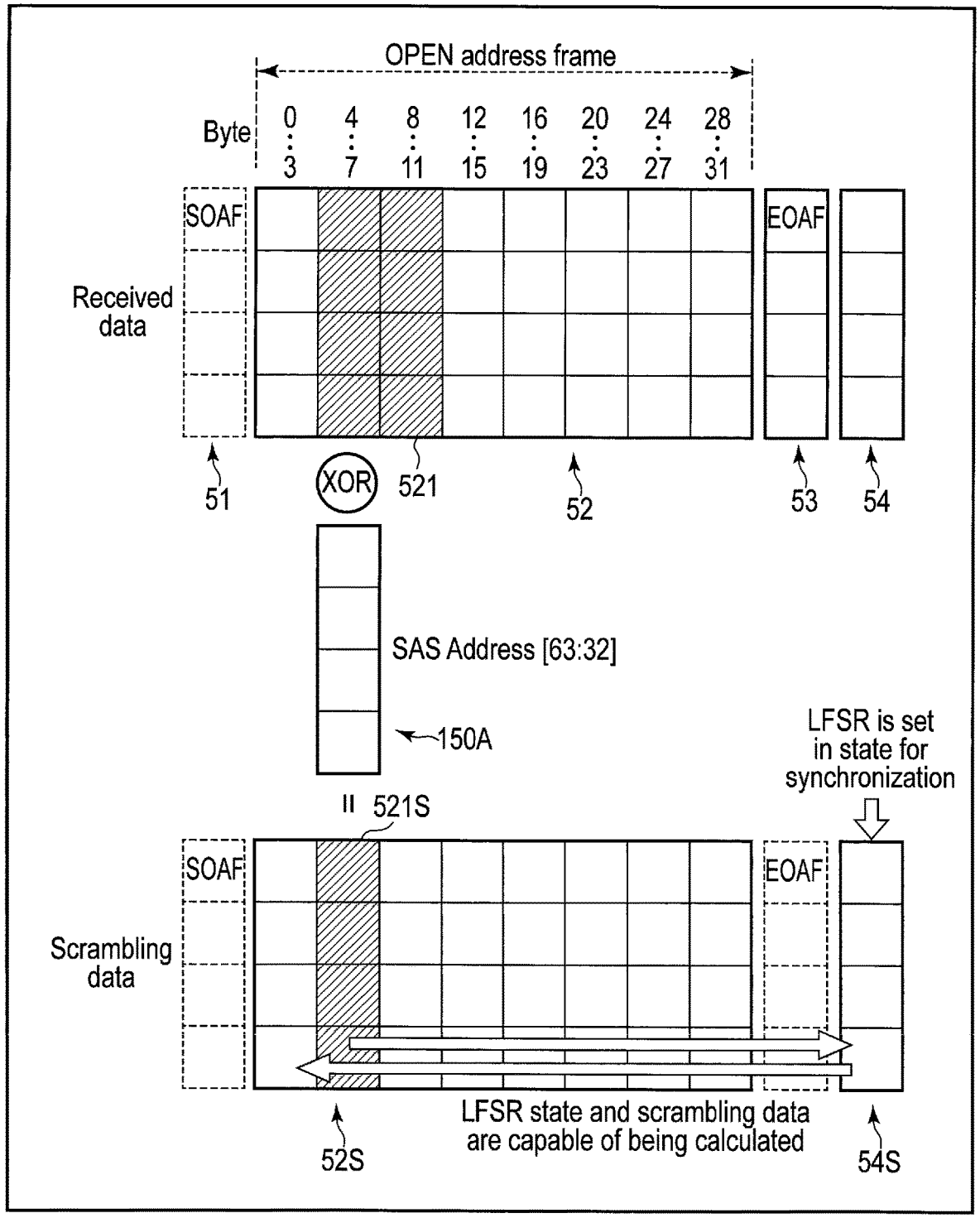
FIG. 20 illustrates an example where an LFSR state and scrambling data are calculated using a defined value field in the OPEN address frame by the apparatus of the embodiment.

An example of calculating the LFSR state and the scrambling data using a defined value field in the OPEN address frame will be described with reference to FIG. 20.

After receiving a primitive segment 51 that includes SOAF indicating the start of a frame from the transmitter device 30, the receiver device 40 receives frame segments 52 that form the OPEN address frame. The frame buffer 11A stores frame data at least from the beginning of the OPEN address frame to the DESTINATION SAS ADDRESS field that is a defined value field, for example, frame data from bytes 0 to 11 of the OPEN address frame.

Note that the frame buffer 11A may store frame data from the beginning of the OPEN address frame to a frame segment including at least contiguous 23 bits in the DESTINATION SAS ADDRESS field. In this case, the frame buffer 11A stores frame data from bytes 0 to 7 of the OPEN address frame.

The receiver device 40 performs an XOR operation on the value (here, the value of bytes 4 to 7) 521 of the DESTINATION SAS ADDRESS field in the stored OPEN address frame with the value 150A of bits 32 to 63 of the SAS address (hereinafter referred to as SAS address [63:32]) of the receiver device 40 as the defined expectation value 150. Thus, the scrambling data 521S used in the generation of the value 521 of the DESTINATION SAS ADDRESS field is calculated. The value of the DESTINATION SAS Address field and the SAS address [63:32] 150A have a size of 32 bits (=4 bytes). Thus, when the LFSR 17A is composed of 23 bits, at least contiguous 23 bits thereof may be used for the XOR operation.

On the basis of the scrambling data 521S, the receiver device 40 may calculate an LFSR state at a point in time when the scrambling data 521S is calculated. The LFSR state is represented by, for example, the values of bits to form the LFSR.

The receiver device 40 may calculate an LFSR state at any point in time using calculation to cause the calculated LFSR state to advance or calculation to cause the calculated LFSR state to retreat. For example, the receiver device 40 may calculate an LFSR state at a point in time when a frame segment of the frame segments 52, which form the OPEN address frame, is received, an LFSR state at a point in time when the primitive segment 53, which includes EOAF indicating the completion of transmission of the frame, is received, an LFSR state at a point in time when the segment 54 subsequent to the primitive segment 53 including the EOAF is received, or the like.

The receiver device 40 may further calculate a state for synchronization to synchronize the LFSR in the descrambler 108 of the receiver device 40 with the LFSR in the scrambler 104 of the transmitter device 30 as an LFSR state at any point in time. For example, an LFSR state at a point in time when the primitive segment 53, which includes EOAF indicating the completion of transmission of the OPEN address frame, is received, or an LFSR state at a point in time when the segment 54 subsequent to the primitive segment 53 including the EOAF is received, is used as the state for synchronization.

Furthermore, the receiver device 40 may calculate the scrambling data 52S to descramble the frame segments 52 that form the OPEN address frame. The receiver device 40 calculates the scrambling data 52S using calculation to cause, for example, an LFSR state at a point in time when the segment 54 subsequent to the primitive segment 53 including EOAF is received, to retreat to a state at a point in time when a segment at the beginning of the OPEN address frame is received.

The receiver device 40 performs an XOR operation on the frame segments 52, which is received from the transmitter device 30 and then stored in the frame buffer 11A, with the calculated scrambling data 52S thereby descrambling the frame segments 52.

Then, the receiver device 40 verifies CRC of the descrambled frame segments 52. When no CRC error occurs, the receiver device 40 can use the descrambled frame segments 52 as the OPEN address frame that is received from the transmitter device 30 and then descrambled. In contrast, when a CRC error occurs in the frame segments descrambled by the descrambler 108, the frame segments with the CRC error can be replaced with the frame segments 52 descrambled using the scrambling data 52S.

When no CRC error occurs in the replaced descrambled frame segments 52, the descrambler 108 of the receiver device 40 can be synchronized with the scrambler 104 of the transmitter device 30 by setting the LFSR 17A of the descrambler 108 in, for example, a state for synchronization indicating an LFSR state at a point in time when the subsequent segment 54 is received.

Figure 21:
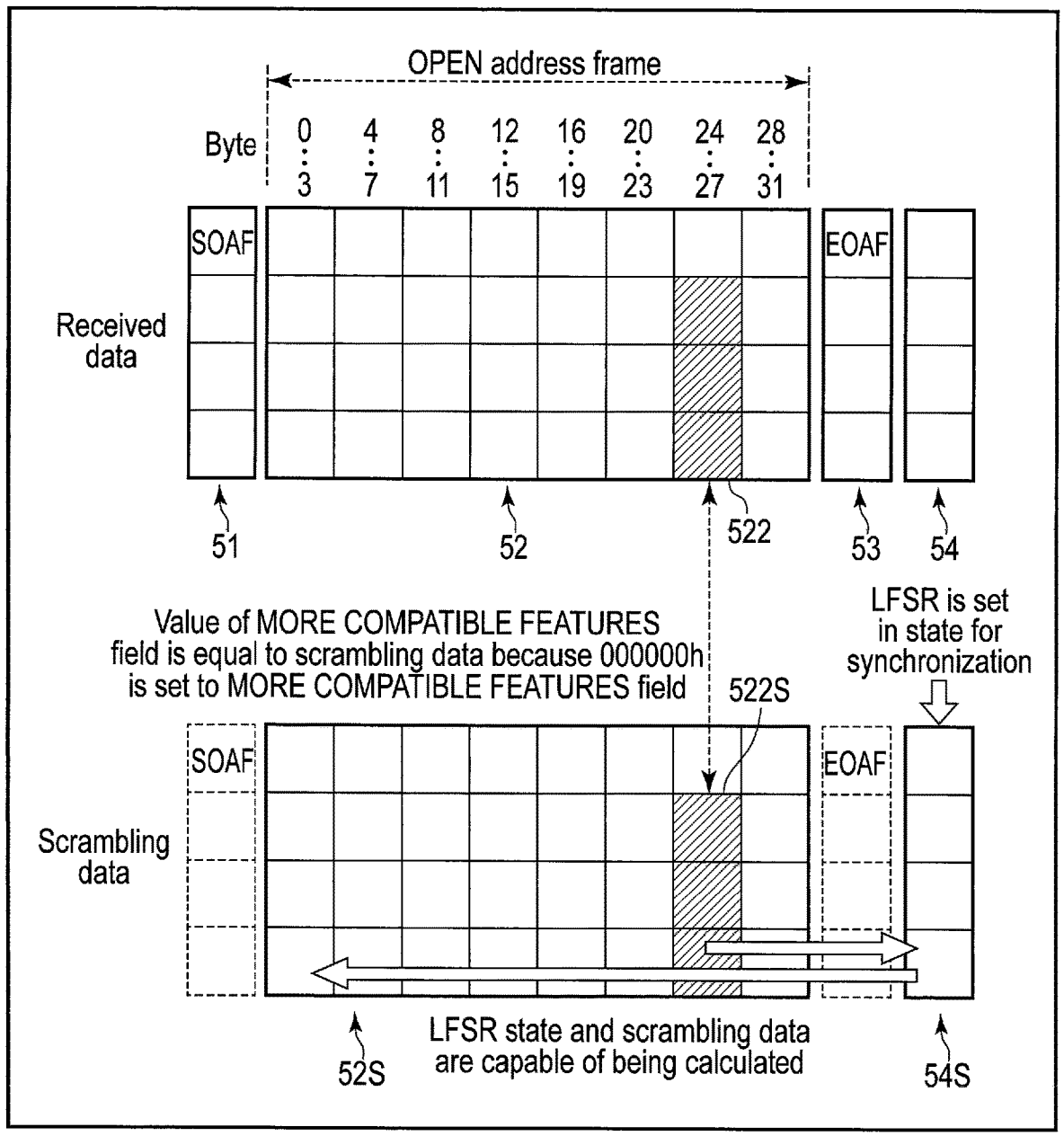
FIG. 21 illustrates another example where an LFSR state and scrambling data are calculated using a defined value field in the OPEN address frame by the apparatus of the embodiment.

FIG. 21 illustrates an example where the LFSR state and scrambling data are calculated using a MORE COMPATIBLE FEATURES field in the OPEN address frame.

After receiving a primitive segment 51 that includes SOAF indicating the start of a frame from the transmitter device 30, the receiver device 40 receives frame segments 52 that form the OPEN address frame. The frame buffer 11A stores frame data at least from the beginning of the OPEN address frame to the MORE COMPATIBLE FEATURES field, which is a defined value field, that is, frame data of bytes 0 to 27 of the OPEN address frame.

As described above, the SAS Gen 5 standard defines that each of the bits in the MORE COMPATIBLE FEATURES field should be set to zero. Thus, the scrambled value of the MORE COMPATIBLE FEATURES field obtained by performing an XOR operation on a value of the MORE COMPATIBLE FEATURES field to be scrambled with scrambling data is equal to the scrambling data.

The receiver device 40 thus calculates the stored value 522 of the MORE COMPATIBLE FEATURES field in the OPEN address frame (i.e., the values of bytes 25 to 27) as scrambling data 522S used for the generation of the value 522. The MORE COMPATIBLE FEATURES field has a size of 24 bits (=3 bytes). Thus, when the LFSR 17A is composed of 23 bits, contiguous 23 bits of the 24 bits may be calculated as the scrambling data 522S.

On the basis of the scrambling data 522S, the receiver device 40 may calculate an LFSR state at a point in time when the scrambling data 522S is calculated. The LFSR state is represented by, for example, a value of each of the bits that form the LFSR.

The receiver device 40 may calculate an LFSR state at any point in time, using calculation to cause the calculated LFSR state to advance or calculation to cause the calculated LFSR state to retreat. For example, the receiver device 40 may calculate an LFSR state at a point in time when a frame segment of the frame segments 52, which form the OPEN address frame, is received, an LFSR state at a point in time when the primitive segment 53, which includes EOAF indicating the completion of transmission of the OPEN address frame, is received, an LFSR state at a point in time when the segment 54 subsequent to the primitive segment 53 including the EOAF is received, or the like.

The receiver device 40 may further calculate a state for synchronization to synchronize the LFSR in the descrambler 108 of the receiver device 40 with the LFSR in the scrambler 104 of the transmitter device 30 as an LFSR state at any point in time. For example, an LFSR state at a point in time when the primitive segment 53, which includes EOAF indicating the completion of transmission of the OPEN address frame, is received, or an LFSR state at a point in time when the segment 54 subsequent to the primitive segment 53 including the EOAF is received, is used as the state for synchronization.

Furthermore, the receiver device 40 may calculate the scrambling data 52S to descramble the frame segments 52 to form the OPEN address frame. The receiver device 40 calculates the scrambling data 52S using calculation to cause, for example, an LFSR state at a point in time when the segment 54 subsequent to the primitive segment 53 that includes EOAF is received, to retreat to a state at a point in time when a segment at the beginning of the OPEN address frame is received.

The receiver device 40 performs an XOR operation on frame segments 52, which are received from the transmitter device 30 and then stored in the frame buffer 11A, with the calculated scrambling data 52S thereby descrambling the frame segments 52.

The receiver device 40 verifies the CRC of the descrambled frame segments 52. When no CRC error occurs, the receiver device 40 can use the descrambled frame segments 52 as an OPEN address frame that is received from the transmitter device 30 and then descrambled. In contrast, when a CRC error occurs in the frame segments descrambled by the descrambler 108, the descrambled frame segments with the CRC error may be replaced with the frame segments 52 descrambled using the scrambling data 52S.

Furthermore, when no CRC error occurs in the replaced descrambled frame segments 52, the descrambler 108 of the receiver device 40 may be synchronized with the scrambler 104 of the transmitter device 30 by setting the LFSR 17A of the descrambler 108 in, for example, a state for synchronization indicating an LFSR state at a point in time when a subsequent segment 44 is received.

As is seen from the above, even though a CRC error occurs when the received OPEN address frame is descrambled by the descrambler 108, the frame can correctly be descrambled and the descrambler 108 of the receiver device 40 can be synchronized with the scrambler 104 of the transmitter device 30, using a value of the defined value field in the frame and a corresponding defined expectation value.

The procedures of a transmission control process, a reception control process and a restoration process for an address frame, which are executed by the initiator 10/target 20 will be described with reference to flowcharts illustrated in FIGS. 22 to 27. Like in the foregoing descriptions, in the following descriptions, the initiator 10/target 20 on the transmission side will be referred to as a transmitter device 30 and the initiator 10/target 20 on the reception side will be referred to as a receiver device 40.

Figure 22:
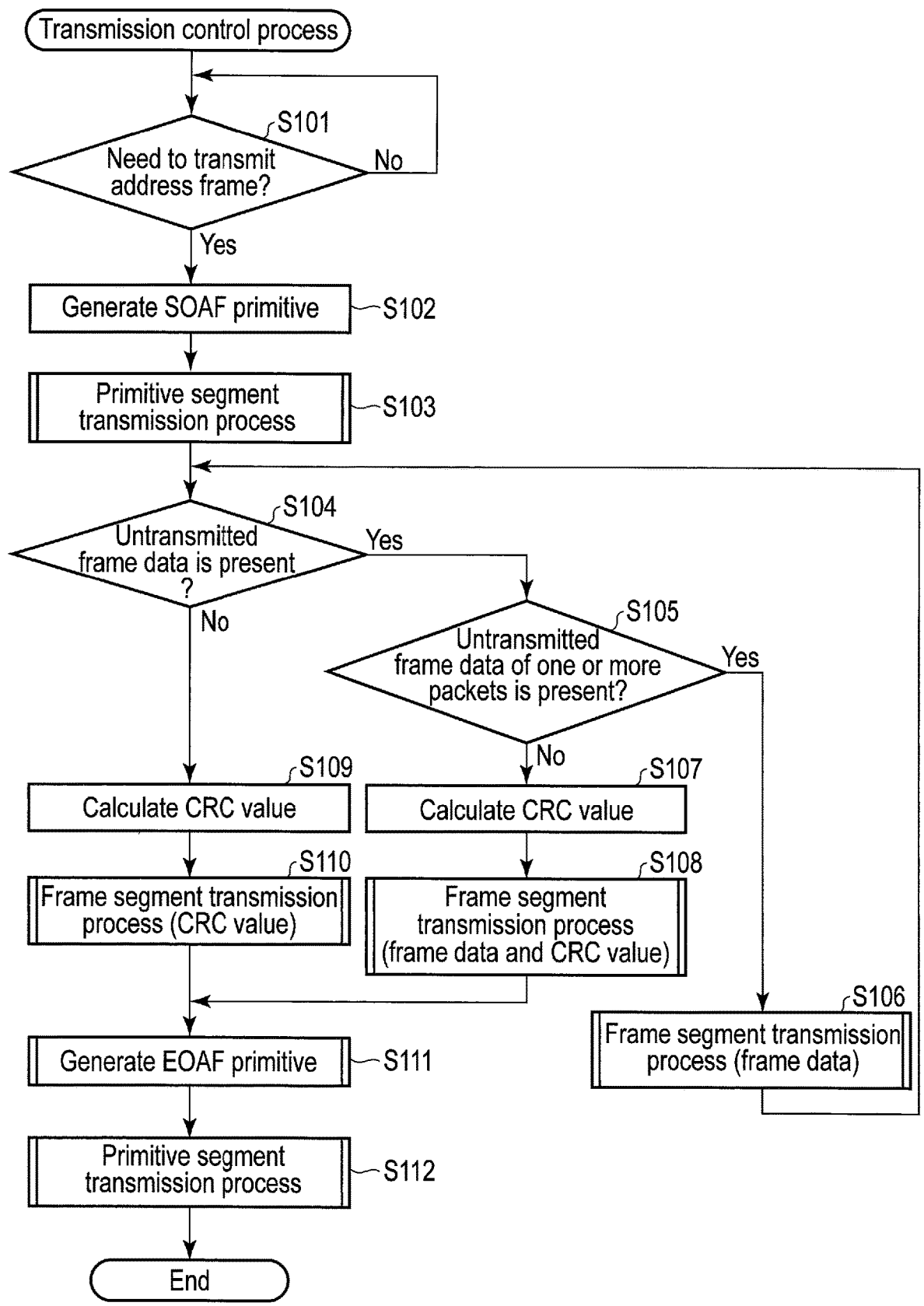
FIG. 22 is a flowchart illustrating an example of the procedure of a transmission control process of an address frame executed by the apparatus of the embodiment.

The flowchart of FIG. 22 illustrates an example of the procedure of the transmission control process for an address frame executed by the transmitter device 30.

First, the transmitter device 30 determines whether it needs to transmit an address frame to the receiver device 40 (step S101). When the transmitter device 30 need not transmit an address frame (NO in step S101), it returns to step S101 and determines again whether it needs to transmit an address frame to the receiver device 40. In this case, the transmitter device 30 may transmit, for example, a packet including an idle dword segment to the receiver device 40.

When the transmitter device 30 needs to transmit an address frame (YES in step S101), it generates SOAF (step S102) and executes a primitive segment transmission process to transmit a packet that includes the SOAF to the receiver device 40 (step S103). The primitive segment transmission process will be described later with reference to the flowchart of FIG. 23.

Then, the transmitter device 30 determines whether there is untransmitted frame data that forms the address frame (step S104). When there is untransmitted frame data (YES in step S104), the transmitter device 30 determines whether there is untransmitted frame data of one or more packets (step S105). When there is untransmitted frame data of one or more packets (YES in step S105), the transmitter device 30 executes a frame segment transmission process to transmit a packet that includes a frame segment composed of the untransmitted frame data of one packet, to the receiver device 40 (step S106) and returns to step S104. The frame segment transmission process will be described later with reference to the flowchart of FIG. 24.

When there is no untransmitted frame data of one or more packets (NO in step S105), the transmitter device 30 calculates a CRC value of the frame data that forms the address frame (step S107). Then, the transmitter device 30 executes a frame segment transmission process to transmit a packet that includes a frame segment composed of the untransmitted frame data and the calculated CRC value, to the receiver device 40 (step S108).

When there is no untransmitted frame data (NO in step S104), that is, for example, when all items of frame data that form the address frame have been transmitted to the receiver device 40, the transmitter device 30 calculates a CRC value of the frame data that forms the address frame (step S109). Then, the transmitter device 30 executes a frame segment transmission process to transmit a packet that includes a frame segment composed of the calculated CRC value, to the receiver device 40 (step S110).

After the CRC value and all the items of frame data that form the address frame are transmitted to the receiver device 40 in units of a packet (after step S108 or step S110), the transmitter device 30 generates EOAF indicating the completion of transmission of the address frame (step S111) and executes a primitive segment transmission process to transmit a packet that includes the EOAF to the receiver device 40 (step S112). Then, the transmitter device 30 ends the process.

Figure 23:
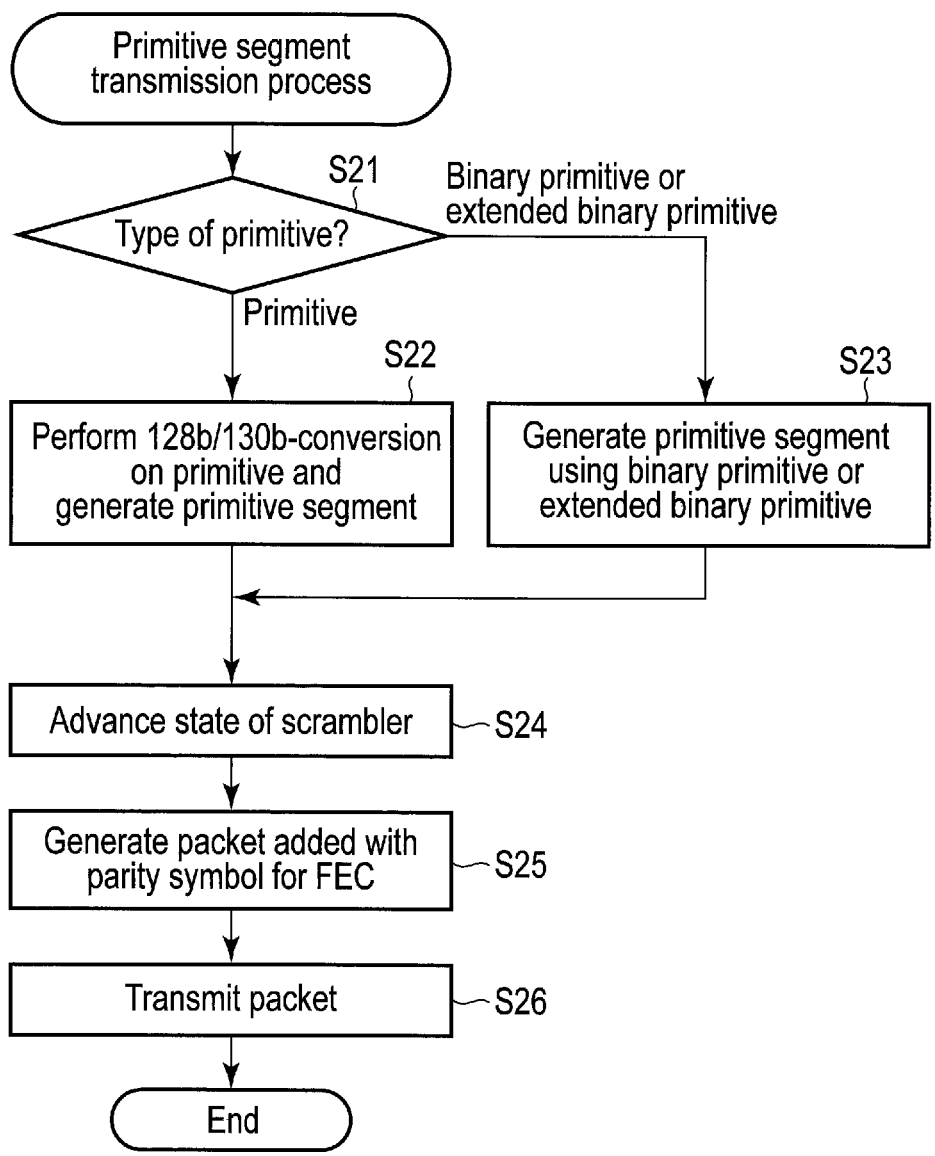
FIG. 23 is a flowchart illustrating an example of the procedure of a transmission control process of a primitive segment executed by the apparatus of the embodiment.

The flowchart of FIG. 23 illustrates an example of the procedure of the primitive segment transmission process executed by the transmitter device 30.

First, the process in the transmitter device 30 branches according to a type of a primitive to be transmitted (step S21). When a primitive is to be transmitted (primitive in step S21), the transmitter device 30 performs a 128b130b-conversion on the primitive and generates a primitive segment (step S22). On the other hand, when a binary primitive or an extended binary primitive is to be transmitted (binary primitive or extended binary primitive in step S21), the transmitter device 30 generates a primitive segment using the binary primitive or the extended binary primitive (step S23).

The transmitter device 30 then advances the state of the scrambler 104 to a subsequent state (step S24).

That is, the transmitter device 30 increments the number of operations (the number of runs) of the scrambler 104 by one.

The transmitter device 30 generates a packet added with parity symbols for FEC (step S25) and transmits the packet to the receiver device 40 (step 26).

The foregoing procedure enables to transmit a packet including a primitive, a binary primitive or an extended binary primitive. The scrambler 104 does not scramble the primitive, binary primitive, or extended binary primitive, but advances to the subsequent state.

When a primitive to be transmitted is PACKET_SYNC, the scrambler 104 is initialized, for example, after step S24. With this initialization, the LFSR 17A in the scrambler 104 returns to the initial state.

Figure 24:
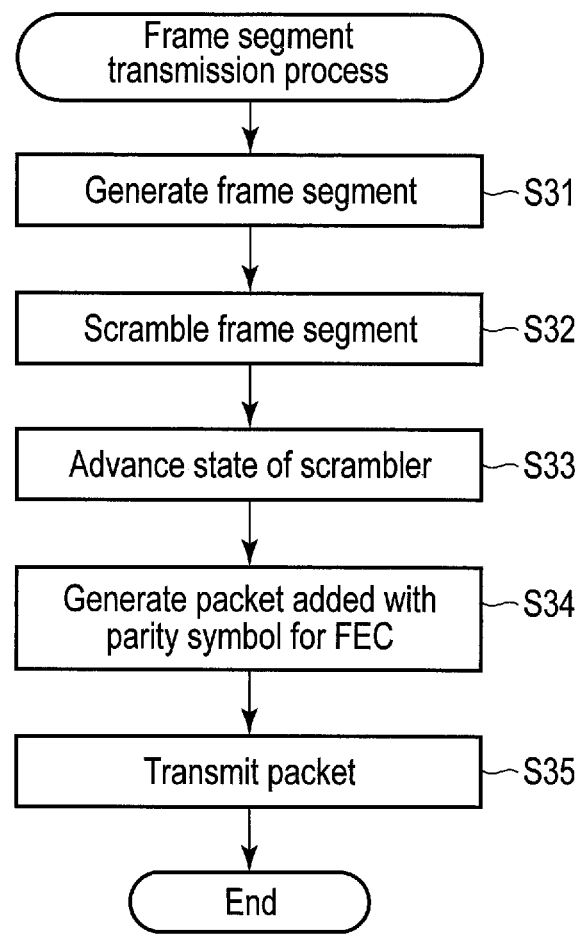
FIG. 24 is a flowchart illustrating an example of the procedure of a transmission control process of a frame segment executed by the apparatus of the embodiment.

The flowchart of FIG. 24 illustrates an example of the procedure of the frame segment transmission process executed by the transmitter device 30.

First, the transmitter device 30 generates a frame segment that includes at least one of frame data and a CRC value to be transmitted (step S31). The transmitter device 30 scrambles the frame segment with the scrambler 104 (step S32). The transmitter device 30 advances the state of the scrambler 104 to a subsequent state (step S33).

The transmitter device 30 then generates a packet added with parity symbols for FEC (step S34), and transmits the packet to the receiver device 40 (step S35).

The above procedure enables to transmit a packet that includes at least one of frame data and a CRC value. The scrambler 104 scrambles the frame data and the CRC value, and advances to the subsequent state.

Figure 25:
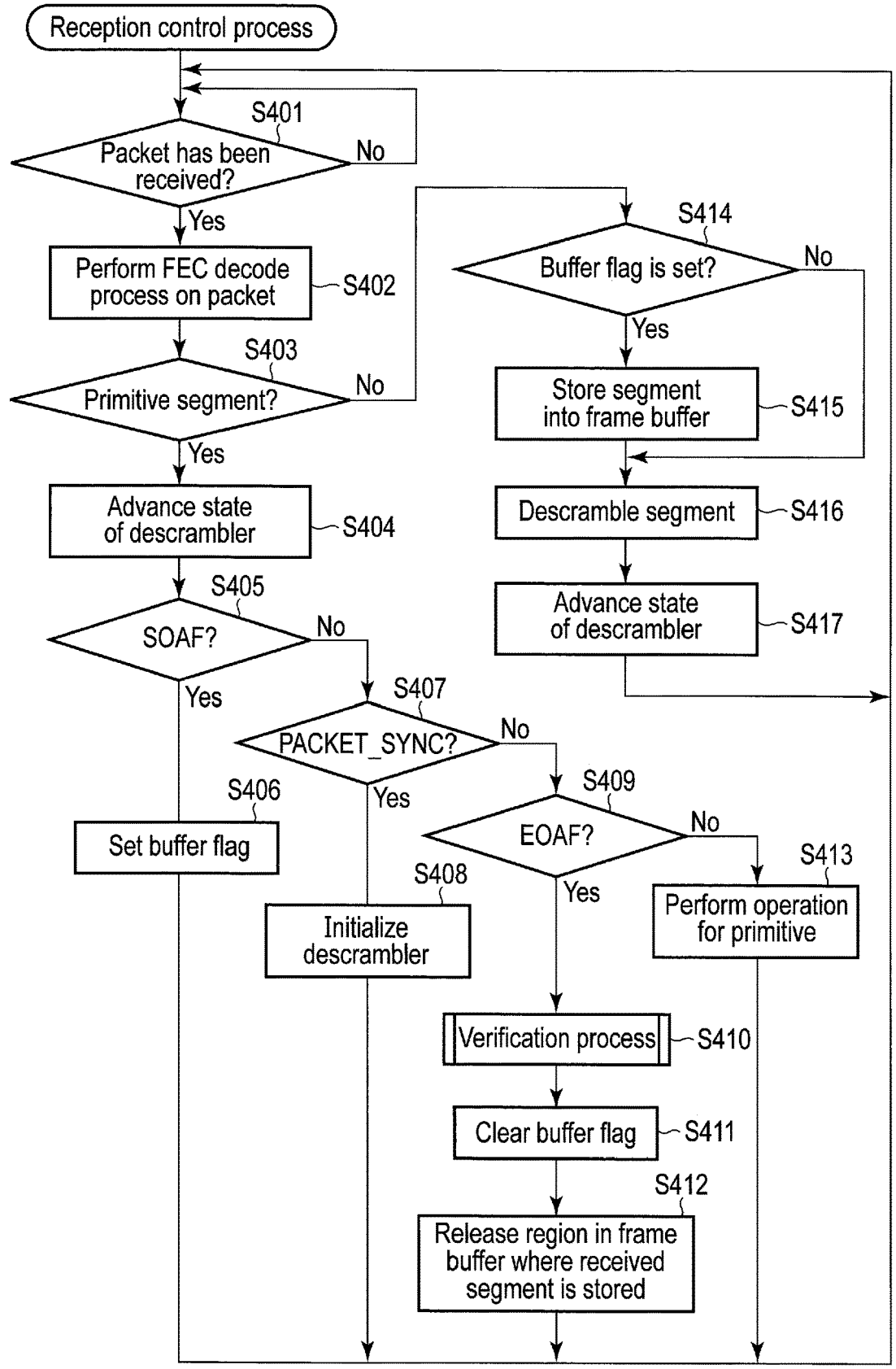
FIG. 25 is a flowchart illustrating an example of the procedure of a reception control process of an address frame executed by the apparatus of the embodiment.

The flowchart of FIG. 25 illustrates an example of the procedure of the reception control process for an address frame executed by the receiver device 40.

First, the receiver device 40 determines whether it has received a packet from the transmitter device 30 (step S401). When the receiver device 40 has not received a packet (NO in step S401), it returns to step S401 and determines again whether it has received a packet.

When the receiver device 40 has received a packet (YES in step S401), it performs an FEC decode process on the packet (step S402). The FEC decode process includes determination as to whether an error occurs, determination of an error location, correction of the error, and notification of success or failure of decoding to a state machine SP_PS in the receiver device 40. When the FEC decode process succeeds, the receiver device 40 determines whether a segment in the decoded packet is a primitive segment (step S403).

When the segment in the packet is a primitive segment (YES in step S403), the receiver device 40 advances the state of the descrambler 108 to a subsequent state (step S404).

The receiver device 40 then determines whether the primitive segment includes SOAF indicating the start of transmission of an address frame (step S405). When the primitive segment includes SOAF (YES in step S405), the receiver device 40 sets a buffer flag (step S406) and returns to step S401. The buffer flag indicates whether received segments are to be stored in the frame buffer 11A. Segments other than the primitive segment received while this buffer flag is set are stored in the frame buffer 11A.

When the primitive segment does not include SOAF (NO in step S405), the receiver device 40 determines whether the primitive segment includes PACKET_SYNC (step S407). When the primitive segment includes PACKET_SYNC (YES in step S407), the receiver device 40 initializes the descrambler 108 (step S408) and returns to step S401. With this initialization, the LFSR 17A in the descrambler 108 returns to its initial state.

When the primitive segment does not include PACKET_SYNC (NO in step S407), the receiver device 40 determines whether the primitive segment includes EOAF indicating the completion of transmission of the address frame (step S409). When the primitive segment includes EOAF (YES in step S409), the receiver device 40 performs a verification process to verify the received frame 15 and replace, if necessary, the received frame 15 with the restored frame 157 (step S410). The receiver device 40 clears the buffer flag (step S411). Then, the receiver device 40 releases a region in the frame buffer 11A that stores the received segments (step S412), and returns to step S401. The verification process will be described later with reference to the flowchart of FIG. 27.

When the primitive segment does not include EOAF (NO in step S409), the receiver device 40 performs an operation for a primitive included in the primitive segment (step S413) and returns to step S401.

When the segment in the packet is not a primitive segment (NO in step S403), the receiver device 40 determines whether a buffer flag is set (step S414). A segment that is not a primitive segment is either an idle dword segment or a scrambled idle segment. When a buffer flag is set (YES in step S414), the receiver device 40 stores the segment into the frame buffer 11A (step S415). The segments stored in the frame buffer 11A are received from when a packet including SOAF is received until when a packet including EOAF is received. The segments stored in the frame buffer 11A are used in a restoration process to set the LFSR 17A in a state at any point in time and descramble the received frame 15 correctly. The restoration process will be described later with reference to the flowchart of FIG. 26. When the buffer flag is cleared (NO in step S414), step S415 is skipped.

The receiver device 40 descrambles the segment with the descrambler 108 (step S416). The receiver device 40 then advances the state of the descrambler 108 to a subsequent state (step S417), that is, it increments the number of operations (the number of runs) of the descrambler 108 by one, and returns to step S401.

Figure 26:
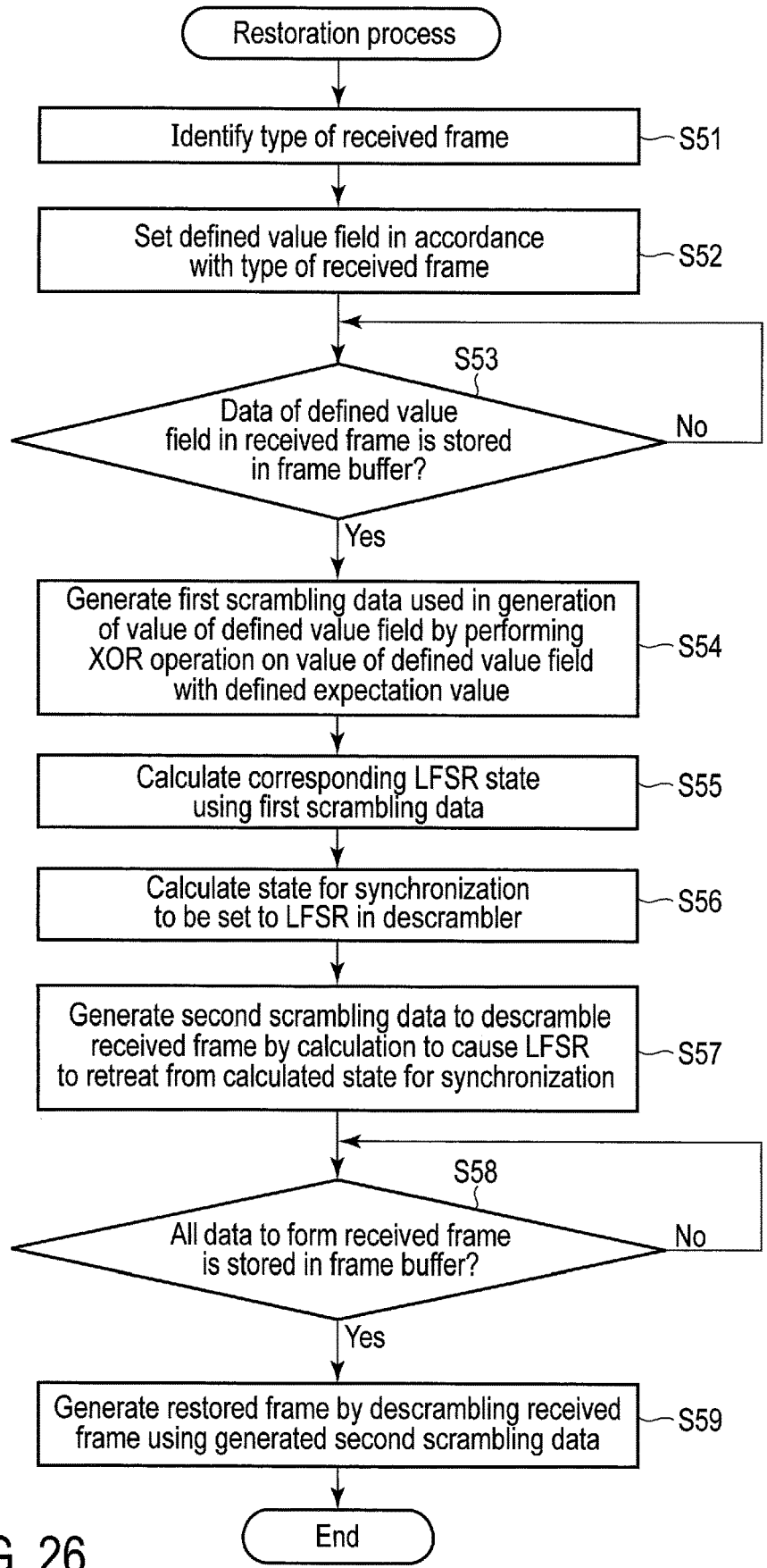
FIG. 26 is a flowchart illustrating an example of the procedure of a restoration process executed by the apparatus of the embodiment.

The flowchart of FIG. 26 illustrates an example of the procedure of the restoration process executed by the receiver device 40. This restoration process may be executed in parallel with the above-described reception control process.

First, the receiver device 40 identifies a type of the address frame being received (step S51). The receiver device 40 determines, for example, information stored in the frame buffer 11A after SOAF is received, as an OPEN address frame in a case where an IDENTIFY address frame has been exchanged, and determines the information as an IDENTIFY address frame in a case where an IDENTIFY address frame has not been exchanged.

In accordance with the identified type of the address frame, the receiver device 40 sets a defined value field in the frame (step S52). As described above, the defined value field depends on the type of the address frame being received. When the frame is an IDENTIFY address frame, the receiver device 40 sets at least 23 bits in the Reserved field of bytes 23 to 27 in the frame as a defined value field. When the frame is an OPEN address frame, the receiver device 40 sets at least 23 bits in the DESTINATION SAS ADDRESS field of bytes 4 to 11 in the frame or at least 23 bits in the MORE COMPATIBLE FEATURES field of bytes 25 to 27 in the frame as a defined value field.

The receiver device 40 then determines whether the value 151 of the set defined value field has been stored in the frame buffer 11A (step S53). When the value 151 has not been stored (NO in step S53), the receiver device 40 returns to step S53 and determines again whether the value 151 has been stored.

When the value 151 has been stored (YES in step S53), the receiver device 40 performs an XOR operation on the stored value 151 with the defined expectation value 150, which is to be set in the defined value field before scrambling, thereby calculating first scrambling data 152 used in generation of the value 151 (step S54). Then, the receiver device 40 calculates a corresponding state of the LFSR using the first scrambling data 152 (step S55).

The receiver device 40 then calculates a state for synchronization to be set to the LFSR 17A in the descrambler 108 in order to synchronize the LFSR 17A in the descrambler 108 with the LFSR 17A in the scrambler 104 of the transmitter device 30 (step S56). The receiver device 40 determines, for example, a packet to be descrambled next by the descrambler 108 and calculates, as the state for synchronization, an LFSR state to correctly descramble a segment in the packet. The packet to be descrambled next by the descrambler 108 is, for example, a packet that includes EOAF subsequent to the address frame being received or a packet subsequent to the packet that includes the EOAF.

The receiver device 40 generates second scrambling data 156 to descramble the address frame being received, by using calculation to retreat the LFSR from the calculated state for synchronization (step S57). The second scrambling data 156 is, for example, a 256-bit pattern to restore the 32-byte address frame, as illustrated in FIGS. 13 to 18.

The receiver device 40 then determines whether all items of frame data that form the address frame being received have been stored in the frame buffer 11A (step S58). When all the items of frame data have not been stored in the frame buffer 11A (NO in step S58), the receiver device 40 returns to step S58.

When all the items of frame data have been stored in the frame buffer 11A (YES in step S58), the receiver device 40 generates the restored frame 157 by descrambling the stored frame data of the received frame 15 using the second scrambling data 156 (step S59).

Therefore, the restored frame 157 can be acquired by descrambling the frame data in the received frame 15, not using the scrambling data generated by the descrambler 108 (specifically, LFSR 17A) according to the number of operations performed from a point in time when the descrambler 108 is initialized upon receipt of PACKET_SYNC, but using the second scrambling data 156 calculated using the value 151 of the defined value field in the received frame 15 and its corresponding defined expectation value 150.

Figure 27:
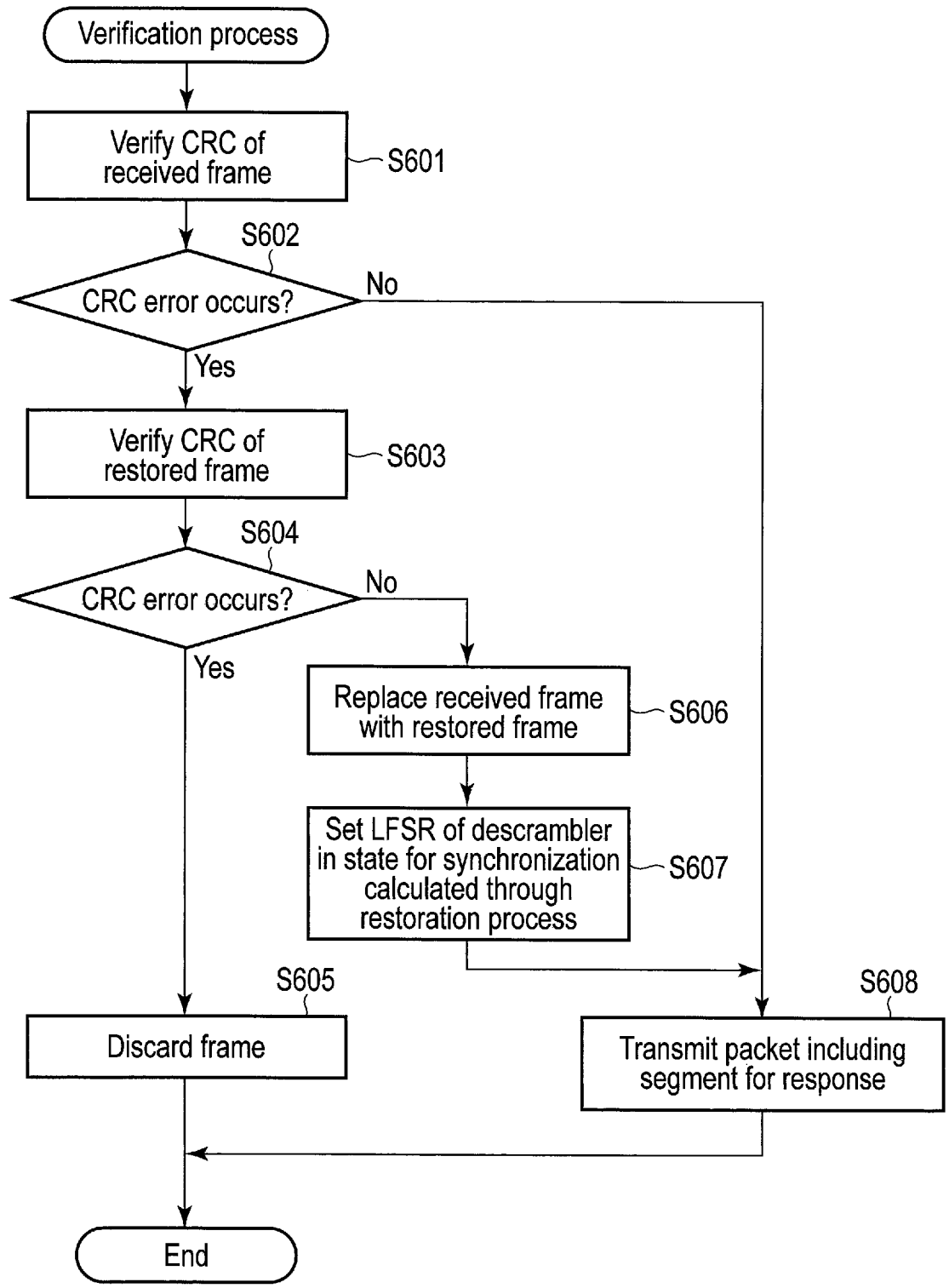
FIG. 27 is a flowchart illustrating an example of the procedure of a verification process of an address frame executed by the apparatus of the embodiment.

The flowchart of FIG. 27 illustrates an example of the procedure of the verification process for an address frame executed by the receiver device 40. As described above with reference to the flowchart of FIG. 25, the verification process is executed, for example, in accordance with the reception of EOAF indicating the completion of transmission of the address frame. Assume here that the restoration process is completed prior to the start of the verification process.

First, the receiver device 40 verifies the CRC of the received frame 15 that is composed of segments descrambled by the descrambler 108 (step S601) and determines whether a CRC error occurs in the received frame 15 (step S602).

When no CRC error occurs in the received frame 15 (NO in step S602), the receiver device 40 generates at least one of a frame segment and a primitive segment for response to the received frame 15 and transmits a packet that includes the generated segment to the transmitter device 30 (step S608). When the received frame is, for example, an OPEN address frame for a connection request, a packet that includes an OPEN_ACCEPT primitive for accepting the connection request or an OPEN_REJECT primitive for rejecting the connection request is transmitted. When the received frame is an IDENTIFY address frame, packets that include an SOAF primitive, frame segments to form an IDENTIFY address frame, and an EOAF primitive are transmitted in order to transmit the IDENTIFY address frame for response. In this transmission, the primitive segment transmission process and the frame segment transmission process described above with reference to FIGS. 23 and 24 may be executed.

On the other hand, when the CRC error occurs in the received frame 15 (YES in step S602), the receiver device 40 verifies the CRC of the restored frame 157 that is generated in the restoration process (step S603) and determines whether a CRC error occurs in the restored frame 157 (step S604).

When the CRC error occurs in the restored frame 157 (YES in step S604), the receiver device 40 discards the received frame 15 and the restored frame 157 (step S605) and makes no response to the transmitter device 30. That is, when CRC errors occur in both of the received frame 15 and recovered frame 157, these frames are discarded.

On the other hand, when no CRC error occurs in the restored frame 157 (NO in step S604), the receiver device 40 replaces the received frame 15 with the restored frame 157 (step S606). That is, the received frame 15 in which a CRC error occurs is discarded, and the restored frame 157 is processed as a frame received from the transmitter device 30. The receiver device 40 sets the LFSR 17A in the descrambler 108 in a state for synchronization calculated through the restoration process (step S607). In accordance with the restored frame 157, the receiver device 40 generates at least one of a frame segment and a primitive segment for response and transmits a packet that includes the generated segment to the transmitter device 30 (step S608).

With the foregoing process, in the receiver device 40, even though a CRC error occurs when the descrambler 108 descrambles the received address frame, the frame can correctly be descrambled and the descrambler 108 of the receiver device 40 can be synchronized with the scrambler 104 of the transmitter device 30, by using a value of a defined value field in the frame and a corresponding defined expectation value.

FIG. 28 illustrates an example of a format of an SSP frame. The SSP frame may have any size.

As illustrated in FIG. 28, the SSP frame includes a HASHED DESTINATION SAS ADDRESS field having a size of 3 bytes (=24 bits) from bytes 1 to 3. Values of bits from bits 0 to 23 are set in the HASHED DESTINATION SAS ADDRESS field.

In the HASHED DESTINATION SAS ADDRESS field, a hashed value of a SAS address of the receiver device 40 that receives this frame is set. In the receiver device 40, the hashed value of its own SAS address is known; thus, the defined value for this receiver device 40 is set in the HASHED DESTINATION SAS ADDRESS field. Therefore, the receiver device 40 may use at least N bits in the HASHED DESTINATION SAS ADDRESS field as a defined value field. When a 23-bit LFSR 17A is used, N is equal to 23.

Figure 29:
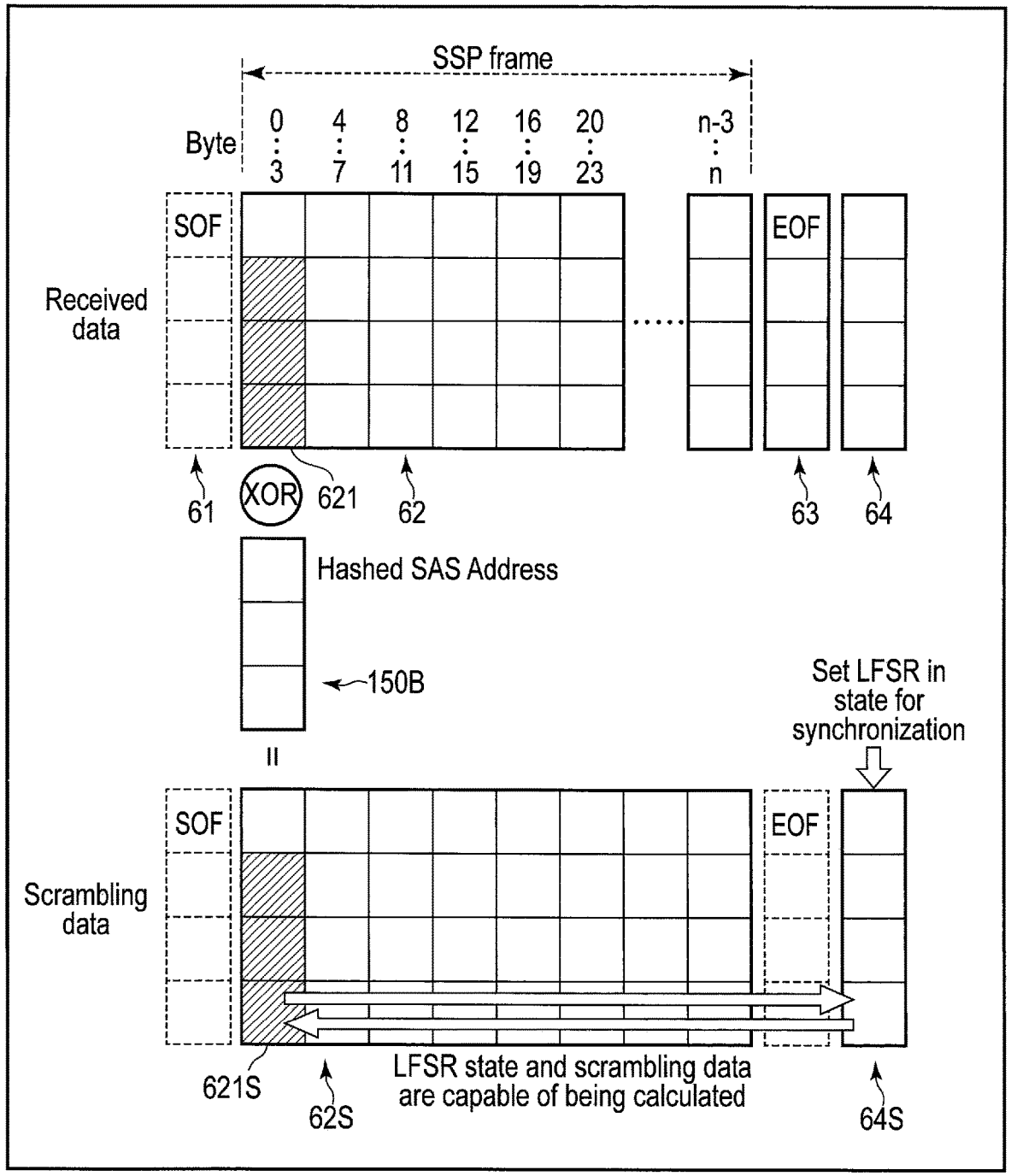
FIG. 29 illustrates an example of calculating an LFSR state and scrambling data using a defined value field in the SSP frame by the apparatus of the embodiment.

An example of calculating an LFSR state and scrambling data using a defined value field in the SSP frame will be described with reference to FIG. 29.

After receiving a primitive segment 61 that includes SOF indicating the start of a frame from the transmitter device 30, the receiver device 40 receives frame segments 62 that form the SSP frame. The frame buffer 11A stores frame data at least from the beginning of the SSP frame to the HASHED DESTINATION SAS ADDRESS field that is a defined value field, that is, frame data of bytes 0 to 3 of the SSP frame.

The receiver device 40 performs an XOR operation on a value 621 of the HASHED DESTINATION SAS address field (i.e., a value of bytes 1 to 3) of the stored SSP frame with a hashed value 150B of the SAS address as the defined expectation value 150. Accordingly, scrambling data 621S, which is used for the generation of the value 621 of the HASHED DESTINATION SAS field, is calculated. The value of the HASHED DESTINATION SAS ADDRESS field and the hashed value 150B of the SAS address each have a size of 24 bits (=3 bytes). Thus, when the LFSR 17A is composed of 23 bits, contiguous 23 bits therein may be used for the XOR operation.

On the basis of the scrambling data 621S, the receiver device 40 may calculate an LFSR state at a point in time when the scrambling data 621S is calculated. The LFSR state is represented by, for example, values of the bits that form the LFSR.

The receiver device 40 may calculate an LFSR state at any point in time using calculation to cause the calculated LFSR state to advance or calculation to cause the calculated LFSR state to retreat. For example, the receiver device 40 may calculate an LFSR state at a point in time when a frame segment of the frame segments 62 that form the SSP frame is received, an LFSR state at a point in time when a primitive segment 63, which includes B_EOFs indicating the completion of transmission of the SSP frame, is received, an LFSR state at a point in time when a segment 64 subsequent to the primitive segment 63 is received, and the like.

The receiver device 40 may further calculate the scrambling data 62S to descramble the frame segments 62 that form the SSP frame. The receiver device 40 calculates the scrambling data 62S using, for example, calculation to cause an LFSR state at a point in time when the segment 64 subsequent to the primitive segment 63 including B_EOFs is received to retreat to a state at a point in time when a segment at the beginning of the SSP frame is received. Alternatively, the receiver device 40 may calculate the scrambling data 62S using calculation to cause an LFSR state at a point in time when the scrambling data 621S used for generation of the value 621 of the HASHED DESTINATION SAS ADDRESS field is calculated to retreat to a state at a point in time when a segment at the beginning of the SSP frame is received and calculation to cause the LFSR state to advance to a state at a point in time when a segment at the end of the SSP frame is received.

The receiver device 40 performs an XOR operation on frame segments 62, which are received from the transmitter device 30 and then stored in the frame buffer 11A, with the calculated scrambling data 62S thereby descrambling the frame segments 62.

The receiver device 40 then verifies CRC of the descrambled frame segments 62. When no CRC error occurs, the receiver device 40 can use the descrambled frame segments 62 as the SSP frame that is received from the transmitter device 30 and then descrambled. In contrast, when a CRC error occurs in the frame segments descrambled by the descrambler 108, the frame segments with a CRC error may be replaced with the frame segments 62 descrambled using the scrambling data 62S.

When, furthermore, no CRC error occurs in the descrambled frame segments 62, the descrambler 108 of the receiver device 40 may be synchronized with the scrambler 104 of the transmitter device 30 by setting the LFSR 17A in the descrambler 108 in, for example, a state at a point in time when the subsequent segment 64 is received.

As is seen from the above, even though a CRC error occurs when the received SSP frame is descrambled by the descrambler 108, the frame can correctly be descrambled and the descrambler 108 of the receiver device 40 can be synchronized with the scrambler 104 of the transmitter device 30, using a value of the defined value field in the frame and a corresponding defined expectation value.

The flowchart of FIG. 30 illustrates an example of the procedure of the transmission control process for an SSP frame executed by the transmitter device 30.

First, the transmitter device 30 determines whether it needs to transmit an SSP frame to a receiver device 40 (step S701). When the transmitter device 30 need not transmit an SSP frame (NO in step S701), it returns to step S701 and determines again whether it needs to transmit an SSP frame to the receiver device 40. In this case, the transmitter device 30 may transmit, for example, a packet including an idle dword segment to the receiver device 40.

When the transmitter device 30 needs to transmit the SSP frame (YES in step S701), it generates SOF (step S702) and performs a primitive segment transmission process to transmit a packet that includes the SOF to the receiver device 40 (step S703). The primitive segment transmission process has been described above with reference to the flowchart of FIG. 23.

Then, the transmitter device 30 determines whether there is untransmitted frame data that forms a frame (step S704). When there is untransmitted frame data (YES in step S704), the transmitter device 30 determines whether there is untransmitted frame data of one or more packets (step S705). The frame data of one packet corresponds to, for example, four dwords. When there is untransmitted frame data of one or more packets (YES in step S705), the transmitter device 30 performs a frame segment transmission process to transmit a packet that includes a frame segment composed of the untransmitted frame data of one packet, to the receiver device 40 (step S706) and returns to step S704. The frame segment transmission process has been described above with reference to the flowchart of FIG. 24.

When there is no untransmitted frame data of one or more packets (NO in step S705), the transmitter device 30 calculates a CRC value of the frame data that forms the frame (step S707). The transmitter device 30 then performs a frame segment transmission process to transmit a packet that includes a frame segment composed of the untransmitted frame data and the calculated CRC value to the receiver device 40 (step S708).

When there is no untransmitted frame data (NO in step S704), for example, when all the items of frame data that form the frame have already been transmitted to the receiver device 40, the transmitter device 30 calculates a CRC value of the frame data (step S709). Then, the transmitter device 30 performs a frame segment transmission process to transmit a packet that includes a frame segment composed of the calculated CRC value and, if any, one or more pad dwords, to the receiver device 40 (step S710).

After all the items of frame data that form the frame and the CRC value are transmitted to the receiver device 40 in units of a packet (after step S708 or step S710), the transmitter device 30 generates B_EOFs indicating the completion of transmission of the frame (step S711) and performs a primitive segment transmission process to transmit a packet including the B_EOFs to the receiver device 40 (step S712). Then, the transmitter device 30 ends the process.

The flowchart of FIG. 31 illustrates an example of the procedure of the reception control process for an SSP frame executed by the receiver device 40.

First, the receiver device 40 determines whether it has received a packet from a transmitter device 30 (step S801). When the receiver device 40 has not received a packet (NO in step S801), it returns to step S801 and determines again whether it has received a packet.

When the receiver device 40 has received the packet (YES in step S801), it performs an FEC decode process on the packet (step S802). The FEC decode process includes determination as to whether an error occurs, determination of the error location, error correction, and notification of success or failure of the decoding to a state machine SP_PS in the receiver device 40. When the FEC decode process succeeds, the receiver device 40 determines whether a segment in the decoded packet is a primitive segment (step S803).

When the segment in the decoded packet is a primitive segment (YES in step S803), the receiver device 40 advances the state of the descrambler 108 to a subsequent state (step S804).

The receiver device 40 then determines whether the primitive segment includes SOF indicating the start of transmission of an SSP frame (step S805). When the primitive segment includes SOF (YES in step S805), the receiver device 40 sets a buffer flag (step S806) and returns to step S801. The buffer flag indicates whether received segments are to be stored in the frame buffer 11A. Segments other than the primitive segment received while this buffer flag is set are stored in the frame buffer 11A.

When the primitive segment does not include SOF (NO in step S805), the receiver device 40 determines whether the primitive segment includes PACKET_SYNC (step S807). When the primitive segment includes PACKET_SYNC (YES in step S807), the receiver device 40 initializes the descrambler 108 (step S808) and returns to step S801. With this initialization, the LFSR 17A in the descrambler 108 returns to its initial state.

When the primitive segment does not include PACKET_SYNC (NO in step S807), the receiver device 40 determines whether the primitive segment includes B_EOFs indicating the completion of transmission of an SSP frame (step S809). The B_EOFs is B_EOF(0), B_EOF(1), B_EOF(2), B_EOF(3), B_EOF(0)(RESERVED 1), B_EOF(1)(RESERVED 1), B_EOF(1)(RESERVED 2), B_EOF(2)(RESERVED 1), B_EOF(2)(RESERVED 2), B_EOF(3)

(RESERVED 1), or B_EOF(3)(RESERVED 2). When the primitive segment includes B_EOFs (YES in step S809), the receiver device 40 performs a verification process to verify the received frame 15 and replace, if necessary, the received frame 15 with the restored frame 157 (step S810). The receiver device 40 clears the buffer flag (step S811). Then, the receiver device 40 releases a region in the frame buffer 11A which stores the received segments (step S812), and returns to step S801. The verification process will be described later with reference to the flowchart of FIG. 32.

When the primitive segment does not include B_EOFs (NO in step S809), the receiver device 40 performs an operation for a primitive in the primitive segment (step S813) and returns to step S801.

When the segment in the packet is not a primitive segment (NO in step S803), the receiver device 40 determines whether the buffer flag is set (step S814). When the buffer flag is set (YES in step S814), the receiver device 40 stores the segment into the frame buffer 11A (step S815). The segments stored in the frame buffer 11A are segments that are received from when a packet including SOF is received until when a packet including B_EOFs is received. The segments stored in the frame buffer 11A are used in a restoration process to restore the LFSR 17A in the descrambler 108 to a state at any point in time and correctly descramble the frame received with a CRC error. The restoration process has been described above with reference to the flowchart of FIG. 26. When the receiver device 40 receives an SSP frame, it sets at least 23 bits in the HASHED DESTINATION SAS ADDRESS field of bytes 1 to 3 in the frame as a defined value field in step S51 of the restoration process illustrated in FIG. 26. When the buffer flag is cleared (NO in step S814), step S815 is skipped.

Then, the receiver device 40 descrambles the segment with the descrambler 108 (step S816). Then, the receiver device 40 advances the state of the descrambler 108 to the subsequent state (step S817), that is, increments the number of operations (the number of runs) of the descrambler 108 by one and returns to step S801.

The flowchart of FIG. 32 illustrates an example of the procedure of the SSP frame verification process executed by the receiver device 40. As described above with reference to the flowchart of FIG. 31, the verification process is performed, for example, in accordance with the reception of B_EOFs indicating the completion of transmission of an SSP frame. Assume here that the restoration process is completed prior to the start of the verification process.

First, the receiver device 40 verifies CRC of the received frame 15 that is composed of segments descrambled by the descrambler 108 (step S901) and determines whether a CRC error occurs in the received frame 15 (step S902).

When no CRC error occurs in the received frame 15 (NO in step S902), the receiver device 40 generates ACK (step S909) and performs a primitive segment transmission process to transmit a packet that includes the ACK to the transmitter device 30 (step S910). The primitive segment transmission process has been described above with reference to the flowchart of FIG. 23.

On the other hand, when the CRC error occurs in the received frame 15 (YES in step S902), the receiver device 40 verifies CRC of the restored frame 157 generated in the restoration process (step S903) and determines whether a CRC error occurs in the restored frame 157 (step S904).

When the CRC error occurs in the restored frame 157 (YES in step S904), the receiver device 40 discards the received frame 15 and the restored frame 157, and generates NAK (CRC ERROR) (step S905). The receiver device 40 performs a primitive segment transmission process to transmit a packet that includes the NAK (CRC ERROR) to the transmitter device 30 (step S906).

On the other hand, when no CRC error occurs in the restored frame 157 (NO in step S904), the receiver device 40 replaces the received frame 15 with the restored frame 157 (step S907). That is, the received frame 15 in which the CRC error occurs is discarded, and the restored frame 157 is processed as a frame received from the transmitter device 30. The receiver device 40 sets the LFSR 17A in the descrambler 108 in a state for synchronization calculated through the restoration process (step S908). The receiver device 40 then generates ACK (step S909) and performs a primitive segment transmission process to transmit a packet that includes the ACK to the transmitter device 30 (step S910).

With the foregoing process, in the receiver device 40, even though a CRC error occurs when the descrambler 108 descrambles the received SSP frame, the frame can correctly be descrambled and the descrambler 108 of the receiver device 40 can be synchronized with the scrambler 104 of the transmitter device 30, by using a value of a defined value field in the frame and a corresponding defined expectation value.

As described above, according to the present embodiment, a frame can be received correctly. The descrambler 108 of the receiver device 40 descrambles frame data that is scrambled by the scrambler 104 of the transmitter device 30 (i.e., external device). When frame data 151 corresponding to the defined value field in the received frame 15 is received from the transmitter device 30, the restoration module 11 synchronizes the descrambler 108 of the receiver device 40 with the scrambler 104 of the transmitter device 30 using the frame data 151 and the defined expectation value 150 that is a value to be scrambled by the scrambler 104 to obtain the frame data 151.

The frame from the transmitter device 30 can thus be received correctly by the receiver device 40.

The restoration module 11 also calculates a third state of the descrambler 108 (specifically, LFSR 17A) after the completion of reception of the received frame 15 and calculates the scrambling data 156 to descramble items of frame data that form the received frame 15 using calculation to retreat the descrambler 108 from the third state.

The descrambler 108 descrambles the items of frame data that form the received frame 15. When a reception error occurs in the items of descrambled frame data, the restoration module 11 generates the descrambled frame 157 by descrambling the items of frame data to form the received frame 15 using the calculated scrambling data 156.

Therefore, even though a loss of synchronization occurs between the descrambler 108 of the receiver device 40 and the scrambler 104 of the transmitter device 30 and a reception error occurs in the received frame 15 descrambled by the descrambler 108, the frame 157 correctly descrambled using the calculated scrambling data 156 is generated. The frame can thus be received correctly.

Each of various functions described in some embodiments of the present invention may be realized by a circuit (e.g., processing circuit). An exemplary processing circuit may be a programmed processor such as central processing unit (CPU). The processor executes computer programs (instructions) stored in a memory thereby performs the described functions. The processor may be a microprocessor including an electric circuit. An exemplary processing circuit may be a digital signal processor (DSP), an application specific integrated circuit (ASIC), a microcontroller, a controller, or other electric circuit components. The components other than the CPU described according to the embodiments may be realized in a processing circuit.

Since each process in the present embodiment may be implemented by computer programs, advantages similar to those of the present embodiment can easily be produced simply by installing and executing the computer programs on a computer through a computer readable storage medium that stores the computer programs.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An apparatus capable of exchanging a frame with an external apparatus in a packet mode of a serial attached small computer system interface (SAS), the external apparatus including a scrambler, the apparatus comprising:
a descrambler configured to descramble frame data scrambled by the scrambler; and
a controller configured to,
in a case where first frame data is received from the external apparatus,
synchronize the descrambler with the scrambler using the first frame data and a first value that is to be scrambled by the scrambler to obtain the first frame data.

2. The apparatus of claim 1, wherein
the controller is further configured to calculate a second state of the descrambler using the first frame data and the first value, the second state corresponding to either a primitive received after the first frame data or second frame data received after the first frame data.

3. The apparatus of claim 2, wherein
the controller is further configured to set the descrambler in the second state.

4. The apparatus of claim 2, wherein
each of the scrambler and the descrambler includes a linear feedback shift register, and
the controller is further configured to:
calculate first scrambling data used for generation of the first frame data by performing an exclusive logical OR (XOR) operation on the first frame data with the first value;
calculate a first state of the linear feedback shift register at a point in time when the first scrambling data is generated, on the basis of the first scrambling data; and
calculate the second state using calculation to advance the linear feedback shift register from the first state.

5. The apparatus of claim 4, wherein
the controller is further configured to set a second value to the linear feedback shift register in the descrambler, the second value corresponding to the second state of the descrambler.

6. The apparatus of claim 2, wherein
the first frame data is included in a first frame, and
the second frame data is received immediately after all items of frame data that form the first frame are received.

7. The apparatus of claim 1, wherein
the first frame data is included in a first frame, and
the controller is further configured to:
calculate a third state of the descrambler, the third state corresponding to a state of the descramble after completion of reception of the first frame; and
calculate second scrambling data to descramble items of frame data to form the first frame, using calculation to retreat the descrambler from the third state.

8. The apparatus of claim 7, wherein
the descrambler is configured to descramble the items of frame data, and
the controller is configured to generate, in a case where a reception error occurs in the items of frame data descrambled by the descrambler, the first frame by descrambling the items of frame data using the second scrambling data.

9. The apparatus of claim 1, wherein
the first frame data is included in a first field of a first frame,
the first frame is an IDENTIFY address frame,
the first field is a field having a size of at least N contiguous bits in a Reserved field of the IDENTIFY address frame, and
the first value is zero.

10. The apparatus of claim 9, wherein
each of the scrambler and the descrambler includes a linear feedback shift register of N bits.

11. The apparatus of claim 1, wherein
the first frame data is included in a first field of a first frame,
the first frame is an OPEN address frame,
the first field is a field having a size of at least N contiguous bits in a DESTINATION SAS ADDRESS FIELD of the OPEN address frame, and
the first value is a SAS address of the apparatus.

12. The apparatus of claim 11, wherein
each of the scrambler and the descrambler includes a linear feedback shift register of N bits.

13. The apparatus of claim 1, wherein
the first frame data is included in a first field of a first frame,
the first frame is an OPEN address frame,
the first field is a field having a size of at least N contiguous bits in a MORE COMPATIBLE FEATURES field of the OPEN address frame, and
the first value is zero.

14. The apparatus of claim 13, wherein
each of the scrambler and the descrambler includes a linear feedback shift register of N bits.

15. The apparatus of claim 1, wherein
the first frame data is included in a first field of a first frame,
the first frame is a serial small computer system interface protocol (SSP) frame,
the first field is a field having a size of at least N contiguous bits in a HASHED DESTINATION SAS ADDRESS FIELD of the SSP frame, and
the first value is a hashed value of a SAS address of the apparatus.

16. The apparatus of claim 15, wherein
each of the scrambler and the descrambler includes a linear feedback shift register of N bits.

17. A method of controlling an apparatus, the apparatus being capable of exchanging a frame with an external apparatus in a packet mode of a serial attached small computer system interface (SAS), the external apparatus including a scrambler, the method comprising:
　descrambling frame data scrambled by the scrambler; and
　in a case where first frame data is received from the external apparatus, synchronizing the descrambler with the scrambler using the first frame data and a first value that is to be scrambled by the scrambler to obtain the first frame data.

18. The method of claim 17, further comprising
　calculating a second state of the descrambler using the first frame data and the first value, the second state corresponding to either a primitive received after the first frame data or second frame data received after the first frame data.

19. The method of claim 17, wherein
　the first frame data is included in a first frame, and
　the method further comprising:
　calculating a third state of the descrambler, the third state corresponding to a state of the descramble after completion of reception of the first frame; and
　calculating second scrambling data to descramble items of frame data to form the first frame, using calculation to retreat the descrambler from the third state.

20. The method of claim 19, further comprising:
　descrambling the items of frame data; and
　generating, in a case where a reception error occurs in the items of frame data descrambled by the descrambler, the first frame by descrambling the items of frame data using the second scrambling data.

\* \* \* \* \*